United States Patent
Everhart et al.

(10) Patent No.: US 9,938,014 B2
(45) Date of Patent: Apr. 10, 2018

(54) VIDEO DISPLAY UNIT CASSETTE ASSEMBLIES FOR AIRCRAFT SEATS AND ENHANCED IN FLIGHT ENTERTAINMENT USER EXPERIENCE

(71) Applicant: Thales Avionics, Inc., Irvine, CA (US)

(72) Inventors: Jeffrey S. Everhart, Winston-Salem, NC (US); Lori Elizabeth Salazar, Mission Viejo, CA (US); John Howard Darvell, Claremont, CA (US)

(73) Assignee: THALES AVIONICS, INC., Irvine, CA (US)

( * ) Notice: Subject to any disclaimer, the term of this patent is extended or adjusted under 35 U.S.C. 154(b) by 25 days.

(21) Appl. No.: 15/091,272

(22) Filed: Apr. 5, 2016

(65) Prior Publication Data
US 2016/0297526 A1 Oct. 13, 2016

Related U.S. Application Data

(60) Provisional application No. 62/145,988, filed on Apr. 10, 2015, provisional application No. 62/233,761, filed on Sep. 28, 2015, provisional application No. 62/146,014, filed on Apr. 10, 2015.

(51) Int. Cl.
*B64D 11/00* (2006.01)
*H05K 5/02* (2006.01)
*H05K 5/00* (2006.01)

(52) U.S. Cl.
CPC ..... *B64D 11/00151* (2014.12); *H05K 5/0017* (2013.01); *H05K 5/0204* (2013.01)

(58) Field of Classification Search
CPC .......... B64D 11/0015; B64D 11/00153; B64D 11/06; B64D 11/0627; B64D 11/00151; B64D 11/00152; G06F 1/1616; G06F 1/1639; G06F 1/1643; G06F 1/1684; G06F 3/0488; G06F 1/1624; G06F 1/1601; G06F 1/1637; G06F 1/16; H05K 5/0017; H05K 5/0204; F16M 11/10; G02F 1/133308
USPC ............ 361/679.31, 679.02, 679.21, 679.26, 361/679.27, 679.09, 679.55
See application file for complete search history.

(56) References Cited

U.S. PATENT DOCUMENTS

| | | | |
|---|---|---|---|
| 2004/0077308 A1* | 4/2004 | Sanford ................. | B64D 11/06 455/3.06 |
| 2015/0202999 A1* | 7/2015 | Jafri ..................... | B60R 11/0235 297/216.12 |
| 2015/0261363 A1* | 9/2015 | Shah ................. | B32B 17/10009 345/173 |

* cited by examiner

*Primary Examiner* — Jinhee Lee
*Assistant Examiner* — Ingrid Wright
(74) *Attorney, Agent, or Firm* — Sage Patent Group

(57) ABSTRACT

A video display unit cassette assembly includes a cassette frame, a display coupled to the cassette frame, one or more electronic components between the cassette frame and the display, and a delethalization cover coupled to the display. The one or more electronic components receive data content from a network and generate video signals provided to the display. The cassette assembly is sized and configured to be releasably mounted in an installed position in a mounting structure defined in a seatback of a vehicle seat.

14 Claims, 84 Drawing Sheets

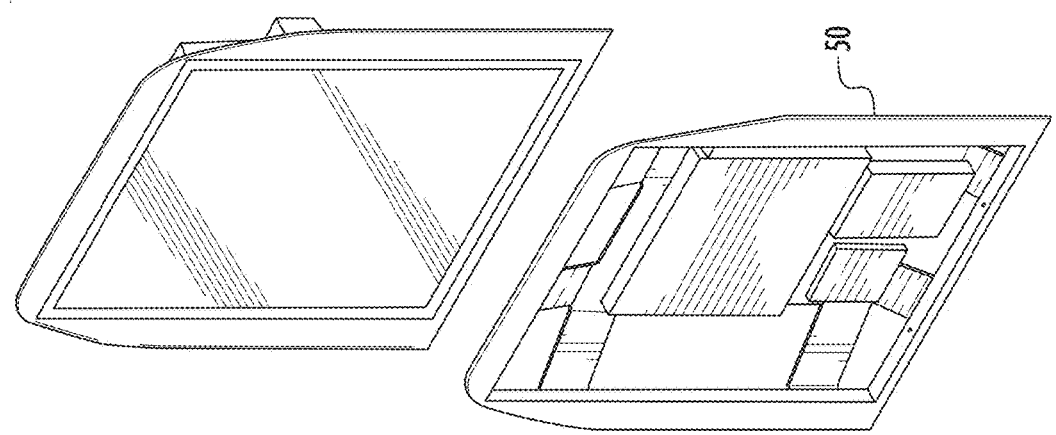
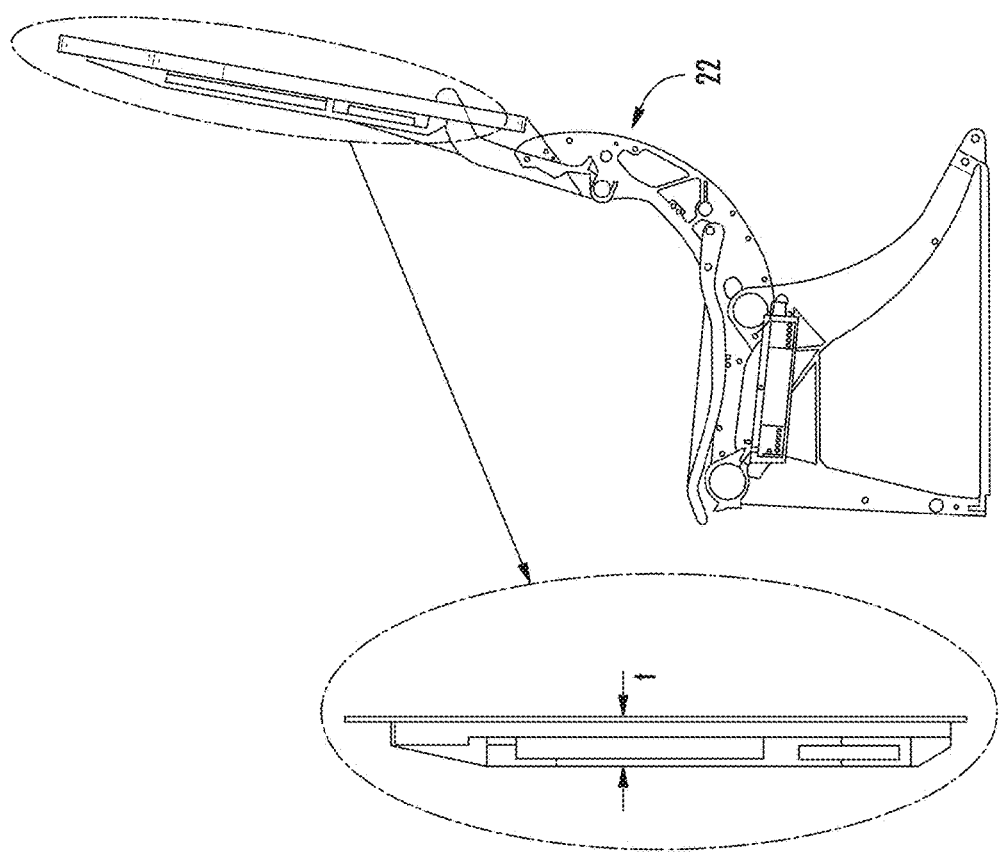

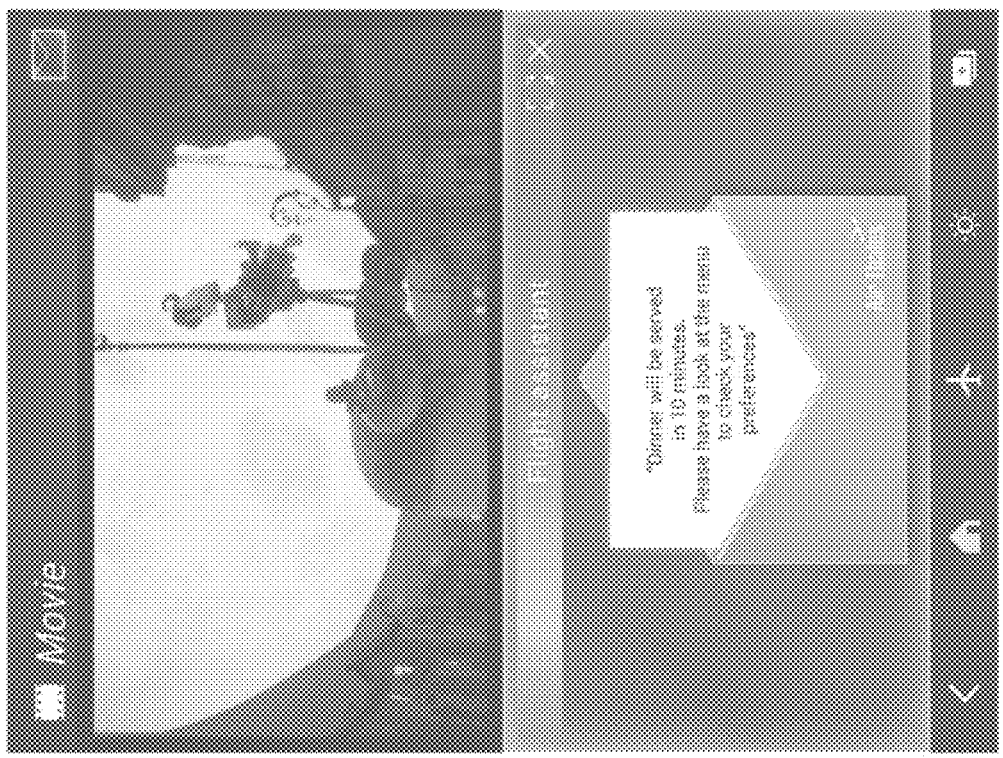

VIDEO DISPLAY UNIT CASSETTE ASSEMBLIES FOR AIRCRAFT SEATS AND ENHANCED IN FLIGHT ENTERTAINMENT USER EXPERIENCE

RELATED APPLICATIONS

This application claims priority to U.S. Provisional Application No. 62/145,988, filed Apr. 10, 2015, U.S. Provisional Application No. 62/146,014, filed Apr. 10, 2015, and U.S. Provisional Application No. 62/233,761, filed Sep. 28, 2015, the disclosure of each of which is incorporated by reference in its entirety.

BACKGROUND

It may be desirable to provide a modular video display unit cassette assembly that can be easily installed in and removed from a mounting structure that is formed in, for example, a seatback of an aircraft seat. It may be further desirable for the cassette assembly to include a large format video display that can provide enhanced user experience.

SUMMARY

Some embodiments of the invention are directed to a video display unit cassette assembly including a cassette frame, a display coupled to the cassette frame, one or more electronic components between the cassette frame and the display, and a delethalization cover coupled to the display. The one or more electronic components receive data content from a network and generate video signals provided to the display. The cassette assembly is sized and configured to be releasably mounted in an installed position in a mounting structure defined in a seatback of a vehicle seat.

Some other embodiments of the invention are directed to a system including a mounting structure in the seatback of an aircraft seat, with the mounting structure including a seat frame member and a cassette bezel coupled to the seat frame member. The system includes a cassette assembly including a cassette frame, a display coupled to the cassette frame, one or more electronic components between the cassette frame and the display, and a delethalization cover coupled to the display. The cassette assembly is sized and configured to be releasably mounted in an installed position in the mounting structure.

Some other embodiments of the invention are directed to a method. The method includes providing a cassette assembly including a cassette frame, a display coupled to the cassette frame, one or more electronic components between the cassette frame and the display, and a delethalization cover coupled to the display. The display has a diagonal length of at least 22 inches. The method includes mounting the cassette assembly in an installed position in a mounting structure defined in a seatback of an aircraft seat, and securing the cassette assembly in the installed position by tightening fasteners received in the cassette frame during the mounting step from a front of the aircraft seat.

BRIEF DESCRIPTION OF THE DRAWINGS

The accompanying drawings, which are included to provide a further understanding of the disclosure and are incorporated in and constitute a part of this application, illustrate certain non-limiting embodiments of the invention. In the drawings:

FIG. 3A is a side view of the cassette assembly mounted in the seatback of the aircraft seat of FIG. 2;

FIG. 3B is a perspective view of a carrier for electronic components according to some embodiments;

DETAILED DESCRIPTION

The following detailed description discloses various non-limiting example embodiments of the invention. The invention can be embodied in many different forms and is not to be construed as limited to the embodiments set forth herein.

Although various embodiments of the present invention are explained herein in the context an in-flight entertainment (IFE) environment, other embodiments of entertainment systems and related controllers are not limited thereto and may be used in other environments, including other vehicles such as ships, submarines, buses, trains, commercial/military transport aircraft, and automobiles, as well as buildings such as conference centers, sports arenas, hotels, homes, etc. Accordingly, in some embodiments users are referred to, in a non-limiting way, as passengers.

Figure 1:
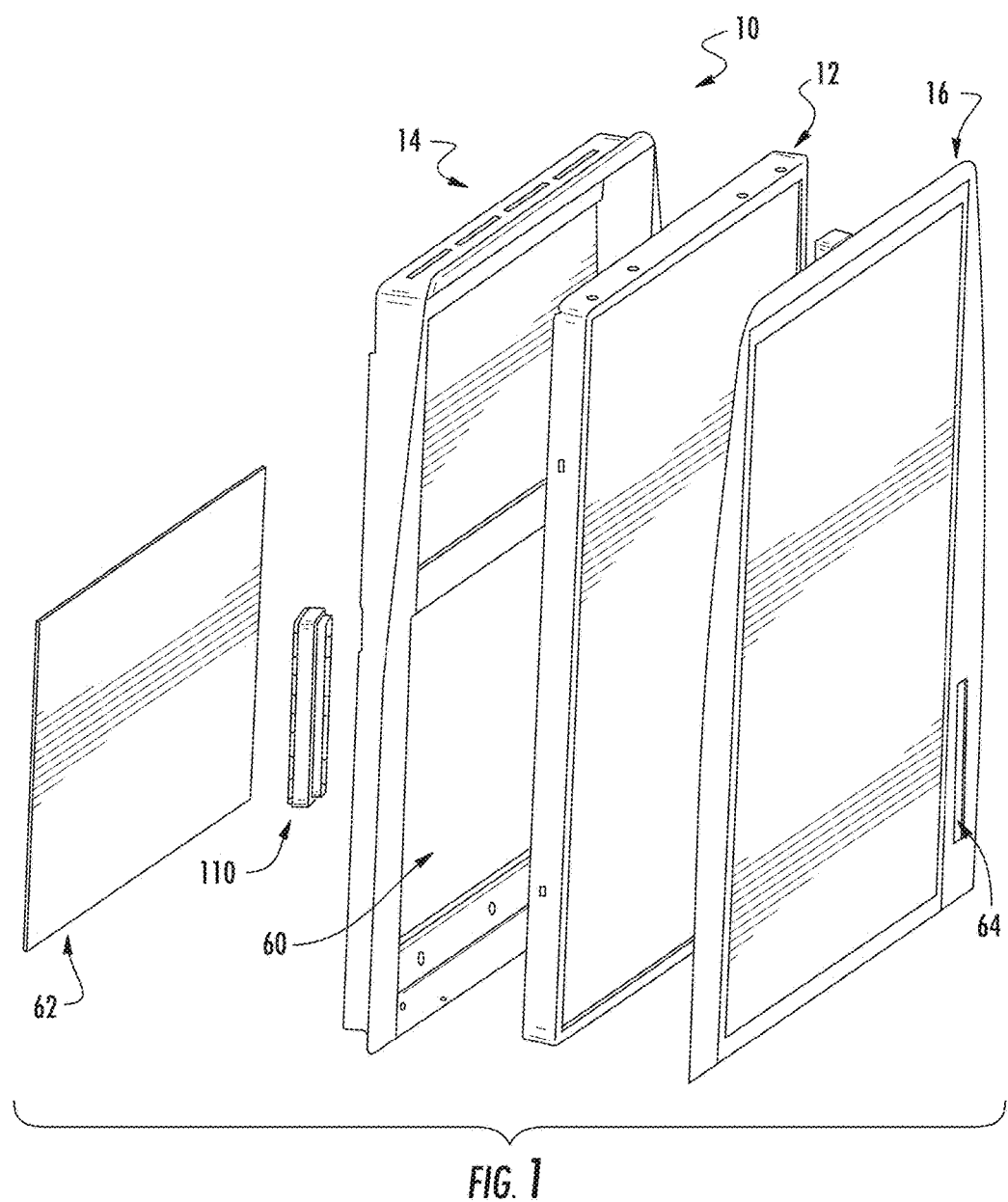
FIG. 1 is an exploded perspective view of a video display unit cassette assembly in accordance with some embodiments.

A video display unit cassette assembly 10 according to some embodiments is illustrated in FIG. 1. The assembly 10 includes a video display 12, a bracket or frame 14 and a delethalization cover 16. The video display 12 may connect to and/or fit within the bracket 14. The delethalization cover 16 covers the video display 12 and may connect to the video display 12 and/or the bracket 14.

Figure 2:
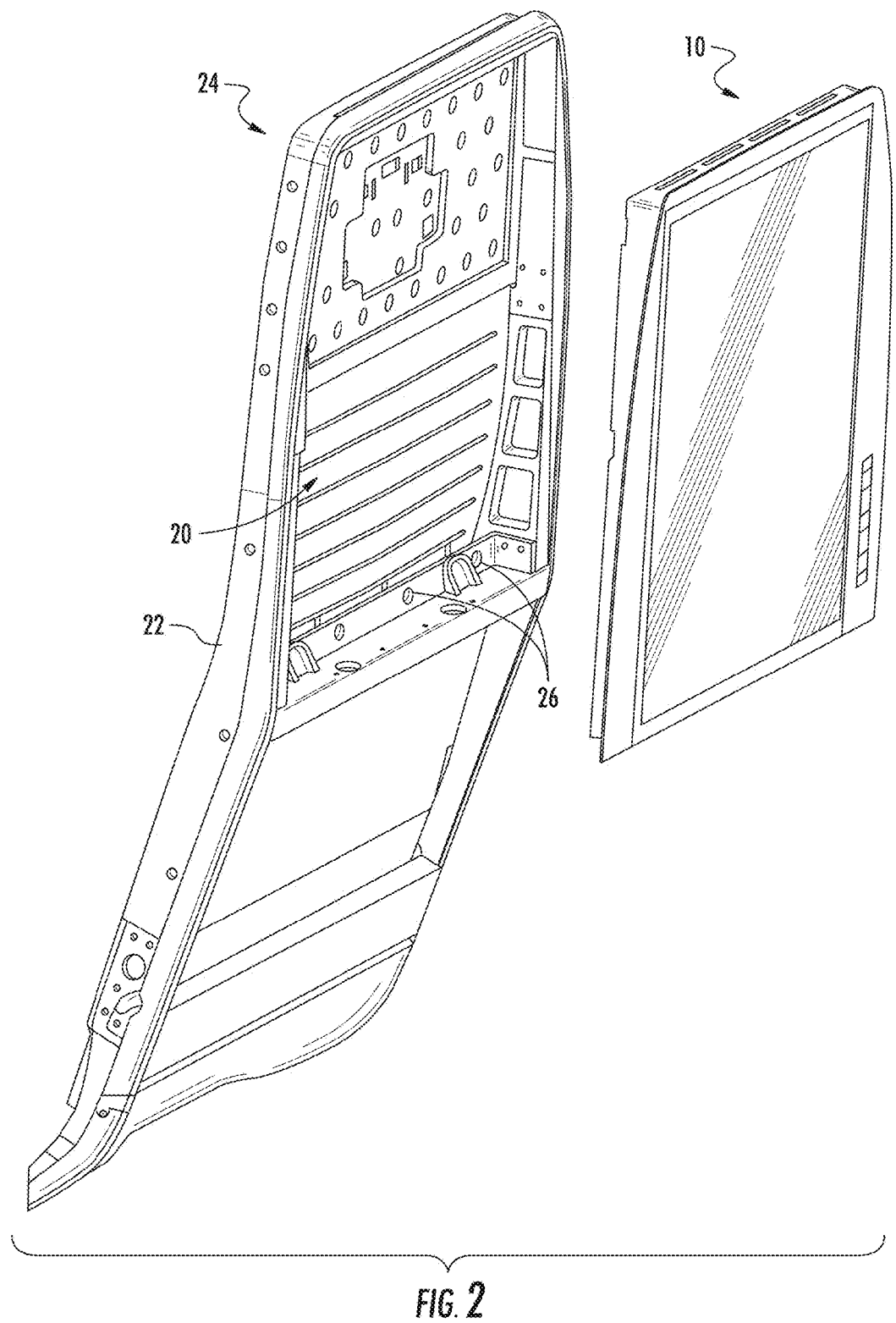
FIG. 2 is a perspective view illustrating the cassette assembly of FIG. 1 as assembled and an aircraft seat including a mounting structure according to some embodiments.

The cassette assembly 10 as assembled is illustrated in FIG. 2. The cassette assembly 10 is sized and configured to be received in and mounted to a mounting structure 20 in the seatback of an aircraft seat 24. As illustrated, the mounting structure 20 is a recessed region defined in the rear of a frame 22 of the seat 24. The cassette assembly 10 and/or the mounting structure 20 may include one or more mounting features to hold the cassette assembly in the mounting structure. For example, a plurality of apertures 26 may be defined in the seat frame 22 and fasteners may be received from the front of the frame 22 through the apertures 26. The fasteners may be received in corresponding aligned apertures defined in the cassette assembly 10 to hold the cassette assembly 10 in the mounting structure 20.

The video display 12 may be any suitable flat panel display such as an LCD, LED or OLED display. The video display 12 may be mounted in portrait orientation relative to a viewer seated behind the seatback in which the cassette assembly 10 is mounted. Alternatively, the video display 12 may be mounted in landscape orientation or at an angle between portrait and landscape depending on the shape and size of the video display 12 and/or the mounting structure 20. In various embodiments, the video display 12 may have a diagonal length of at least 27 inches, at least 32 inches, and at least 40 inches. The video display 12 may also be curved or geometrically profiled to meet customer aesthetic requirements.

The delethalization cover 16 may be formed of tempered glass such as multi-touch tempered glass. The backside and/or edge portions of the delethalization cover 16 may be darkened or tinted to frame the video display 12. The delethalization cover 16 may be or include a clear and/or a transparent and/or a translucent layer. The cassette assembly 10 and/or the delethalization cover 16 may be configured to be compliant with the Head Injury Criteria (HIC) as set forth by the Federal Aviation Administration (FAA). The delethalization cover 16 may be configured to retain the cassette assembly 10 in place during a dynamic event. The delethalization cover 16 can inhibit glass from the display 12 from reaching a passenger in the event of the passenger's head impacting the delethalization cover 16. The delethalization cover 16 may be configured to help prevent the formation of sharp edges during a dynamic event.

Figure 6:
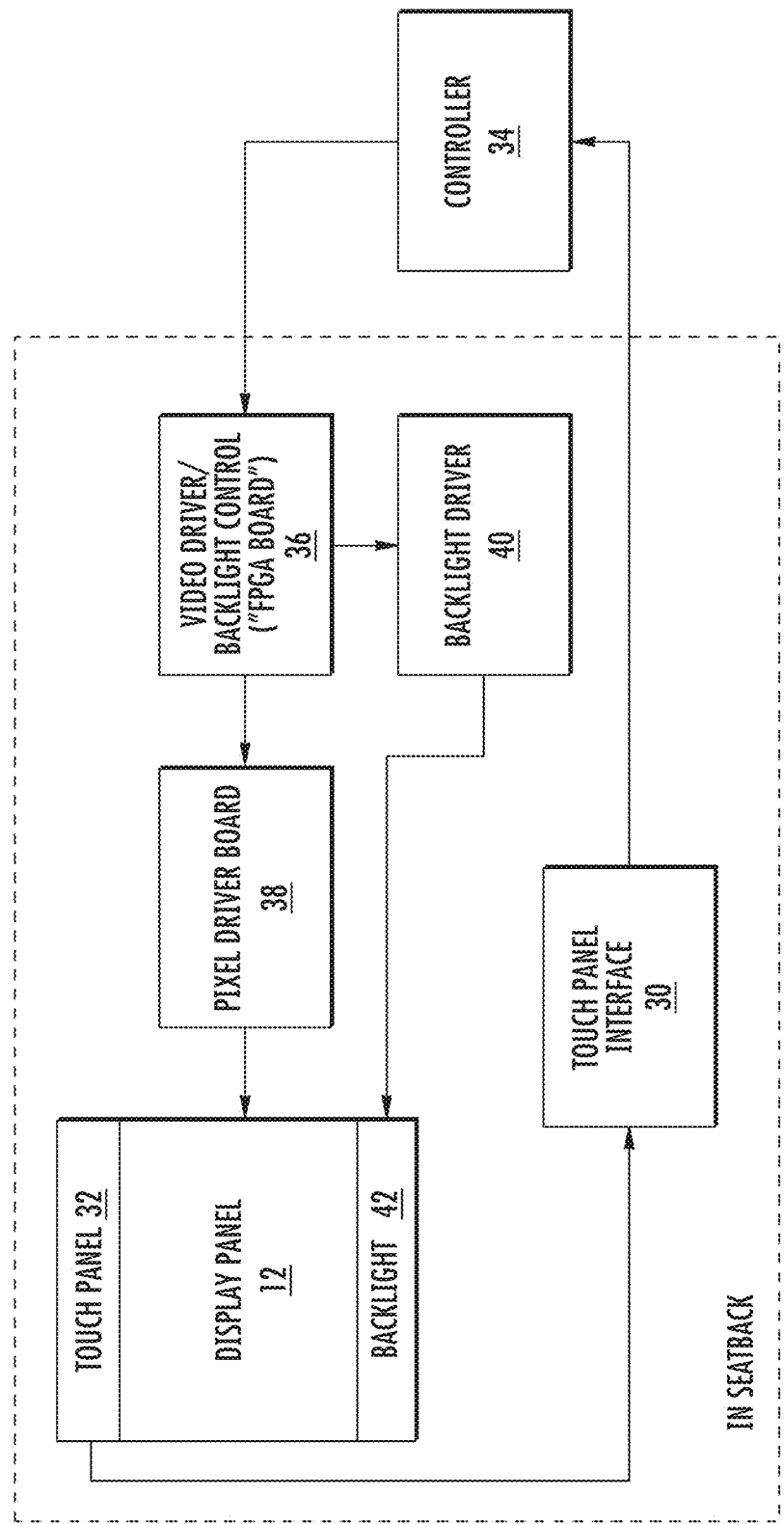
FIG. 6 is a block diagram of electronic components that may be included in the cassette assembly of FIG. 1 according to some embodiments.

Various electronic components may be in the seatback. Referring to FIG. 6, these components may include a touch panel interface device 30 that receives signals from a touch panel 32 on the video display 12 and sends signals to a controller or processor 34. A video driver and backlight control device (or "video processor device") 36 may receive signals from the controller 34 and send signals to a pixel driver device 38 and a backlight driver device 40. The video processor device 36 may be or include a field-programmable gate array (FPGA) integrated circuit. The video display 32 may receive signals from the pixel driver device 38. A backlight 42 on the video display 12 may receive signals from the backlight driver device 40.

In some embodiments, the controller 34 is in the seatback. In some other embodiments, the controller 34 is away from or spaced apart from the seatback.

One or more of the electronic components described above may be included as part of the cassette assembly 10. In some embodiments, the electronic components are between the display 12 and the bracket 14 (FIG. 1). The electronic components may be connected or mounted to the display 12 and/or the bracket 14.

Figure 4:
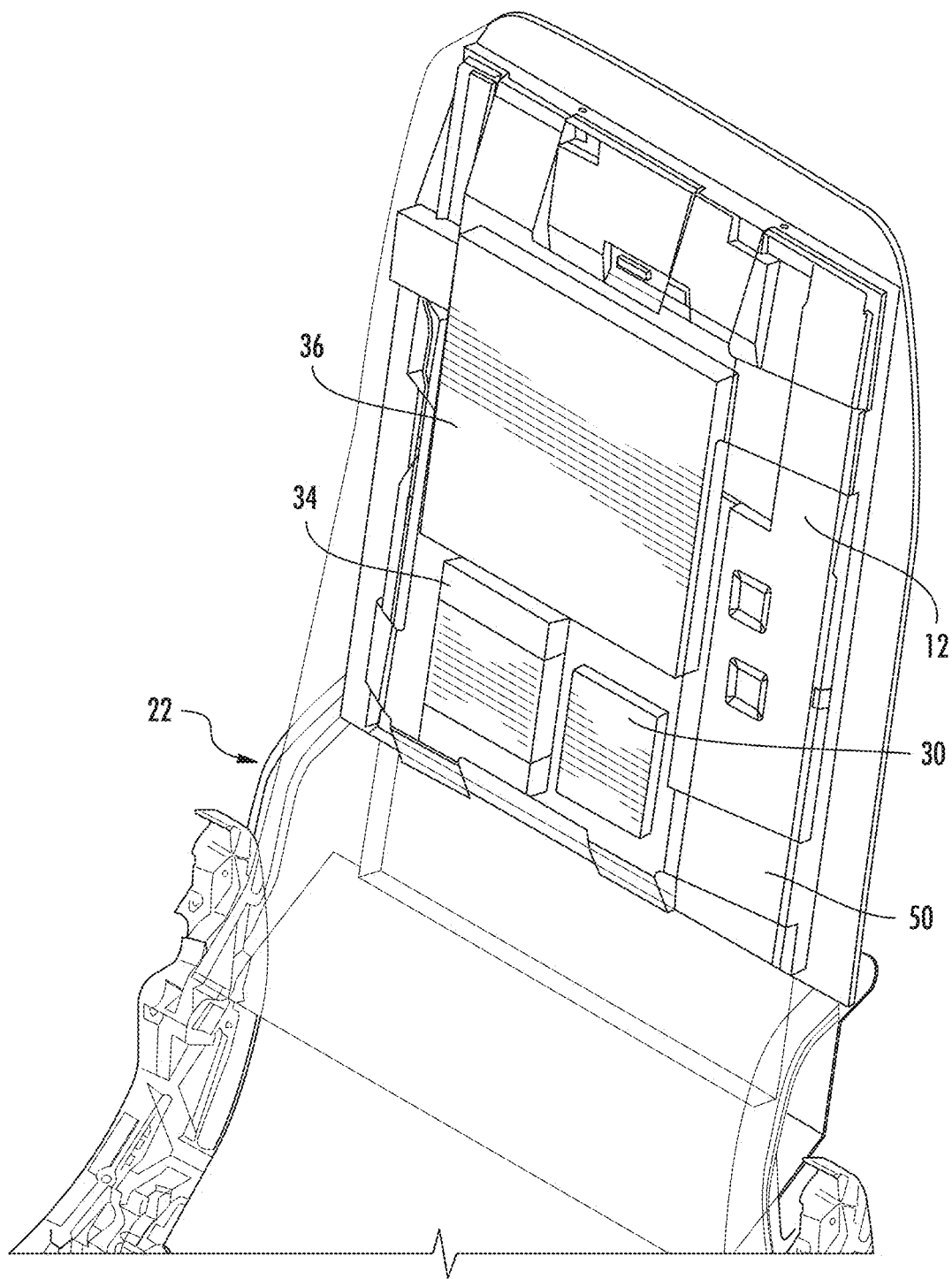
FIG. 4 is a perspective view of the carrier of FIG. 3 held in an aircraft seat according to some embodiments.

Referring to FIG. 4, at least some of the electronic components may be connected or mounted to a "spider" carrier 50. FIG. 4 illustrates the front of the seat frame 22 with the seat cushion removed. As illustrated, the touch panel interface device 30, the controller 34 and the video processor device 36 are connected or mounted to the carrier 50. The carrier 50 may be connected or mounted to the video display 12. As shown in FIG. 3, the carrier 50 may be used in place of the bracket 14 (FIG. 1). Alternatively, the carrier 50 may be used in combination with the bracket 14 (e.g., the carrier 50 may be between the video display 12 and the bracket 14).

Still referring to FIG. 3, in some embodiments, the cassette assembly 10 has a thickness t of about 2 inches or less. In some other embodiments, the cassette assembly 10 has a thickness t of about 1.7 inches or less. In still other embodiments, the cassette assembly 10 has a thickness t of about 1 inch or less. The thin design facilitates the integration of the cassette assembly 10 into the seat frame 22. These dimensions may be for an economy class seat and may vary depending on the dimensions of the mounting structure.

Figure 5:
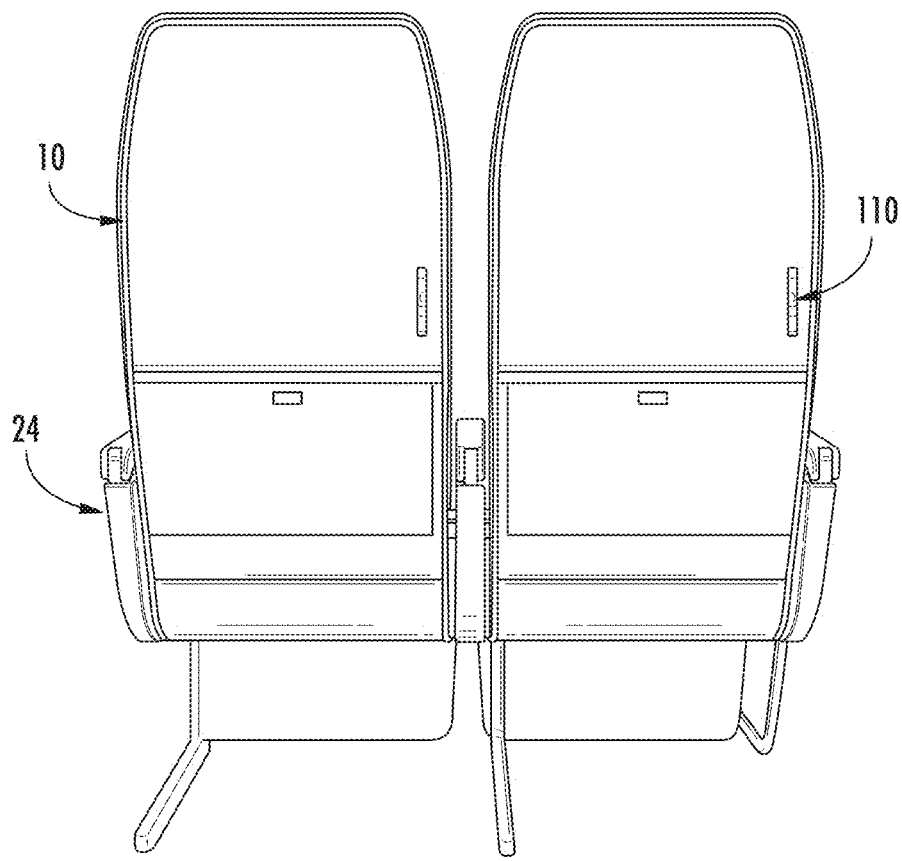
FIG. 5 is a rear view of an aircraft seat with the cassette assembly of FIG. 1 installed therein according to some embodiments.

Referring to FIG. 5, the cassette assembly 10 is configured to be installed in the aircraft seat 24 such that the cassette assembly 10 and the seat 24 have an integrated and seamless appearance. The video display spans a substantial portion of the seatback and provides a considerably larger viewing area than with typical seatback video display units used for IFE. As will be described below, the large viewing area and/or the portrait orientation of the video display can provide several advantages including the ability to view and interact with multiple windows (e.g., in a split screen configuration).

Referring again to FIG. 2, there may be a plurality of the apertures 26 in a bottom portion of the cavity or mounting structure 20 and a plurality of the apertures 26 in a top portion of the cavity or mounting structure 20 (although only the apertures 26 in the bottom portion of the mounting structure 20 are visible in FIG. 2). As described above, the cassette assembly 10 may have corresponding apertures that align with the apertures 26 and fasteners may be received through the aligned apertures (e.g., from a front of the seat) to hold the cassette assembly 10 in the mounting structure 20.

In some embodiments, the video display 12 has a diagonal length of at least 20 inches. In some embodiments, the video display 12 has a diagonal length of about 22 inches.

Referring to FIG. 1, the cassette frame 14 may have an access opening or window 60 defined therein. An access panel 62 may be configured to releasably couple to the cassette frame 14 to selectively cover the access opening 60. For example, with the cassette assembly 10 in the installed position in the mounting structure 20, the access panel 62 may be removed to provide access to the electronic components of the cassette assembly 10 described above, to provide access to the display 12 and/or to provide access to a connectivity port assembly 110 that is described in more detail below. In this regard, various components of the cassette assembly 10 may be accessed for adjustment and/or replacement without removing the entire cassette assembly 10 from the mounting structure 20.

Figure 7:
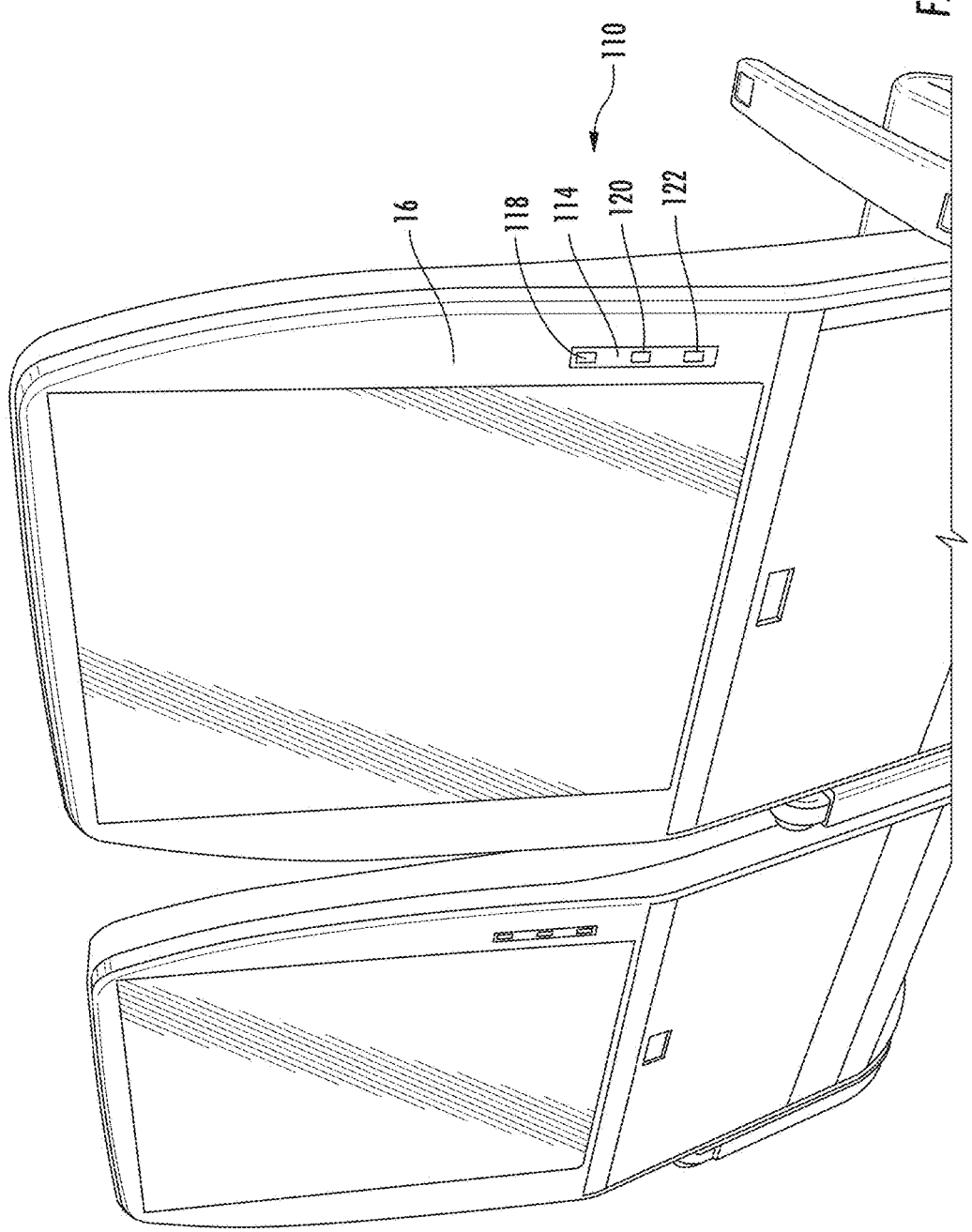
FIG. 7 is a perspective view of an aircraft seat with the cassette assembly of FIG. 1 and a connectivity port installed therein according to some embodiments.

Referring to FIGS. 1, 5 and 7, the connectivity port assembly 110 may be included as part of the cassette assembly 10. The connectivity port assembly 110 includes an outer face, plate or surface 114 with one or more connectivity ports 118, 120, 122 defined therein.

The connectivity ports 118, 120, 122 may include any combination of USB ports, mini USB ports, HDMI ports, DIN audio jacks, headphone jacks, RCA audio jacks, RCA video jacks, or other ports or jacks for receiving connectors that carry audio and/or video signals. It is contemplated that the connectivity port assembly 110 may include buttons or other controls to, for example, call the flight attendant, adjust the lighting or control features of the IFE system. Such controls may be on the outer surface 114 of the connectivity port 110. It is also contemplated that the connectivity port assembly 110 may include an NFC device. This may allow the passenger to use his or her portable electronic device (e.g., smart phone or tablet) to make contactless payment for items such as beverages, food, consumer products or transportation tickets (e.g., that may be advertised or displayed on the IFE video display unit). The passenger may also use the NFC connection to bootstrap other wireless connections (e.g., Bluetooth, Wi-Fi, Wi-Fi Direct, etc.).

The connectivity port assembly 110 may be coupled to the cassette frame 14 and aligned with an opening 64 defined in the delethalization cover 16 (FIG. 1). In this position, the outer surface 114 of the connectivity port assembly 110 may be flush or substantially flush with the delethalization cover or impact panel 16 (FIG. 7). As described above, the delethalization cover 16 may be configured such that the seatback 10 is compliant with HIC requirements set forth by the Federal Aviation Administration. That is, the delethalization cover 16 may be configured such that the seatback 10 has a higher probability of passing a HIC system test. The certification of an aircraft interior requires that a head strike to various cabin furnishings comply with the Head Impact Criteria. This compliance poses a significant problem for many segments of the aerospace industry due to the costs and time required during the development and certification process of airline seats.

Typically changes to IFE systems are classified as major (class 1) changes which require HIC recertification. Embodiments of the present invention allow for the connectivity port assembly 110 to be removed and/or replaced to facilitate maintenance and/or upgrading while being classified as a minor (class 2) change that does not require HIC recertification.

More specifically, and referring to FIG. 7, the connectivity port assembly 110 in including the outer surface 114 may form an exposed surface along with the delethalization cover 16. The exposed surface may be configured such that the seatback can be certified under HIC standards. The connectivity port assembly 110 may have properties that facilitate HIC certification. For example, the material and/or thickness of the outer surface or plate 114 may be selected accordingly. Therefore, managing the configuration of the exposed surface may eliminate the need for recertification if a change was made to the connectivity port assembly 110.

The majority of the connectivity port assembly 110, including the connectivity ports and any associated electrical and mechanical components, is positioned behind the exposed surface. Therefore, these components may not affect the HIC certification value and changes to the connectivity port assembly 110 may be classified as minor (class 2) changes. In this regard, the connectivity port assembly 110 may be removed and replaced without requiring costly and time consuming recertification.

Put another way, the delethalization cover 16 and/or exposed surface may manage the dynamic event such that components behind the delethalization cover 16 have little to no effect on the dynamic event (e.g., during HIC testing). This may allow for a change to the components behind the delethalization cover 16 to be classified as a class 2 change thereby facilitating upgrades with little to no impact on recertification.

This is useful because it may be desirable to remove the connectivity port assembly 110 for various reasons. For example, the connectivity port assembly 110 may need repair or the connectivity port assembly 110 may need to be replaced to provide different types of connectivity ports or to upgrade the connectivity ports.

Furthermore, class 1 changes require approval from all seat suppliers. This would limit the connectivity port assembly supplier's ability to sell the assemblies or perform future upgrades for its customers (e.g., airlines). It may be advantageous for changes to the connectivity port assembly 110 to be classified as class 2 changes for this additional reason.

A cassette assembly 210 according to some other embodiments is illustrated in FIGS. 8-13. The cassette assembly 210 is similar to the cassette assembly 10 described above; additional or different features will be described below.

The cassette assembly 210 includes includes a video display 212, a bracket or frame assembly 214 and a delethalization cover 216. The video display 212 may connect to and/or fit within the bracket assembly 214. The delethalization cover 216 covers the video display 212 and may connect to the video display 212 and/or the bracket assembly 214. The delethalization cover 216 may also be referred to herein as the capacitive touch glass panel 216.

The cassette assembly 210 further includes one or more electronic components. The electronic components may include a capacitive touch driver 230, a controller 234 and/or a video driver 236. The electronic components may be mounted to a rear wall 322 of the cassette frame 214. For example, there may be a plurality of mounting features 324 (e.g., fasteners, straps and the like) on the rear wall 322 for mounting the electronic components. The electronic components 230, 234 and/or 236 may be electrically connected to one another. A cable or harness opening 325 may be provided in the cassette frame rear wall 322. A cable or harness may be received therethrough to, for example, provide power to the controller 234 and/or to connect the controller 234 to head end equipment.

Figure 9:
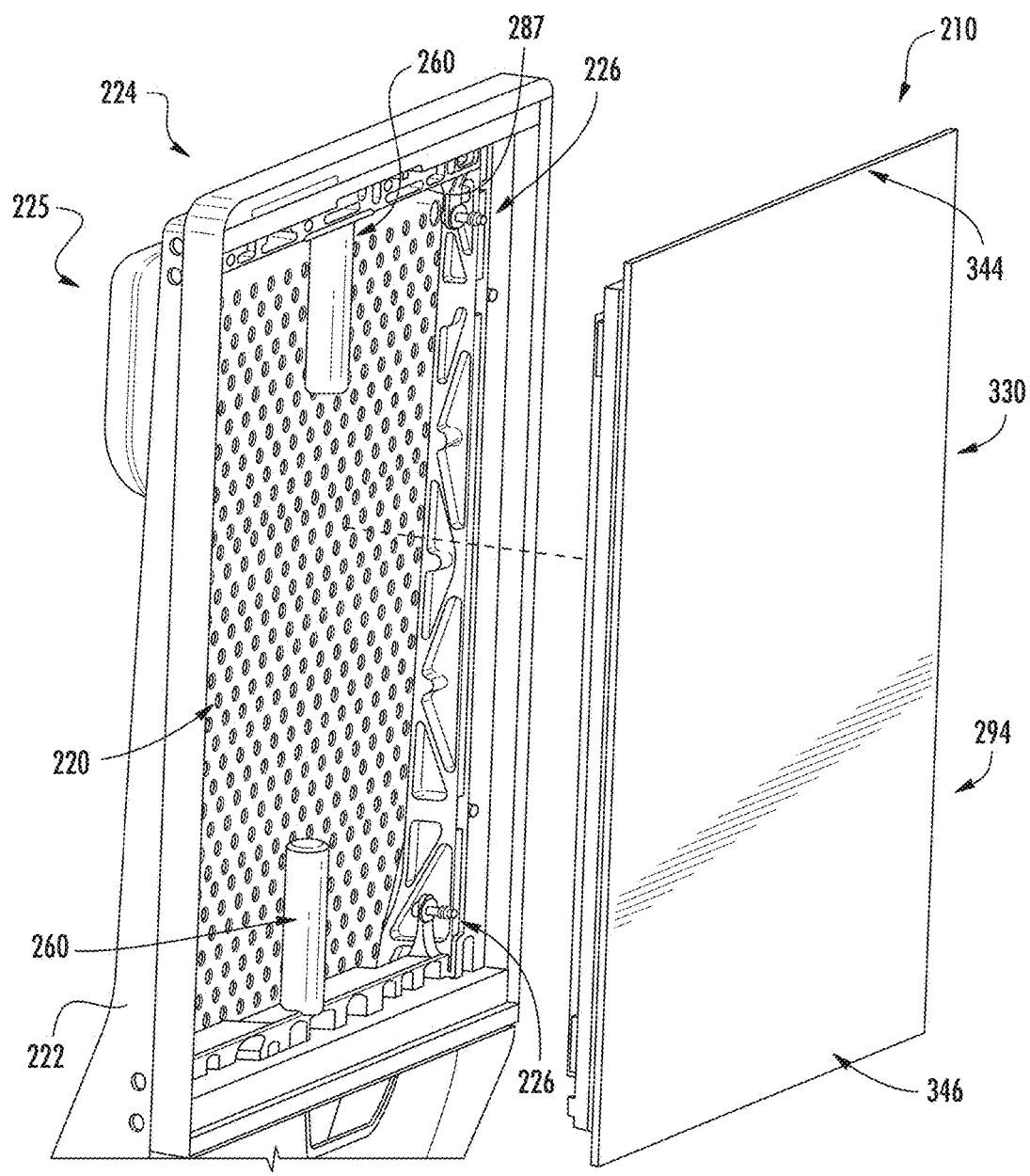
FIG. 9 is a perspective view illustrating the cassette assembly of FIG. 8 as assembled and an aircraft seat including a mounting structure according to some embodiments.

The cassette assembly 210 as assembled is illustrated in FIG. 9. The cassette assembly 210 is sized and configured to be received in and mounted to a mounting structure 220 in the seatback assembly 225 of an aircraft seat 224. As illustrated, the mounting structure 220 may be a recessed region defined in the rear of a frame 222 of the seat 224. The cassette assembly 210 and/or the mounting structure 220 may include one or more mounting features to hold the cassette assembly in the mounting structure.

Figure 10:
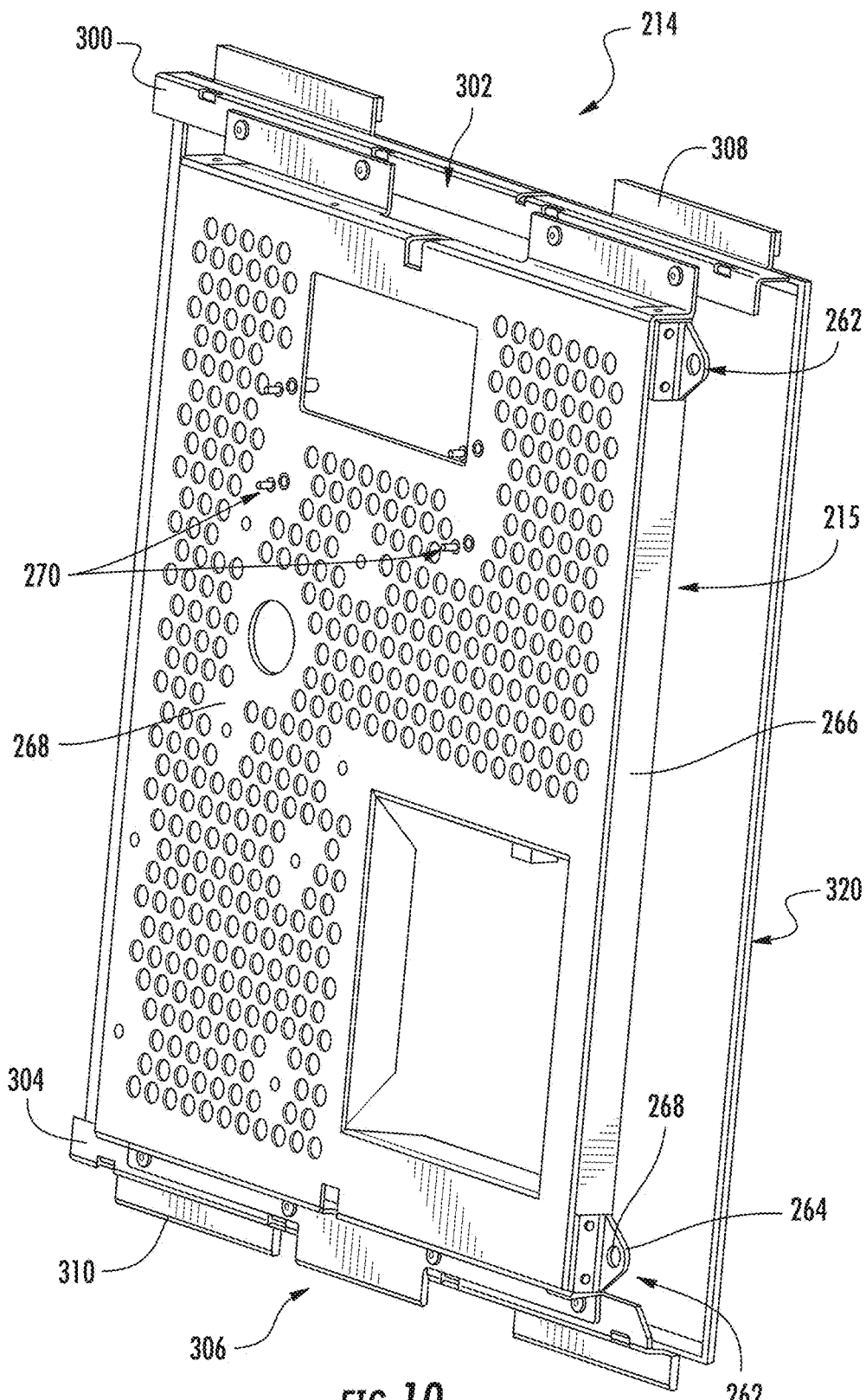
FIG. 10 is a rear perspective view of a frame assembly of the cassette assembly of FIG. 8.

For example, a plurality of fasteners 226 may be provided at or in the mounting structure 220. Referring to FIGS. 9 and 10, the bracket frame assembly 214 includes a primary frame or housing 215. At least two receptacles or receptacle members 262 are at each opposite sidewall 266 of the frame 215. The receptacle 262 includes a ledge 264 that extends outwardly from the sidewall 266 and an aperture 268 defined in the ledge 264. The aperture 268 is sized and configured to receive and hold one of the fasteners 226. The ledge 264 may be a bracket coupled to the frame sidewall 266 or may be integrally formed with the frame 215.

The fasteners 226 and/or the receptacles 262 are configured such that their engagement holds the cassette assembly 210 securely in the mounting structure 220. The cassette assembly 210 may be inserted into the mounting structure 220 with the fasteners 226 received in the receptacle apertures 268. The fasteners 226 may then be tightened from a front of the seat 224. In some embodiments, the fasteners 226 are "quick secure" and/or "quick release" fasteners such that the cassette assembly 210 may secured to the mounting structure 220 and/or released from the mounting structure 220 with only a handful of turns of the fasteners 226.

In addition to the fasteners 226 and the receptacles 262, the cassette frame 215 and/or the seat mounting structure 220 may include additional alignment and/or guidance features to help align and/or guide the cassette assembly 210 into the mounting structure 220 in the proper orientation.

For example, there may be a guide post 260 at a bottom portion and/or at a top portion of the mounting structure 220 (FIG. 9). There may be an alignment or guidance feature on a rear surface 268 of the cassette frame 215 (FIG. 10). For example, there may be a plurality of pins or posts 270 that are arranged in a shape to receive the guide post(s) 260. Alternatively, the alignment or guidance feature may include one or more shells or walls extending outwardly from the rear wall 268 and configured to conform to the guide posts 260 as the cassette assembly 210 is inserted into the mounting structure 220.

It will be appreciated that the guide posts 260 and the corresponding alignment or guidance features on the cassette frame rear surface 268 help to ensure that the cassette assembly is installed in the correct horizontal orientation. In some embodiments, the upper guide post 260 is sized differently than the lower guide post 260. The upper alignment or guidance feature on the cassette frame 215 (e.g., parallel columns of the pins or posts 270) may be sized or spaced apart to receive the upper guide post 260 and a lower alignment or guidance feature on the cassette frame 215 (e.g., parallel columns of the pins or posts 270) may be sized or spaced apart differently to receive the lower guide post 260. In this regard, the guide posts 260 and the corresponding alignment or guidance features on the cassette frame rear surface 268 help to ensure that the cassette assembly is installed in the correct vertical orientation.

Figure 11:
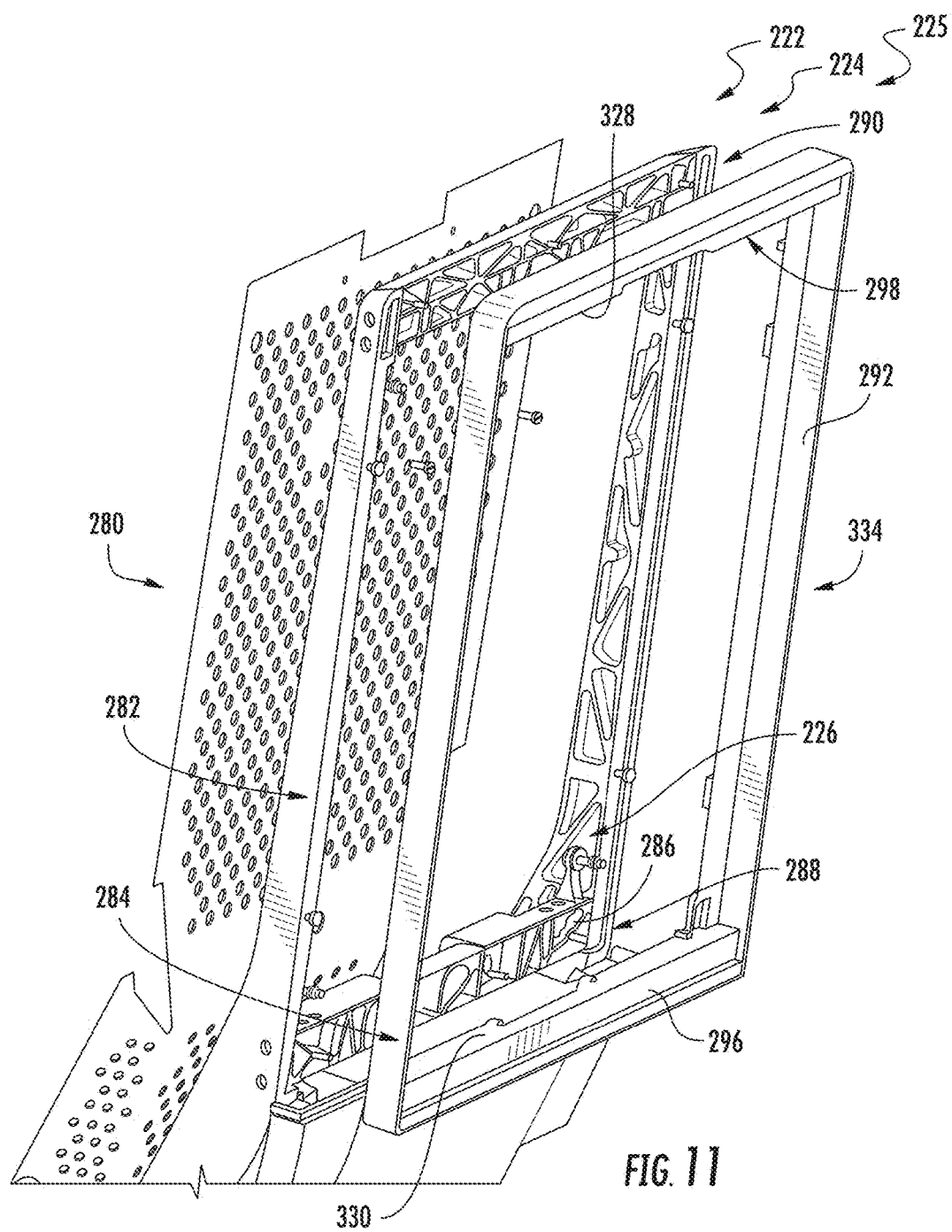
FIG. 11 is an exploded perspective view of components of a seatback assembly including components that define the mounting structure of FIG. 9 according to some embodiments.

The seatback assembly 225 according to some embodiments is illustrated in greater detail in FIG. 11. The seatback assembly 225 may include a front cushion shroud 280, a central frame 282 and a cassette bezel 284.

The front cushion shroud 280 is configured to hold one or more seat cushions. The seat cushion shroud 280 is configured to be releasably coupled to the central frame 282. The seat cushion shroud 280 may be decoupled from the central frame 282 during installation and removal of the cassette assembly 210. For example, the seat cushion shroud 280 may be removed from the central frame 282 to provide access to the fasteners 226 (e.g., to tighten or loosen the fasteners during installation or removal of the cassette assembly 210).

The fasteners 226 may be on cross members 286 that are integrated with or coupled to the central frame 282. There may be a lower cross member 286 extending across a lower portion 288 of the central frame 282 and an upper cross member 287 extending across an upper portion 290 of the central frame 282.

As illustrated in FIG. 9, the guide posts 260 may be on and/or extend from the cross members 286, 287.

The cassette bezel 284 is configured to couple with the central frame 282. In some embodiments, the cassette bezel 284 is configured to receive the cassette assembly 210 with the cassette assembly 210 held therein in the installed position. In some embodiments, the cassette bezel 284 defines at least a portion of the mounting structure 220 (FIG. 9). In some embodiments, the central frame and the cassette bezel 284 defines the mounting structure 220.

The cassette bezel 284 includes opposed inner side surfaces 292. The cassette bezel 284 also includes lower and upper recessed surfaces 296, 298. As will be described in more detail below, these surfaces are configured to be adjacent and/or abut portions of the cassette assembly 210 that is in the installed position.

Referring to FIG. 10, an upper display bracket 300 is coupled to a top portion 302 of the cassette frame 215 and a lower display bracket 304 is coupled to a bottom portion 306 of the cassette frame 215. One or more upper cassette frame ledge members 308 extend upwardly from the upper display bracket 300 and one or more lower cassette frame ledge members 310 extend downwardly from the lower display bracket 304.

Figure 12:
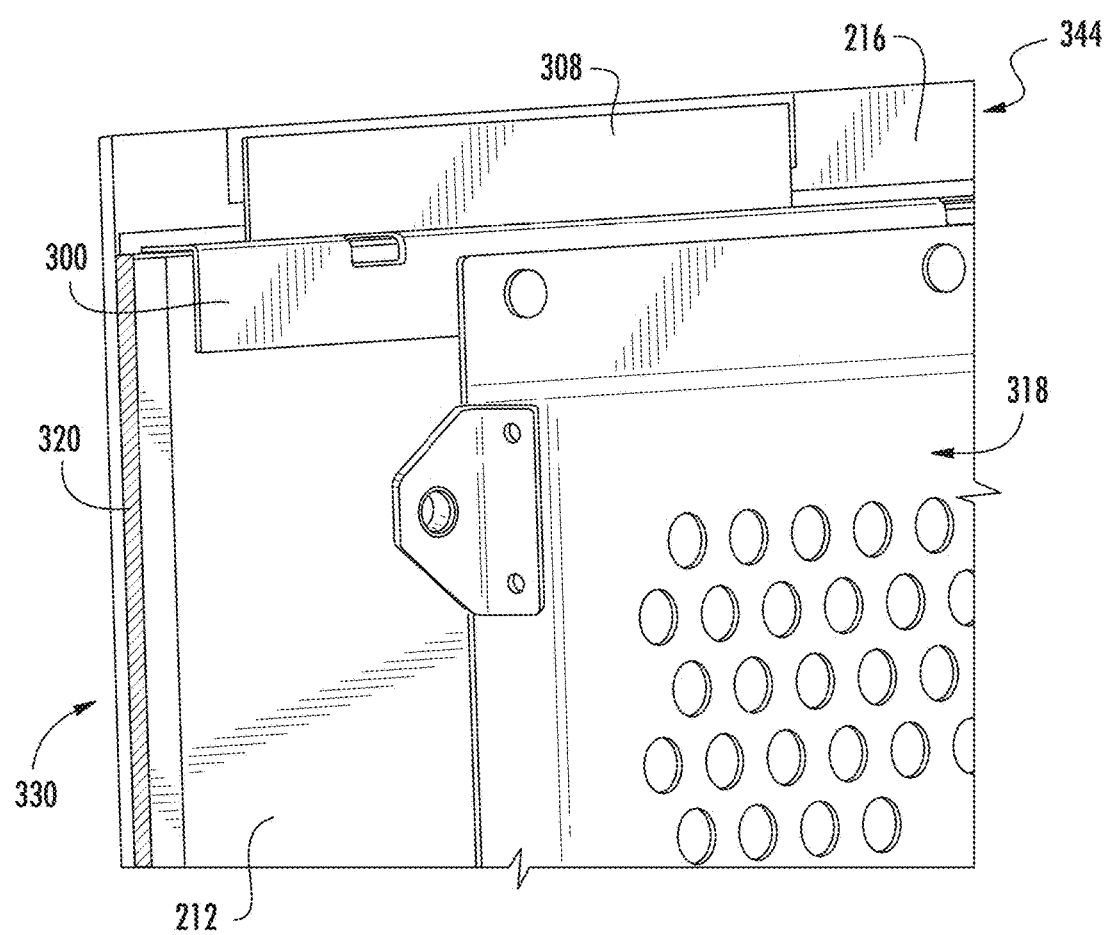
FIG. 12 is a fragmentary perspective view of the cassette assembly of FIG. 8 as assembled.

A gasket member 320 extends from the upper and lower display brackets 300, 304 and/or from the upper and lower cassette frame ledges 308, 310. As illustrated in FIG. 12, the gasket member 320 is configured to hold the delethalization cover 216 adjacent and/or against the display 212. According to some embodiments, the gasket member 320 is configured to adhere the delethalization cover 216 to the display 212. The gasket member 320 may extend around the entire outer periphery of the display 212.

The cassette assembly 210 as assembled is further illustrated in FIG. 12. An upper portion of the display 212 is held between the upper display bracket 300 and the delethalization cover 216. An upper portion 344 of the delethalization cover 216 extends above the top of the display 212 and the upper cassette frame ledge member 308 is adjacent and/or abuts the delethalization cover upper portion 344. There may be a layer of protective material (e.g., foam, rubber or the like) between the upper cassette frame ledge member 308 and the delethalization cover upper portion 344.

Figure 8:
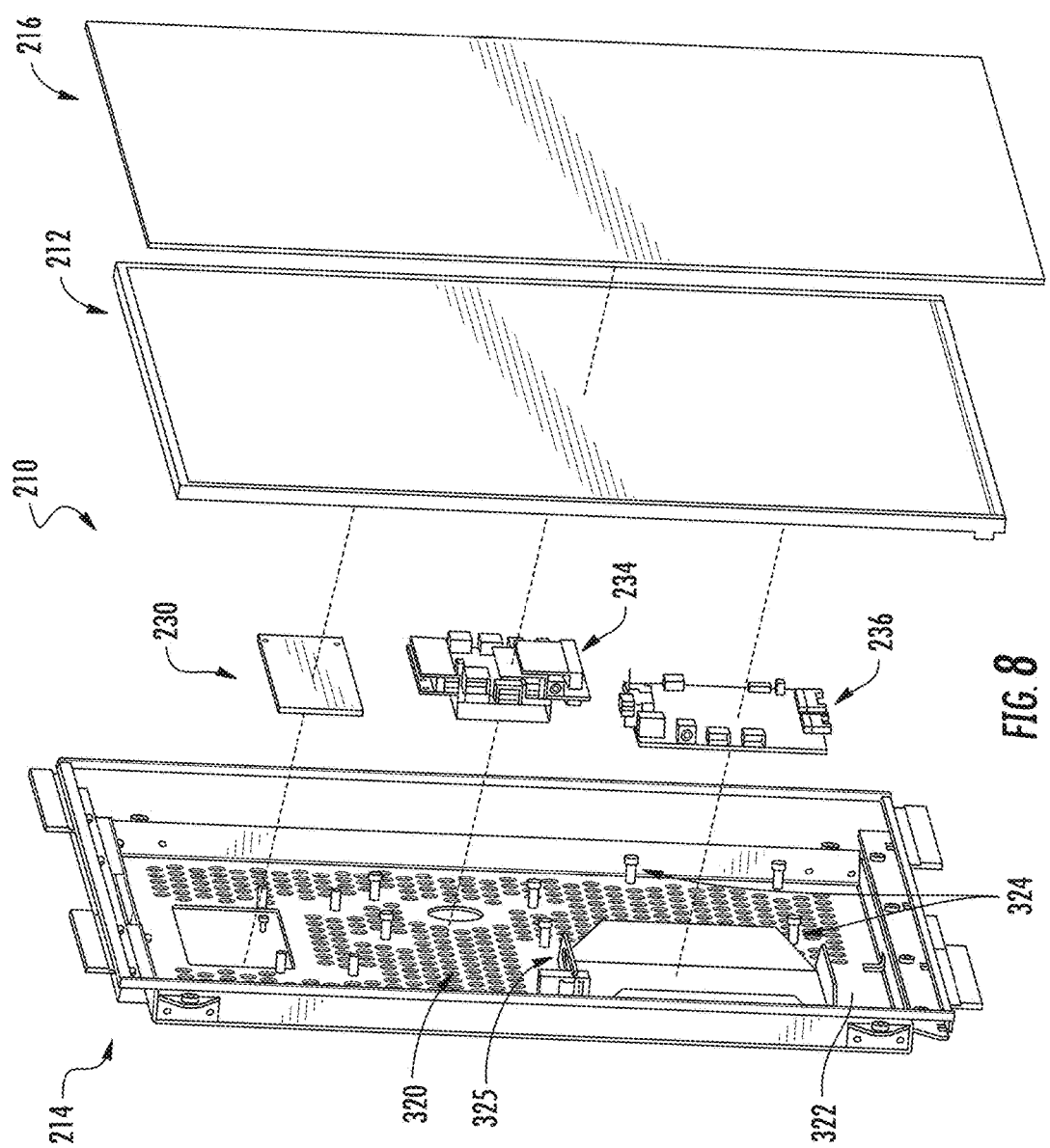
FIG. 8 is an exploded perspective view of a video display unit cassette assembly in accordance with some other embodiments.

Similarly, with reference to FIGS. 8-10, a lower portion of the display 212 is held between the lower display bracket 304 and the delethalization cover 216. A lower portion 346 of the delethalization cover 216 extends below the bottom of the display 212 and the lower cassette frame member 310 is adjacent and/or abuts the delethalization cover lower portion 346. There may be a layer of protective material (e.g., foam, rubber or the like) between the lower cassette frame ledge member 310 and the delethalization cover lower portion 346.

Referring to FIGS. 9 and 12, the assembled cassette assembly 210 includes opposite side portions 330. The side portions 330 may be defined by the side of the delethalization cover 216 and/or the side of the display 212.

Referring to FIGS. 9, 11 and 12, the cassette assembly 210 is installed in the cassette bezel 284 with the cassette side portions 330 adjacent and/or abutting the inner side surfaces 292 of the cassette bezel 284. The delethalization cover lower portion 346 and/or the lower cassette frame ledge members 310 are adjacent and/or abutting the lower recessed surface 296 of the cassette bezel 284. The delethalization cover upper portion 344 and/or the upper cassette frame ledge members 308 are adjacent and/or abutting the upper recessed surface 298 of the cassette bezel 284.

An inner upper surface 328 extends inwardly (and orthogonally) from the upper recessed surface 298 of the cassette bezel 284 and an inner lower surface 330 extends inwardly (and orthogonally) from the lower recessed surface 296 of the cassette bezel. This provides a stepped arrangement that corresponds to the stepped arrangement of the top of the display 212 and the delethalization cover upper portion 344 and the stepped arrangement of the bottom of the display 212 and the delethalization cover lower portion 346.

The top of the display 212 and/or the upper display bracket 300 are adjacent and/or abut the inner upper surface 328 with the cassette assembly 210 in the installed position. Also, the bottom of the display 212 and/or the lower display bracket 304 are adjacent and/or abut the inner lower surface 330 with the cassette assembly 210 in the installed position. The inner side surfaces 292, the inner upper surface 328 and the inner lower surface 330 of the cassette bezel define an opening, and the outer sides of the display 212 may be held in the opening with the cassette assembly 210 in the installed position.

Figure 13:
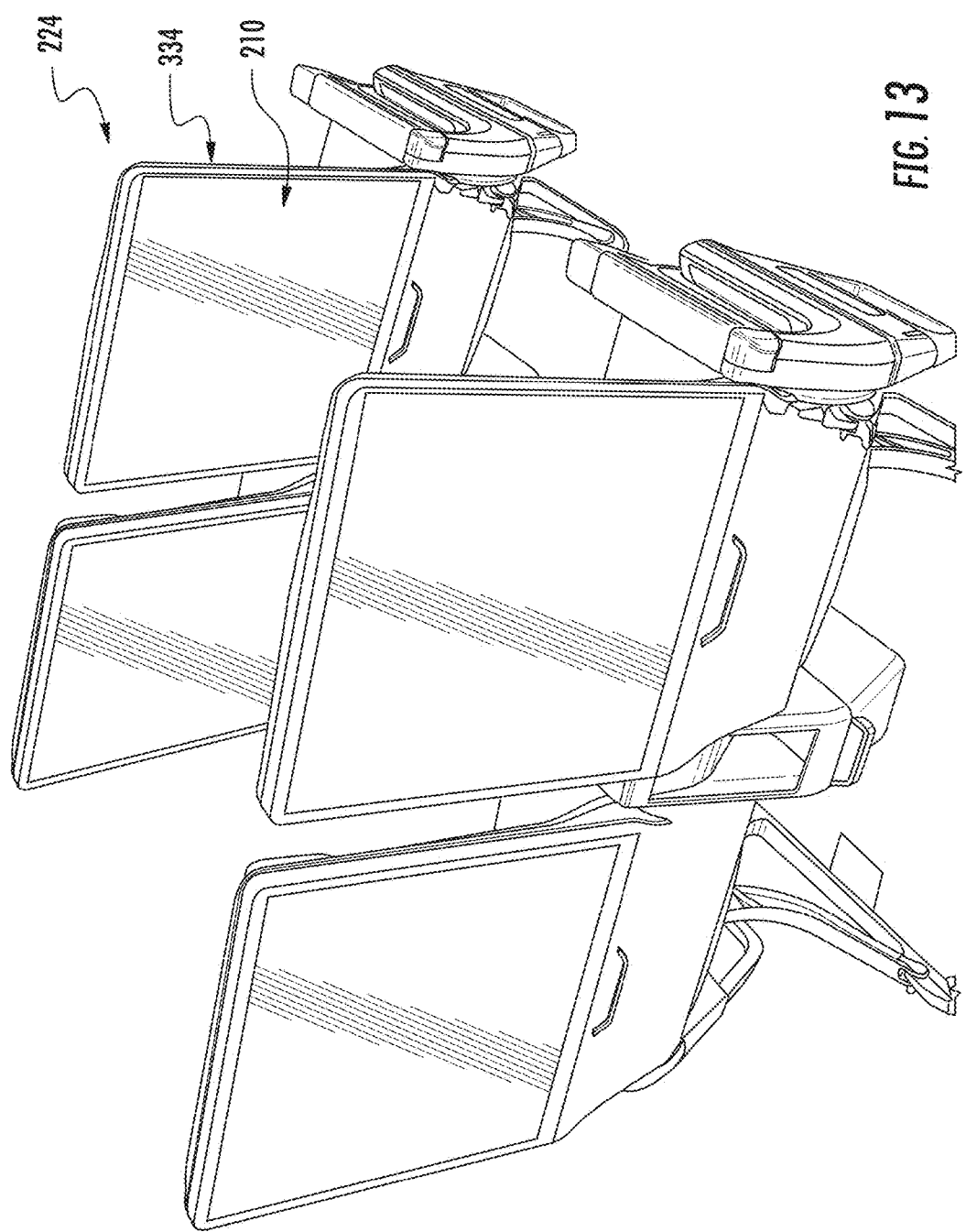
FIG. 13 is a rear perspective view of aircraft seats with each having the cassette assembly of FIG. 8 installed therein according to some embodiments.
Figure 14:
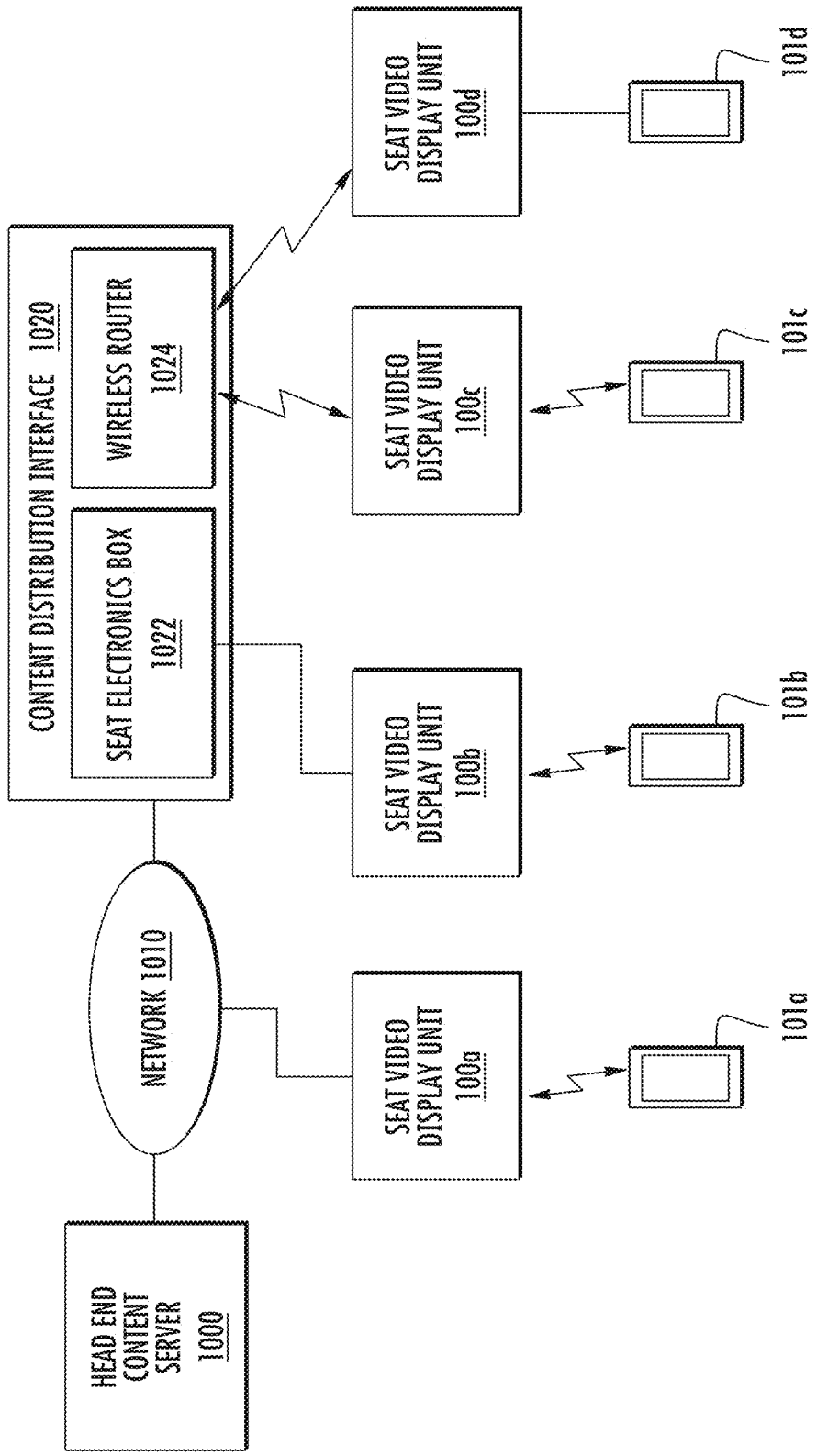
FIG. 14 is a block diagram of an entertainment system that includes video display units and that is configured according to some embodiments.
Figure 15:
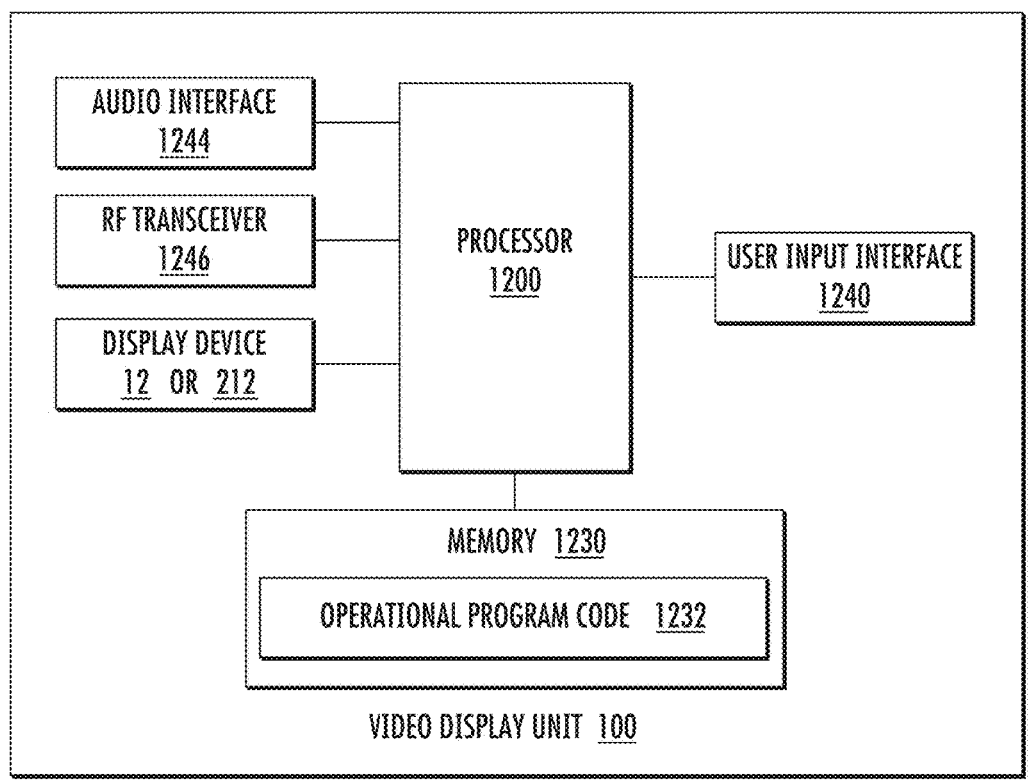
FIG. 15 illustrates a block diagram of a video display unit that is configured according to some embodiments.
Figure 17:

This configuration provides a seamless appearance with the cassette assembly 210 installed in the seatback of the aircraft seat 224, as illustrated in FIG. 13. The video display 212 extends to opposite outer edges 334 of the cassette bezel 284 (FIG. 11), and therefore the display spans almost the entire width of the seatback. This provides "edge to edge" video that may be particularly pleasing to passengers.

In some embodiments, the video display 212 has a diagonal length of at least 25 inches. In some embodiments, the video display 212 has a diagonal length of about 27 inches. In some embodiments, the video display 212 is square or generally square.

The current industry approach is to independently design seats and IFE units with additional design required to integrate them together. This leads to extra components or parts that add weight and possible failure modes. The independent design also does not provide an integrated and seamless appearance for the passenger.

In contrast, the cassette assemblies according to embodiments described herein may be designed together with the seat structure to provide a seamless and integrated appearance for the passenger. This may also eliminate the need for components or parts such as back and side shrouds and stiffening brackets for the IFE display unit and brackets and additional crash zones associated with the seat. As a result, the cassette assembly may provide a lighter and more robust system solution.

Moreover, cassette assemblies according to embodiments described herein can facilitate ease of installation by allowing the installer to simply mount the cassette in the mounting structure (e.g., in the seatback) and secure the cassette. Also, the cassette assembly can be easily removed and/or replaced so that the cassette assembly can be repaired or upgraded. For example, to remove the cassette assembly, the technician may only need to remove the seat cushion, remove one or more fasteners and then pull the cassette assembly from the mounting structure.

The modular nature of cassette assemblies according to embodiments described herein may allow one or more components of the cassette assembly to be replaced or upgraded before the cassette assembly is returned to its mounted position. For example, a damaged or outdated electronic component or video display may be replaced with a new electronic component or video display. Further, the cassette assembly may be configured to receive video displays of various sizes. For example, video displays of different sizes may be installed to account for the different distances between rows of seats in business, economy and/or first class seating.

Current industry IFE designs do not easily allow for future upgrades without impact to baseline certification requirements, such as the HIC standards set forth by the FAA. According to some embodiments, the cassette assembly may be upgraded as described above without impacting such baseline certification requirements.

Cassette assemblies according to embodiments described herein may introduce little to no degradation to passenger seat comfort and living space relative to known IFE designs.

Cassette assemblies according to embodiments described herein may be configured to comply with various standards associated with the FAA. Such standards may include electro-magnetic interface standards, flammability standards, HIC standards and/or environmental standards including shock and vibration standards.

In addition to being mountable in seatbacks, it is contemplated that cassette assemblies as described herein may be mounted in mounting structures located at any suitable location in an aircraft interior. Such locations include, but are not limited to, ceilings, sidewalls and lavatories.

Example Entertainment System with Video Display Units:

FIG. 7 is a block diagram of an entertainment system that includes personal electronic devices 101a-d, seat video display units (SVDUs) 100a-d, and other system components which are configured according to some embodiments of the present invention. Referring to FIG. 7, the system includes a head end content server 1000 that contains content that can be downloaded to the SVDUs 100a-d through a data network 1010 and a content distribution interface 1020. The content distribution interface 1020 can include seat electronics boxes 1022, each of which can be spaced apart adjacent to different groups of seats, and/or a wireless router 1024.

Example content that can be downloaded from the head end content server 1000 can include, but is not limited to, movies, TV shows, other video, audio programming, and application programs (e.g., game programs). The wireless router 1024 may be a WLAN router (e.g., IEEE 802.11, WIMAX, etc), a cellular-based network (e.g., a pico cell radio base station), etc.

The SVDUs 100a-d are connected to request and receive content from the head end content server 1000 through a wired and/or wireless network connections through the content distribution interface 1020.

When used in an aircraft environment, the SVDUs 100a-d can be attached to seatbacks so that they face passengers in a following row of seats. For example, a respective one of the SVDUs 100a-d may be or include a cassette assembly mounted to a mounting structure in a seatback as described herein. The personal electronic devices 101a-d would each typically be connected to a corresponding one of the SVDUs 100a-d through a wireless RF channel (e.g., WLAN peer-to-peer, Bluetooth, etc.) or may be tethered by a cable (e.g. wire/communication cable) to an associated one of the SVDUs. For example, personal electronic devices 101a-c are connected through wireless RF channels to respective SVDUs 100a-c. The personal electronic device 101d is connected through a wired communication cable (e.g., serial communication cable) to the SVDU 100d.

In accordance with some embodiments, a passenger can operate a personal electronic device 101 to control what content is displayed and/or how the content is displayed on the associated SVDU 100 and/or on the personal electronic device 101. For example, a passenger can operate the personal electronic device 101b to select among movies, games, audio program, and/or television shows that are listed on the SVDU 100b, and can cause a selected movie/game/audio program/television show to be played on the SVDU 100b, played on the personal electronic device 101b, or played on a combination of the SVDU 100*b* and the personal electronic device 101*b* (e.g., concurrent display on separate screens).

Each of the personal electronic devices 101*a-d* in the IFE system may be assigned a unique network address (e.g., media access control (MAC) address, Ethernet address). In addition, the SVDUs 100*a-d* may be each assigned a unique network address (e.g., MAC address, Ethernet address) which are different from the network addresses of the respective communicatively coupled personal electronic devices 101*a-d*. In some embodiments, a personal electronic device 101*b* and a SVDU 100*b* may be coupled with a same seat-end electronics box 1022 (when utilized by the system) that functions as a local network switch or node to provide network services to SVDUs at a group of passenger seats, for example a row of seats. In other embodiments, the personal electronic device 101*b* and the respective SVDU 100*b* may be coupled with different seat-end electronics boxes 1022 (when utilized by the system). For example, a personal electronic device 101 for use by a passenger in an aircraft seat identified by a passenger readable identifier (e.g., a printed placard) as seat "14B" may be attached to a seat electronics box 1022*a* that provides network connections to row "14", while the SVDU 100*b* installed in the seat back in front of seat "14B" for use by the passenger in seat "14B" may be attached to a different seat electronics box 1022*b* that provides network connections to row "13."

Example Video Display Unit:

FIG. 8 illustrates a block diagram of a video display unit 100 that is configured according to some embodiments. The video display unit 100 may be or include one of the cassette assemblies as described herein. The video display unit 100 may include a RF transceiver 1246, the display device 12, and a processor 1200 that executes computer program code from a memory 1230. The RF transceiver 1246 may be configured to communicate through a wireless RF channel with a personal electronic device 101 (e.g., that is used by a passenger). The personal electronic device 101 can be a personal electronic device that is carried by a passenger into communication range of the video display unit 100, including, without limitation, a tablet computer, a laptop computer, a palmtop computer, a cellular smart phone, a media player, etc. The video display unit 100 may further include a user input interface (e.g., touch screen, keyboard, keypad, etc.) and an audio interface 1244 (e.g., audio jack and audio driver circuitry).

The processor 1200 includes one or more data processing circuits, such as a general purpose and/or special purpose processor (e.g., microprocessor and/or digital signal processor). The processor 1200 may include the electronic components described above in reference to FIG. 6. The processor 1200 is configured to execute computer program instructions from operational program code 1232 in a memory 1230, described below as a computer readable medium, to perform some or all of the operations and methods that are described herein for one or more of the embodiments.

Enhanced User Experience:

User interfaces of known IFE systems may not be intuitive to passengers. It may be desirable to emulate the graphical user interface of personal electronic devices (e.g., cellular smart phones, tablets, etc.) to make the user experience more intuitive.

Also, graphical user interfaces of known IFE systems may not provide the convenience and flexibility that passengers are accustomed to with their personal devices. For example, known IFE systems employ sometimes frustrating multi-layer menus and typically only allow a passenger to interface with one application at a time.

Figure 16:
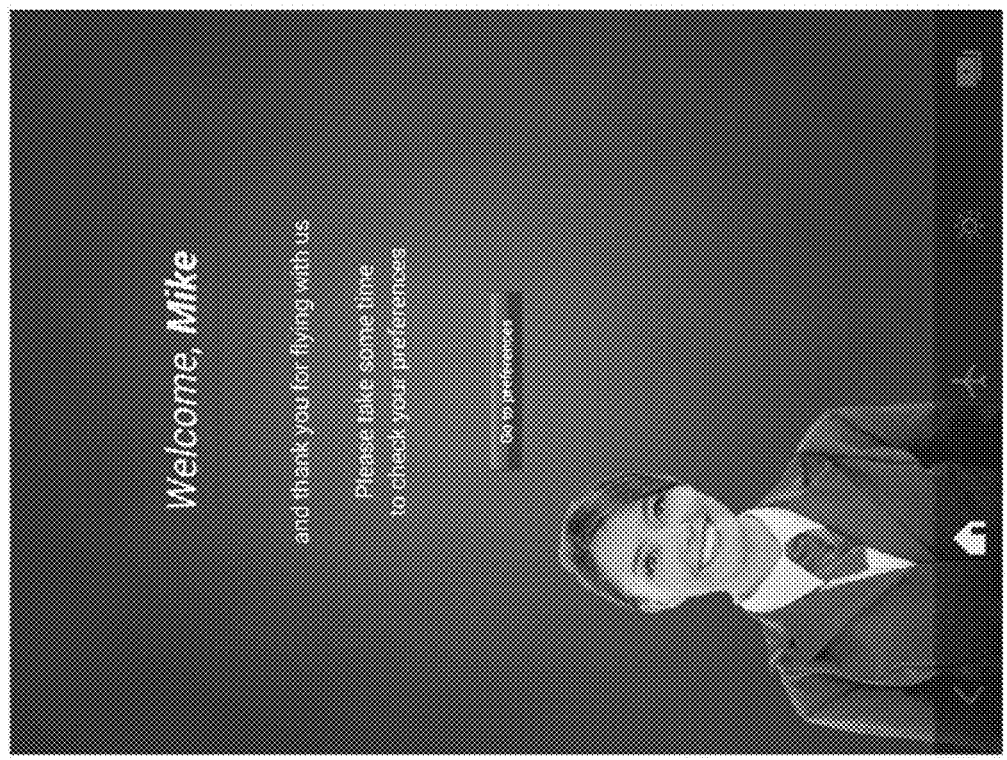
FIGS. 16-111 are screenshots illustrating applications and features for enhanced user experience according to some embodiments.
Figure 19:
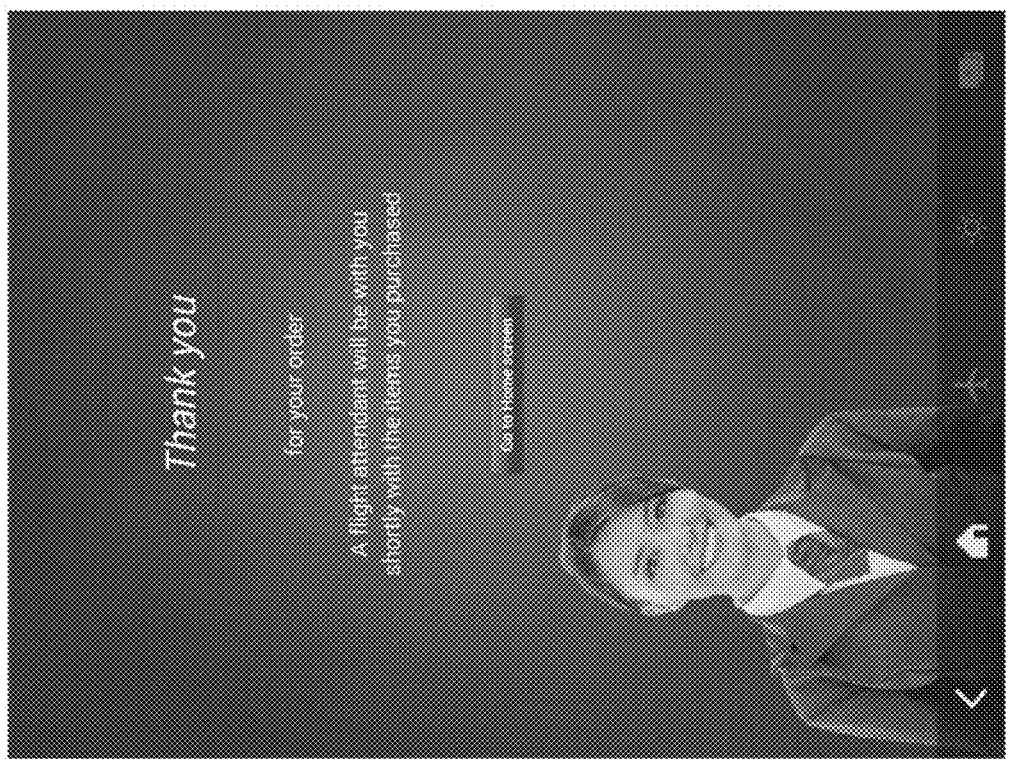
Figure 18:
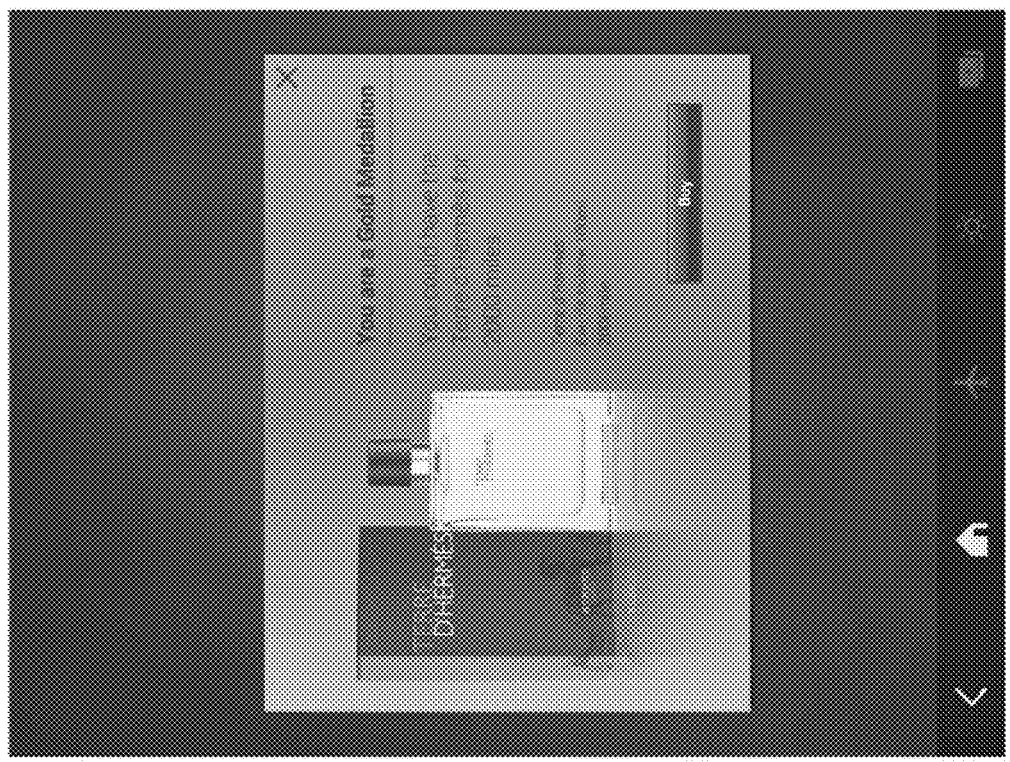

Embodiments of the present invention provide more convenient, flexible and intuitive graphical user interfaces. As noted above, the large size of the video display and/or the portrait orientation thereof may allow for functionality not available with known IFE systems. Some of these features are described below with reference to FIGS. 16-111.

Referring to FIGS. 16-20, upon sitting in his or her seat, a passenger may be presented with a virtual butler along with a welcome message. The passenger may select an icon to establish his or her preferences (e.g., food, drink, movie, music and TV preferences). The passenger may select an advertisement banner for the opportunity to purchase an item (e.g., using the passenger's frequent flier miles). The passenger may then activate a "home screen" icon to go to the home screen shown in FIG. 20.

A plurality of icons are displayed on the home screen allowing the passenger to select from a plurality of different applications. For example, the passenger may activate the "movie" icon and perform various operations shown at FIGS. 21-28.

Figure 28:
Figure 27:
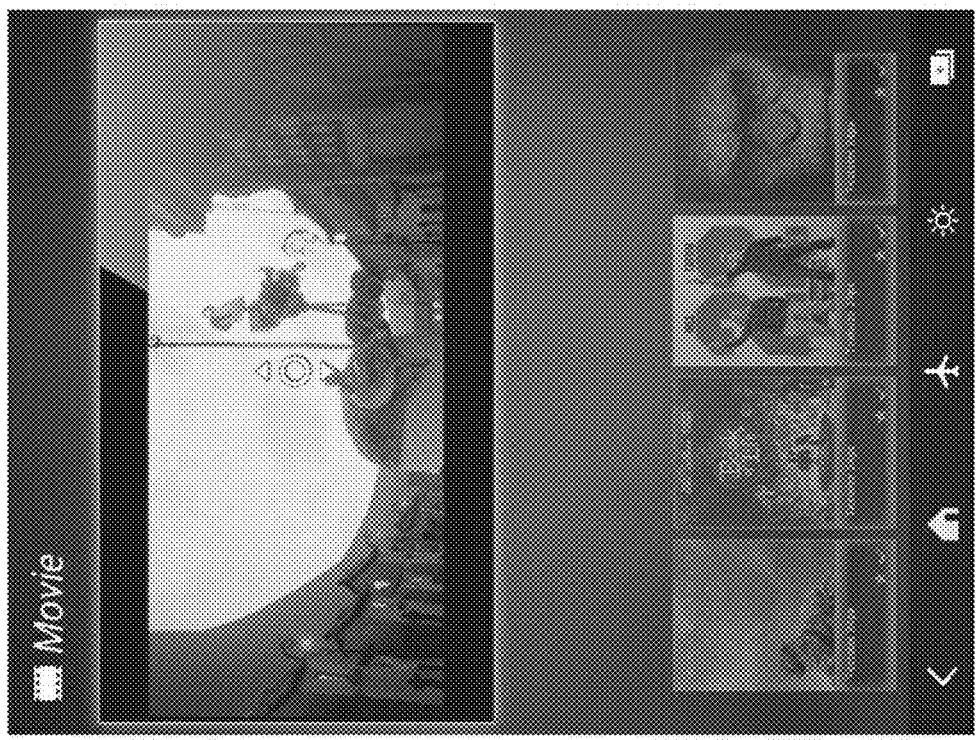

The available movie titles are displayed as relatively large icons or thumbnails. The passenger may view additional available movies by swiping the touch display (e.g., left-right and/or up-down). The passenger may select one of the icons to display a larger window including a description of the movie, previous passenger ratings of the movie and/or icons that are selectable to either watch a trailer or watch the film. The passenger may start the movie while other movie title options continue to be presented below. The passenger may select an alternative movie which may then begin to play below the previously selected movie (which may continue to play or automatically pause). The alternative movie may be selected and may automatically move to the upper portion of the display. As shown in FIG. 28, a position adjustment icon may be used to drag the movie to another place on the display (e.g., the bottom portion of the display). In this way, the passenger may select his or her preferred viewing position.

Various virtual flight assistant features are illustrated in FIGS. 29-35. The passenger may select the flight assistant icon (e.g., the "plane" icon) and a flight assistant window pops up below a movie being viewed. The flight assistant window includes a scheduler that helps the passenger visualize timing of service and onboard activities. For example, the scheduler may illustrate drink and meal times, timing for sleep mode such as dimming of the lights, and arrival time.

Figure 30:
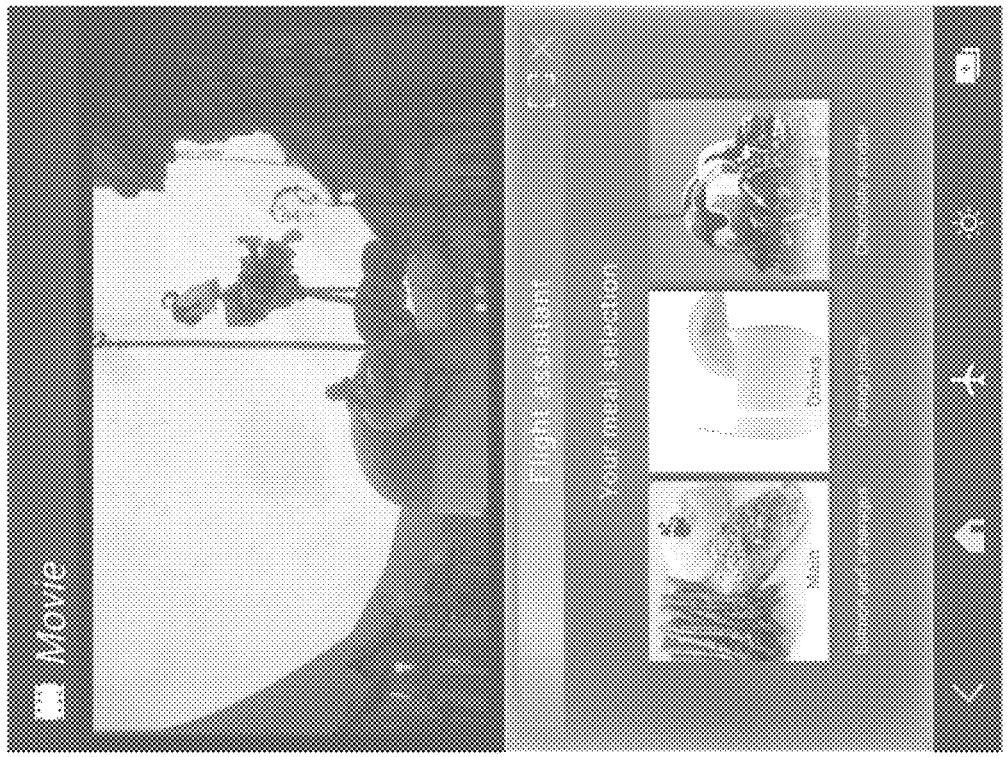
Figure 29:
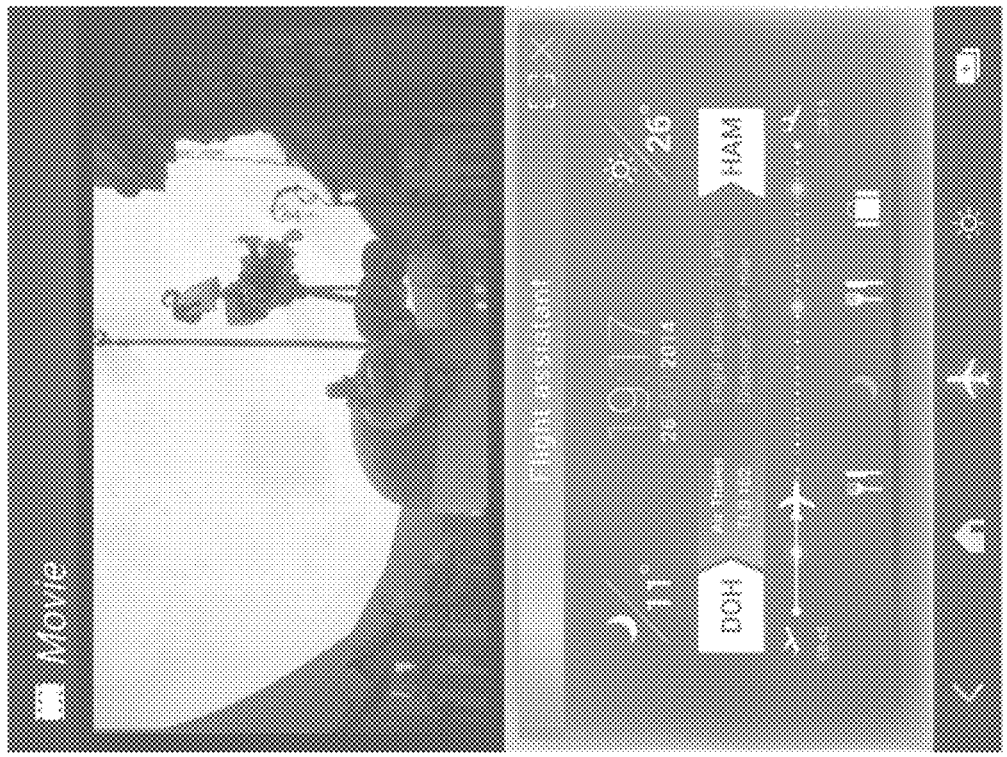
Figure 32:
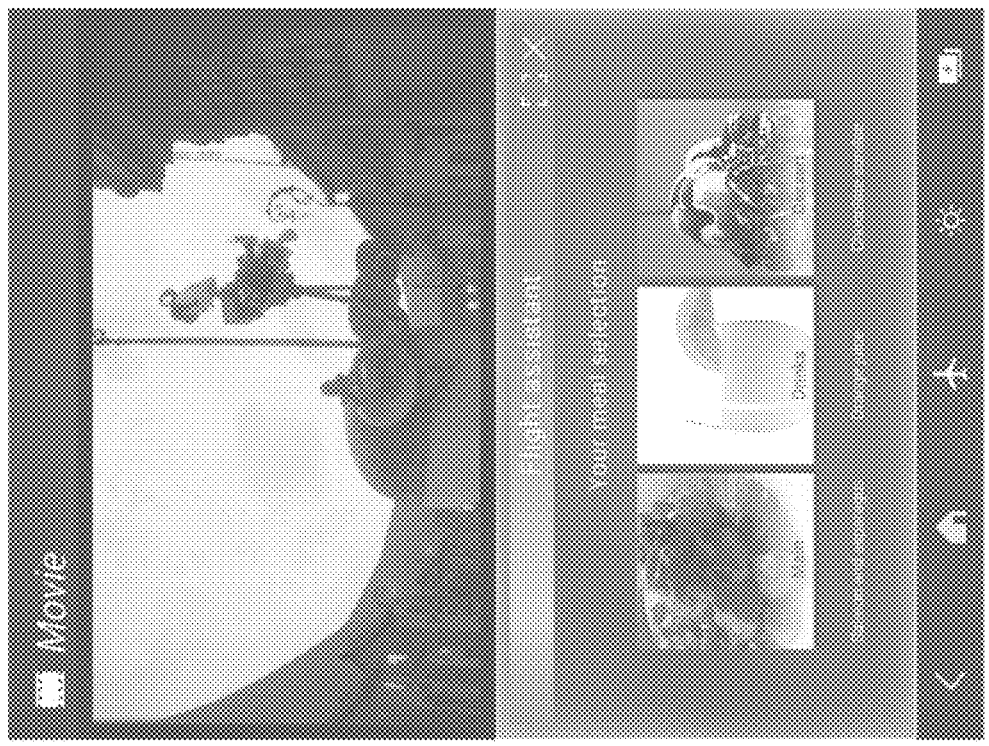
Figure 31:
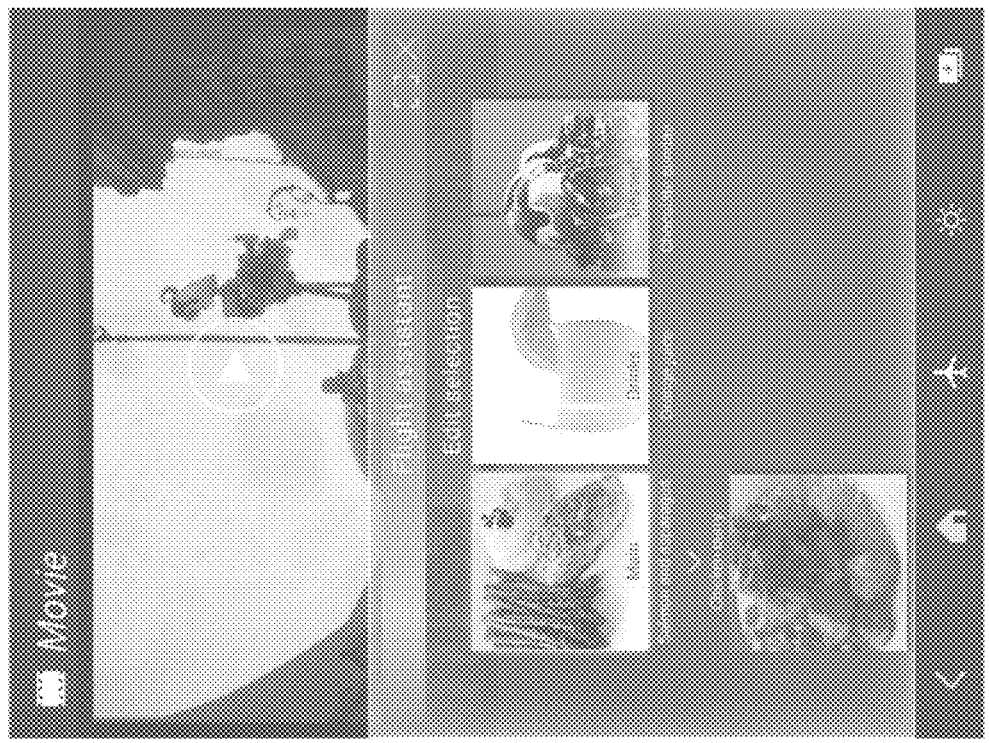

The passenger may select the drink or meal icon (e.g., the fork/knife icon) to view drink and food options and make preferences or selections as shown in FIGS. 30-32.

The arrival information icon (e.g., the luggage icon) may be selected to display information such as airport maps, connecting gate information and the carousel for luggage collection. This may help manage "gate anxiety" for the passenger.

Figure 34:
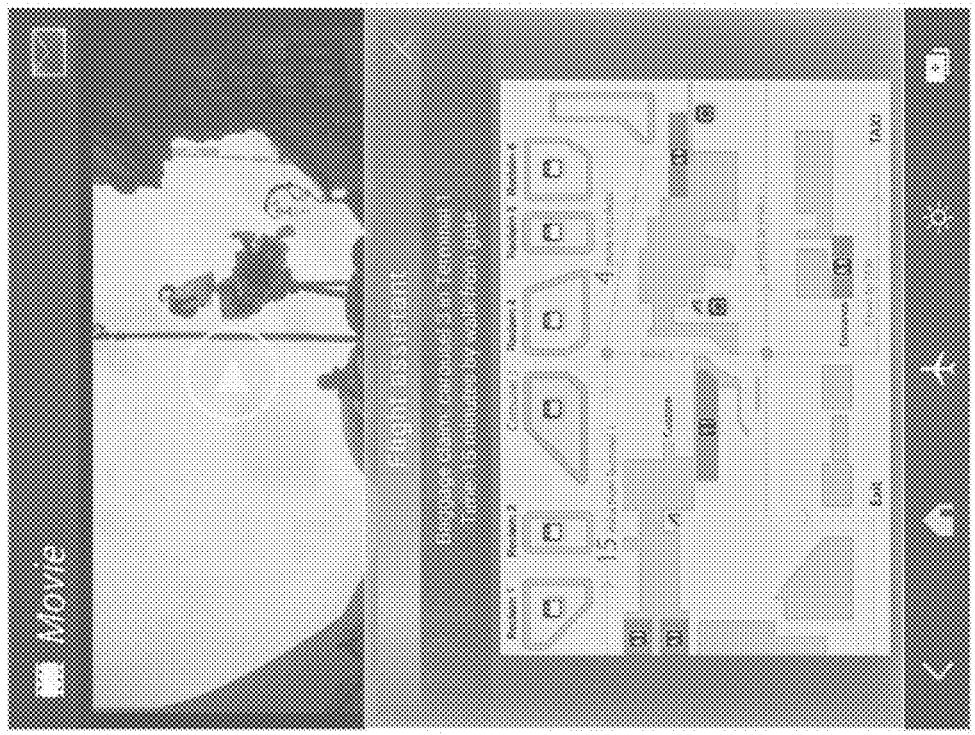
Figure 33:
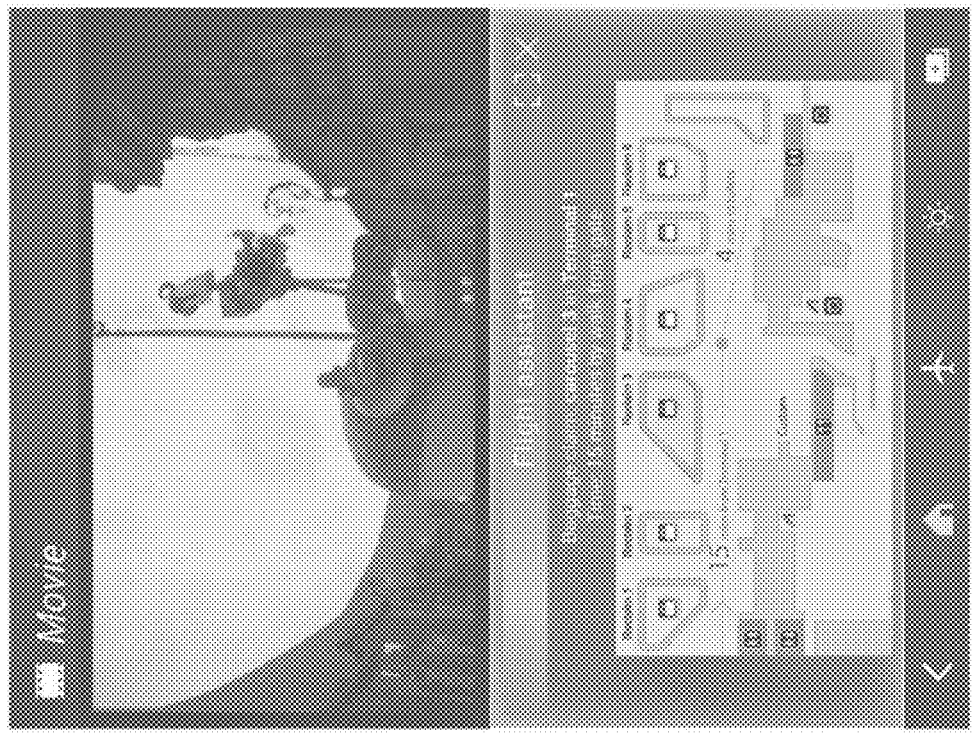
Figure 37:
Figure 36:
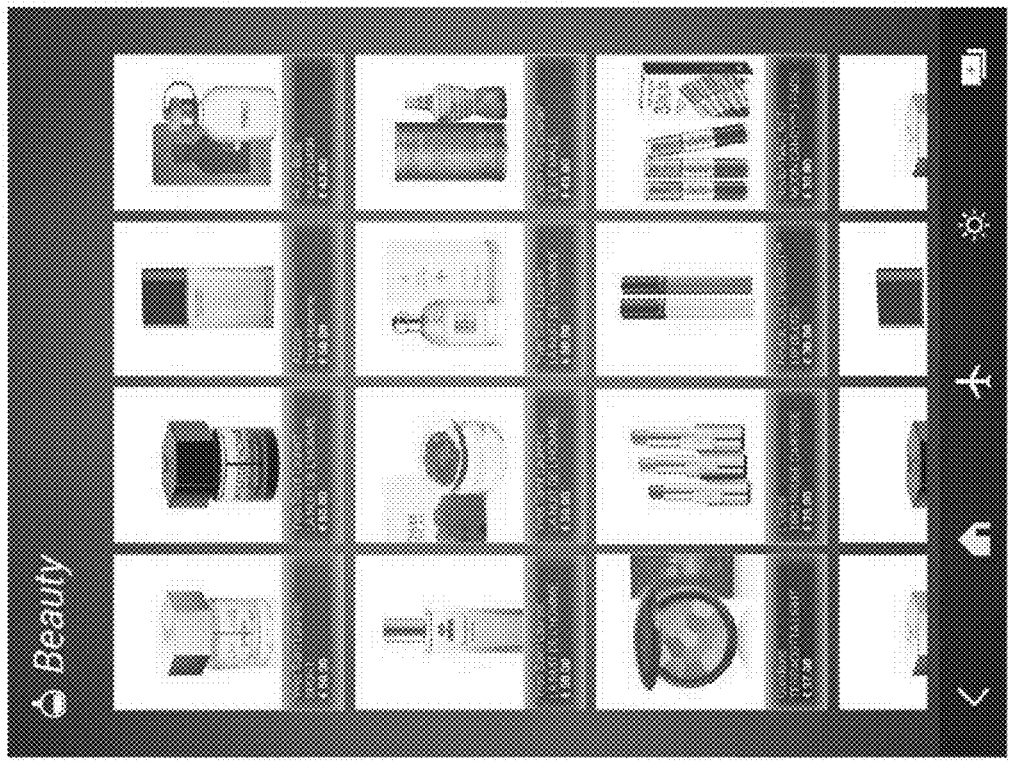
Figure 39:
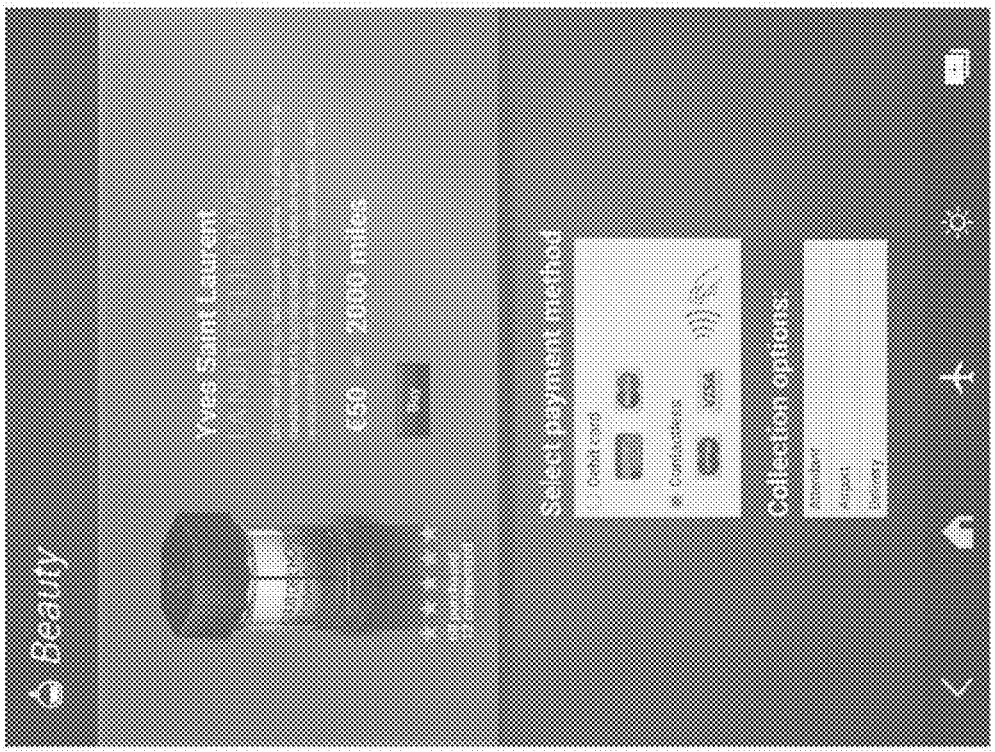
Figure 38:
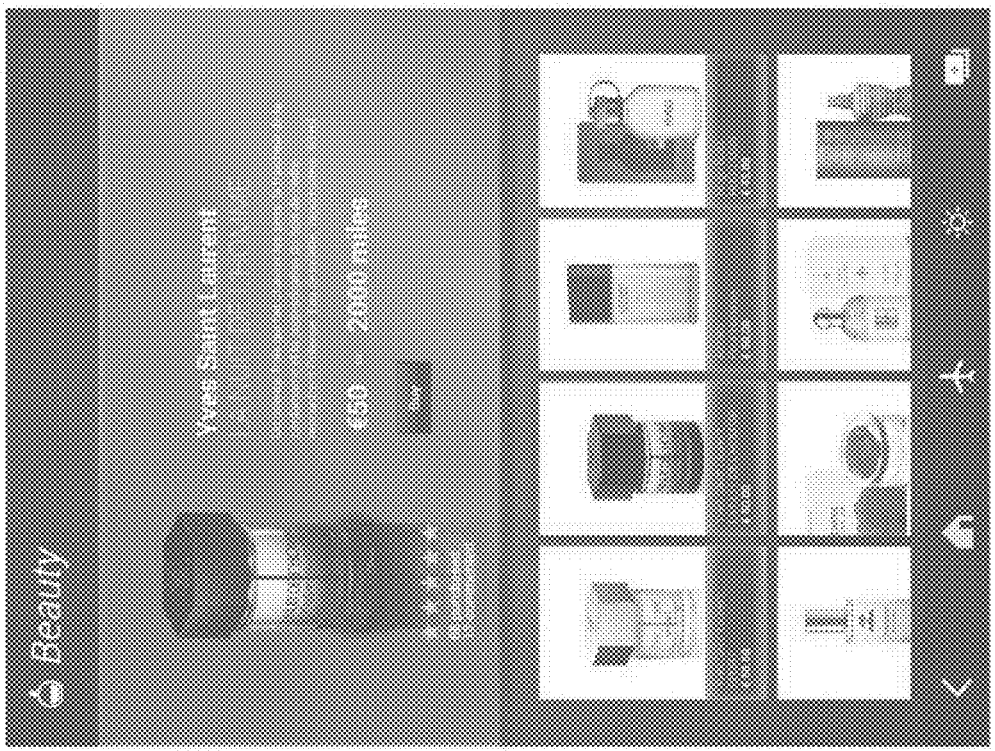
Figure 41:
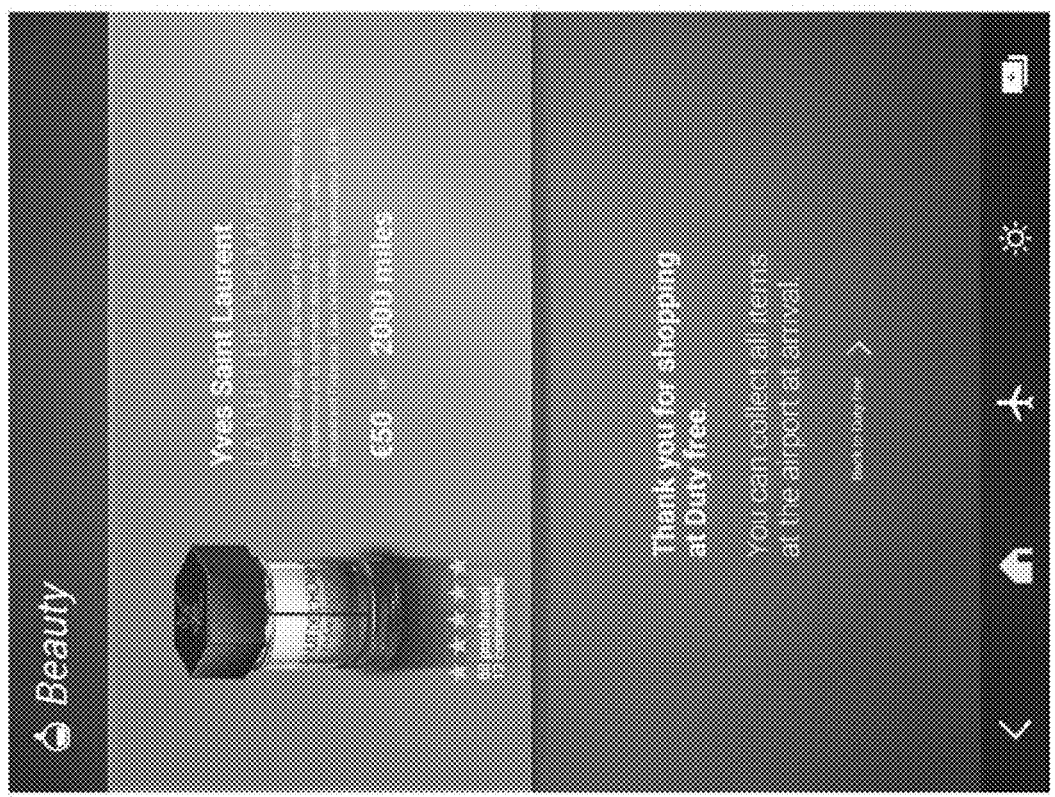
Figure 40:
Figure 43:
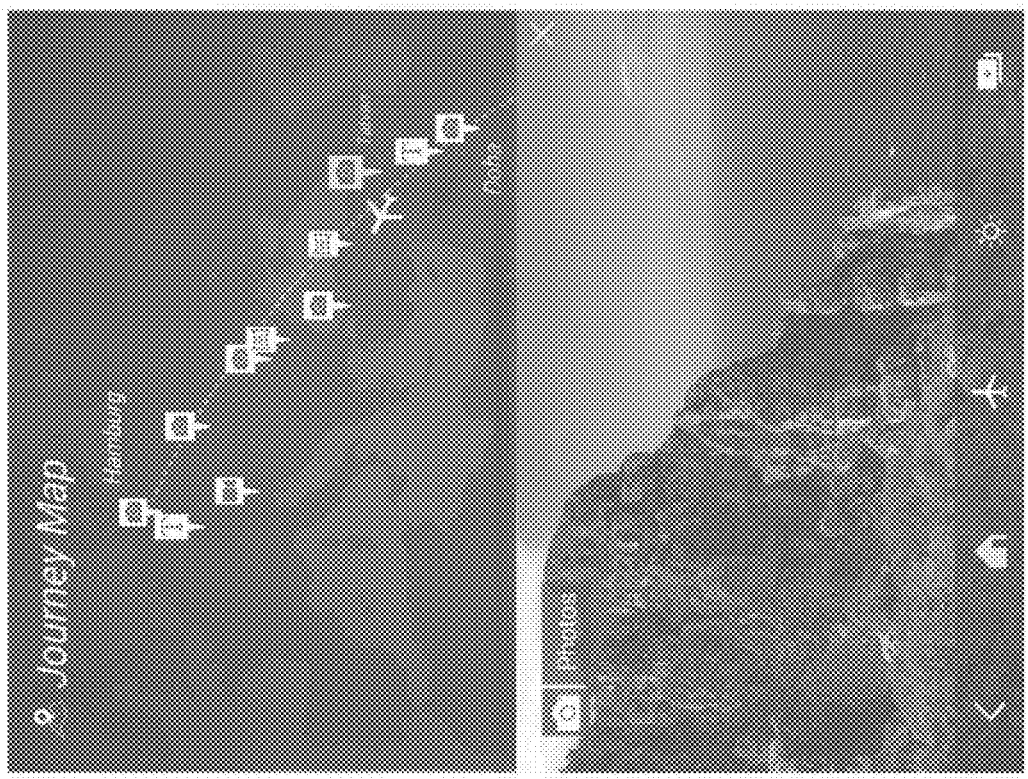

Referring to FIGS. 34 and 35, a message icon may appear in the top corner of the display. The icon may be selected to display the message, which may include information such as upcoming activities (meals, lights being dimmed, connecting gate information, luggage carousel information, etc.). In some embodiments, a message may automatically pop up to alert the passenger of this and other information.

Figure 20:
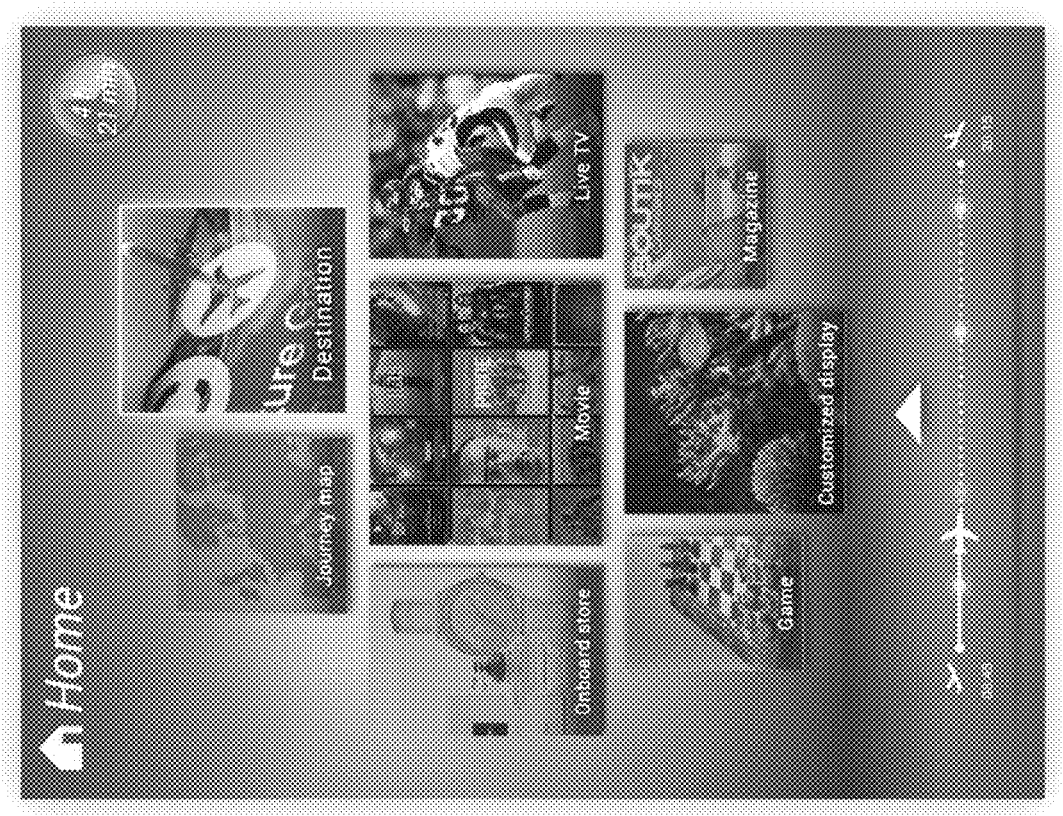
Figure 22:
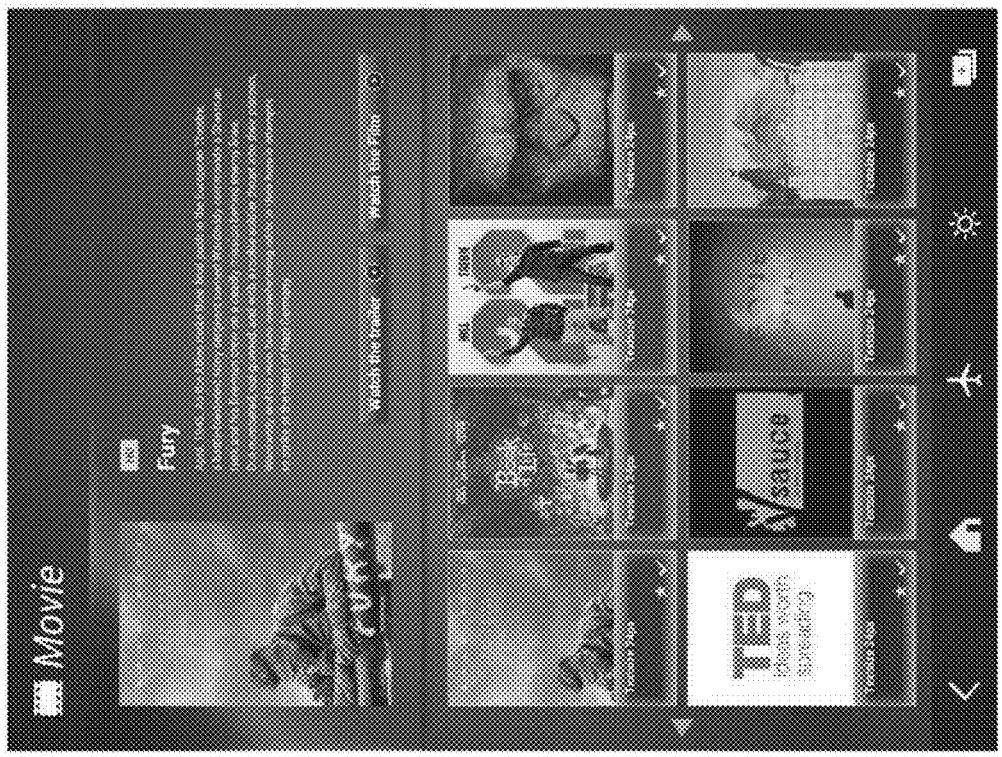
Figure 21:
Figure 24:
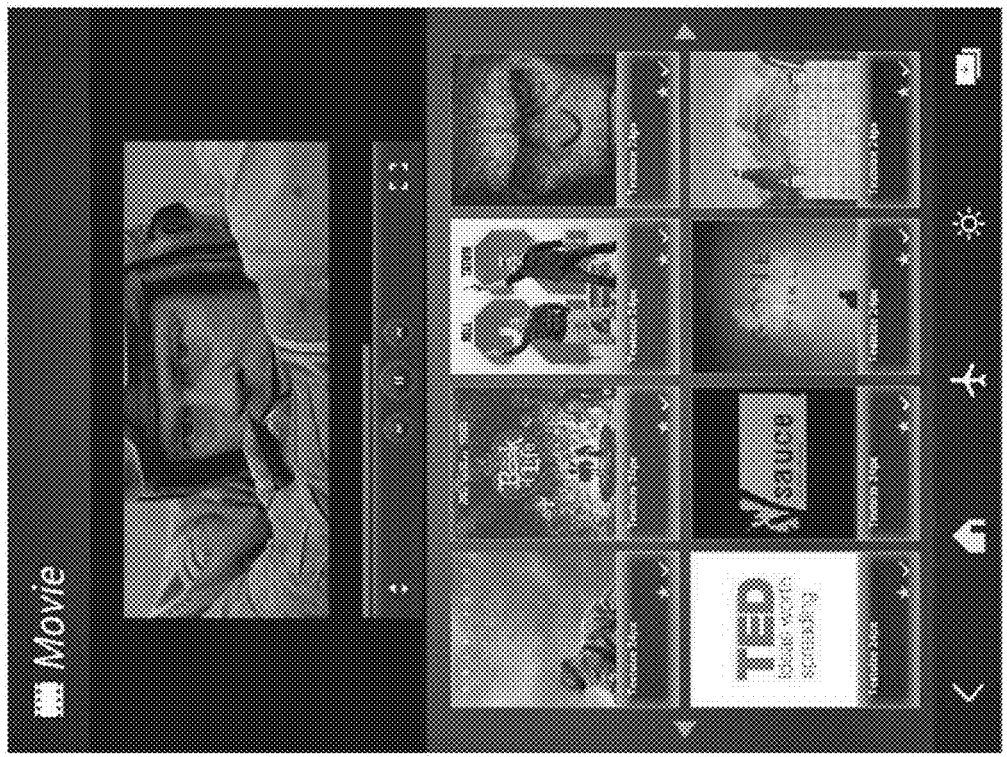
Figure 23:
Figure 26:
Figure 25:

The onboard store icon may be selected at the home screen (FIG. 20). Various onboard store features and options are shown at FIGS. 36-41. Available products may be presented with large icons or thumbnails. The passenger may scroll through additional products by, for example, swiping the touch screen. An icon may be selected to view a video about the product and previous passenger reviews. The passenger may select a buy icon and select payment method (e.g., standard card or contact-less card). The passenger may use a contact-less card may bringing the card in the vicinity of the screen or touching the card to the screen. The passenger may also select a collection method (e.g., onboard, at the destination airport, at a given address, etc.).

Figure 42:
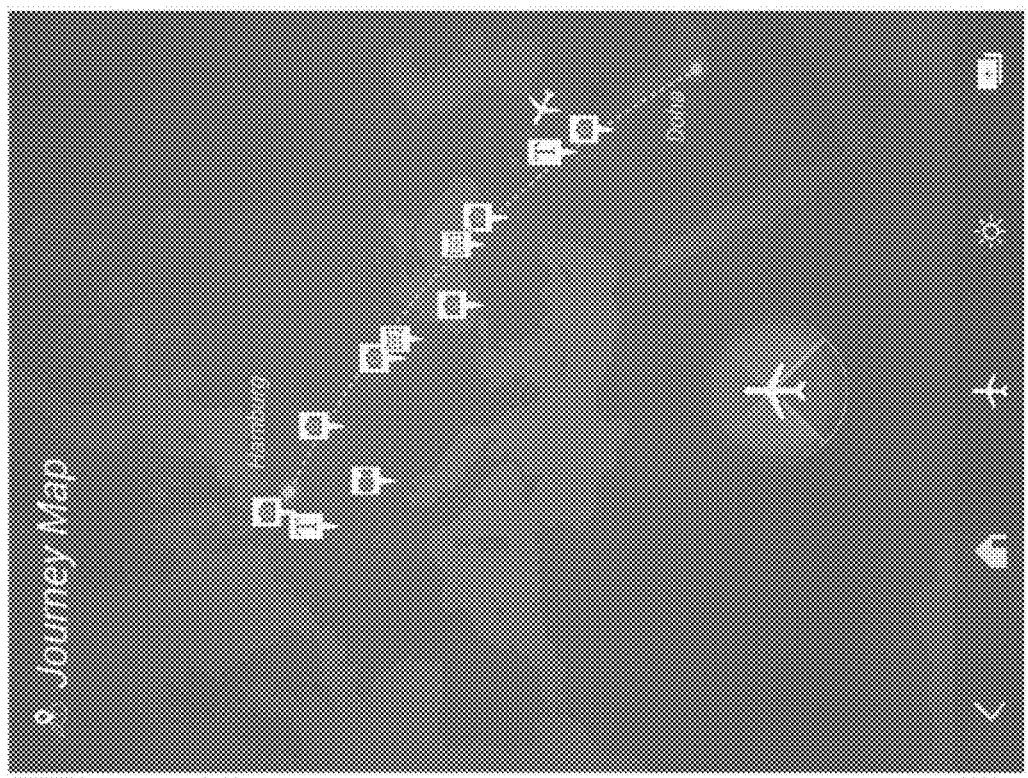
Figure 45:
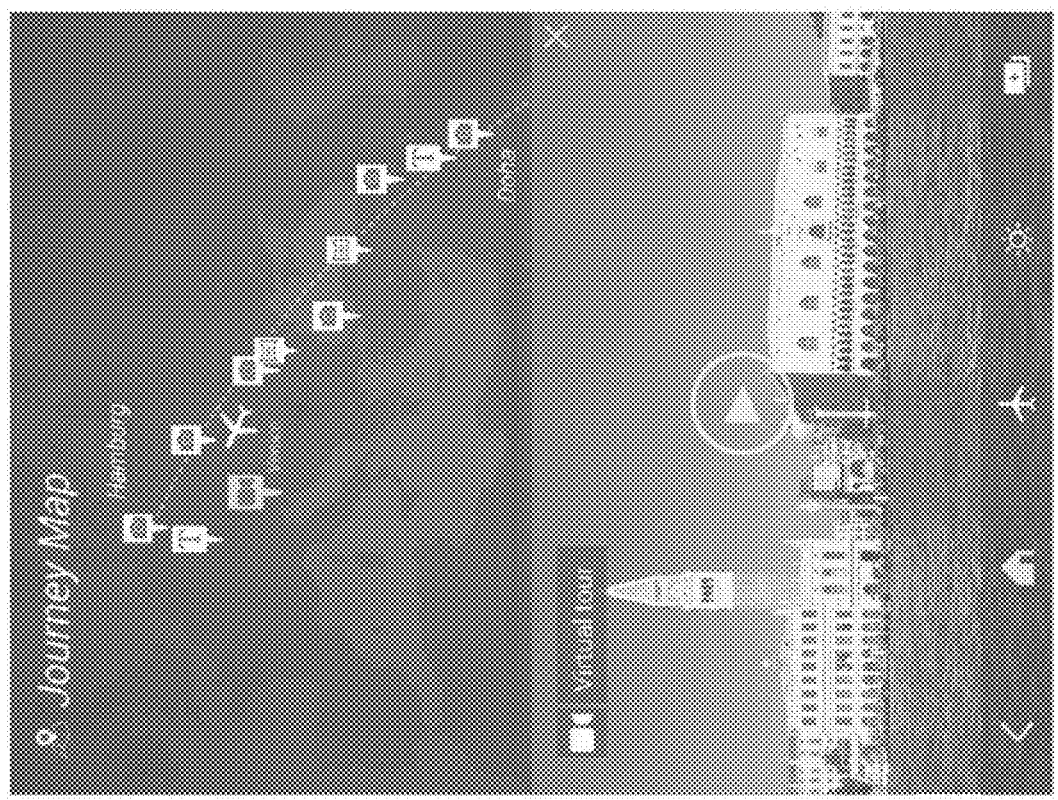
Figure 44:
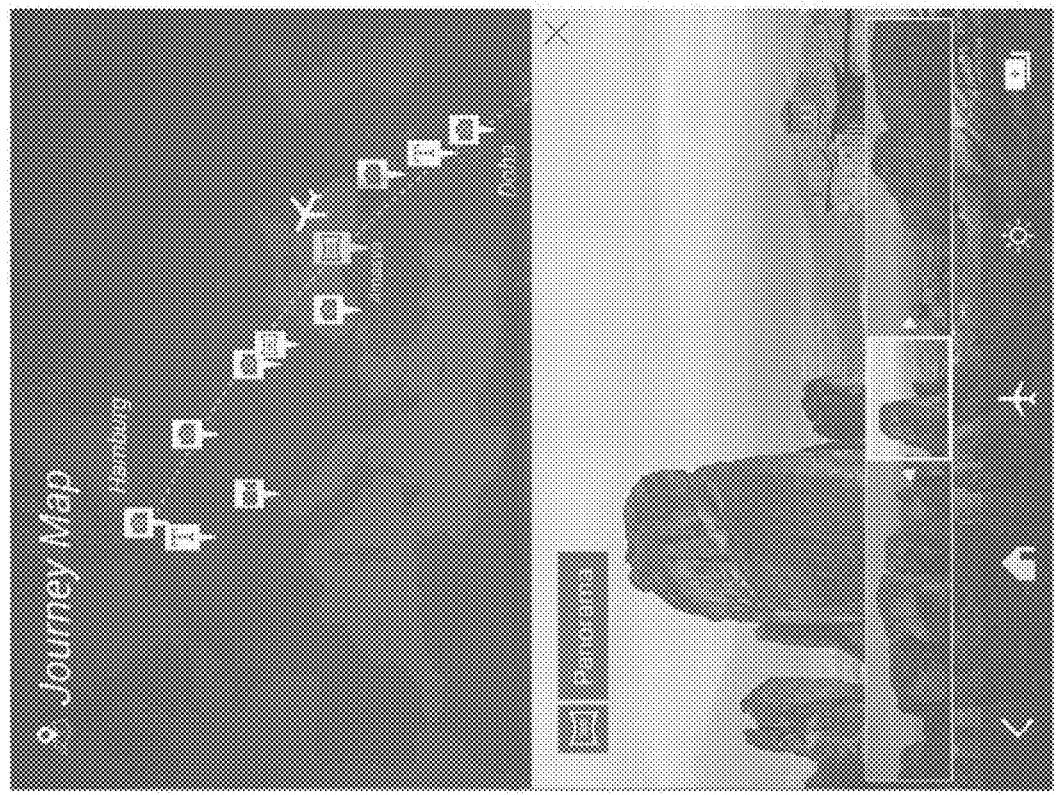
Figure 47:
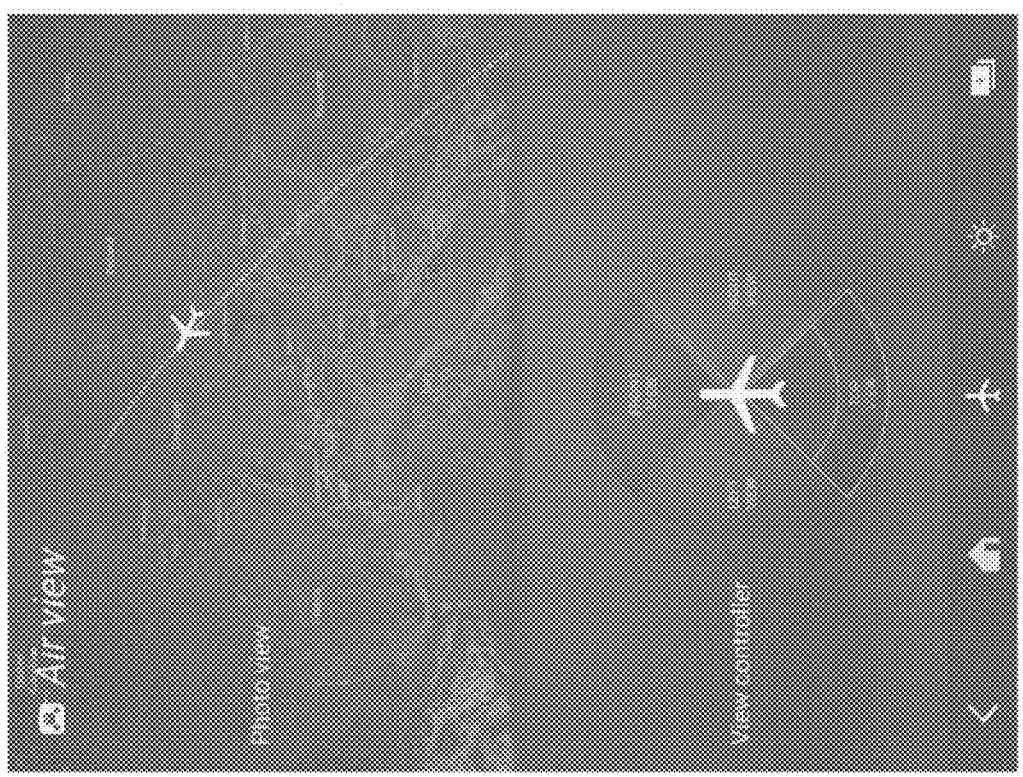
Figure 46:
Figure 49:
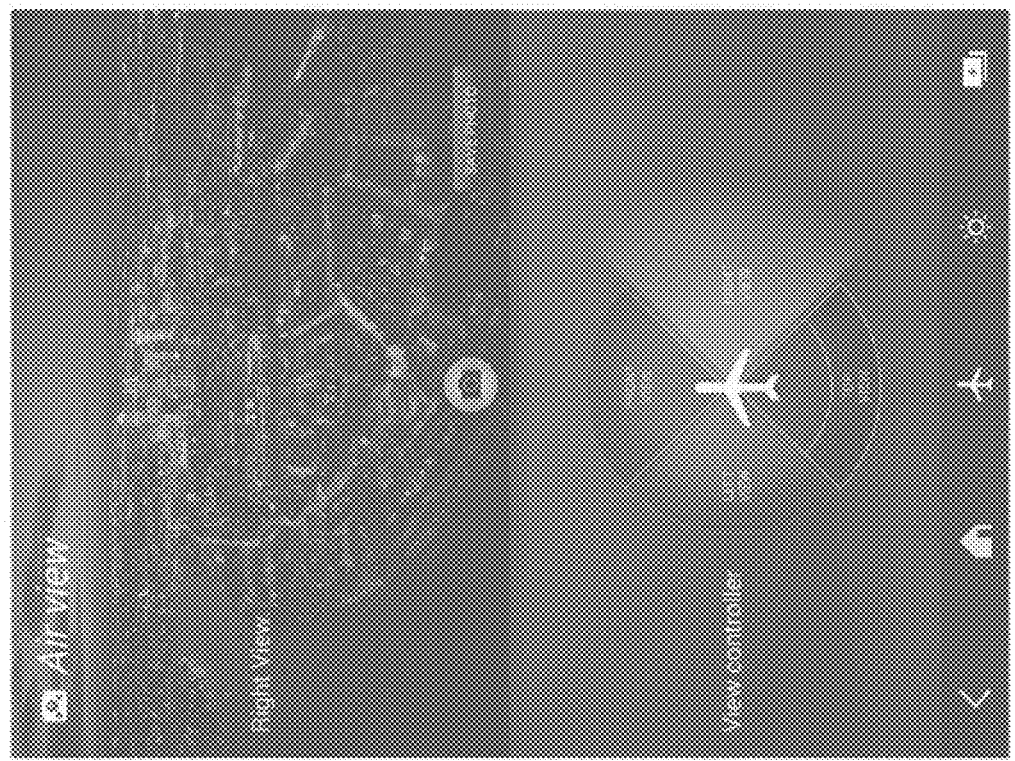
Figure 48:
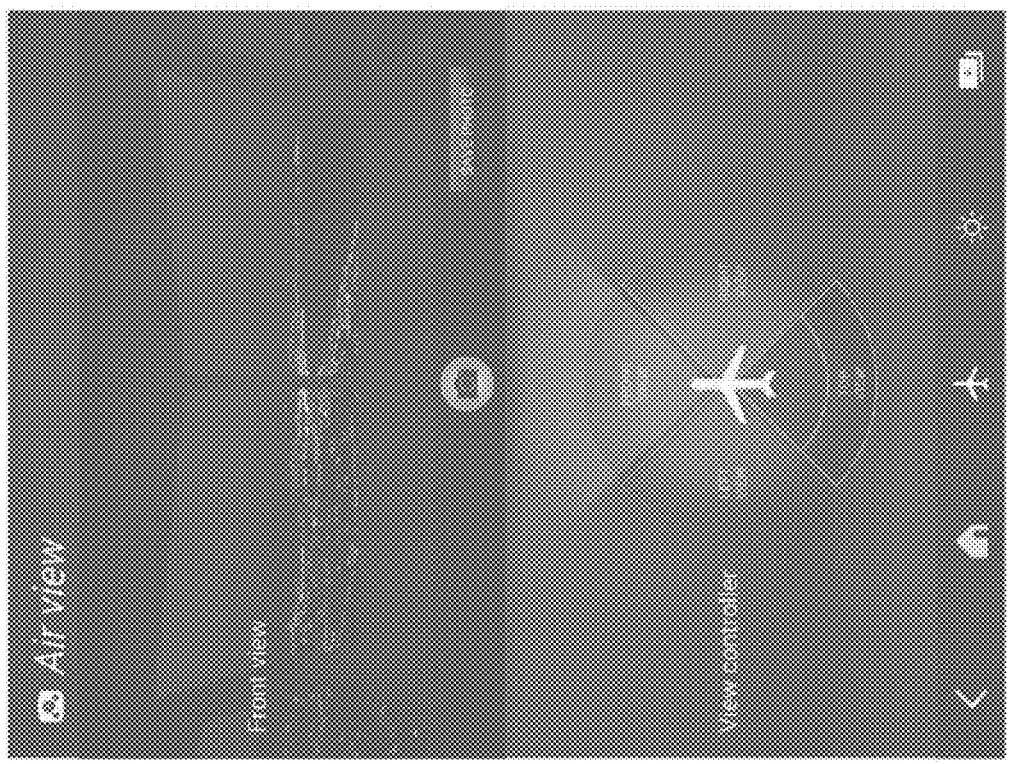
Figure 51:
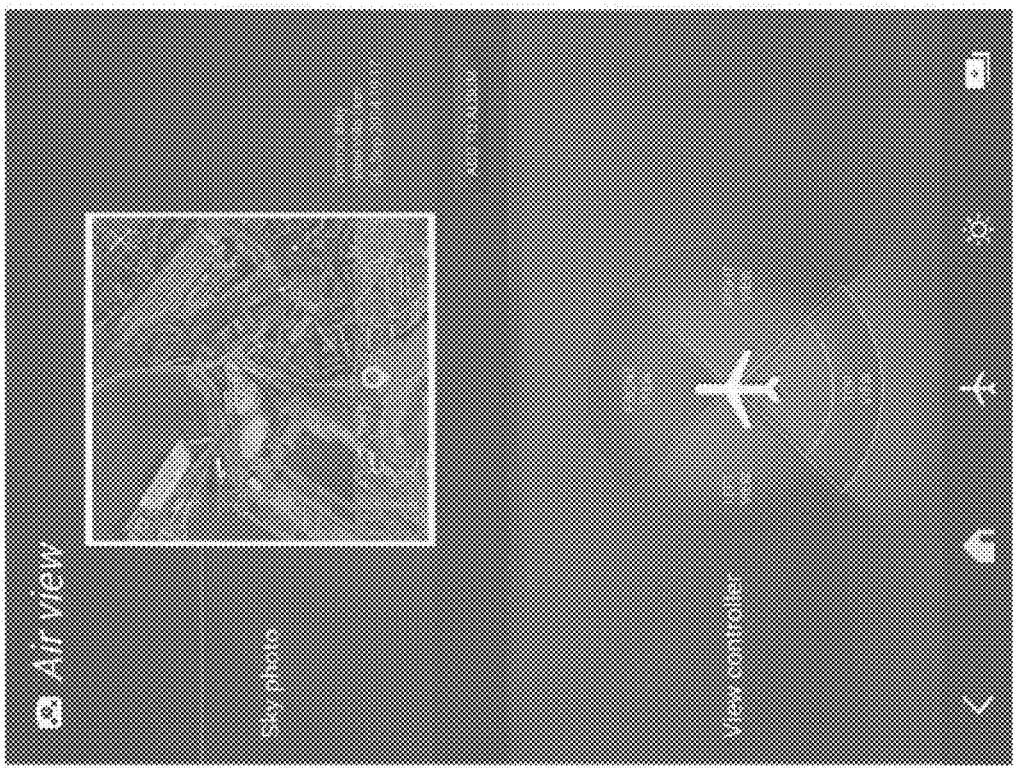
Figure 50:
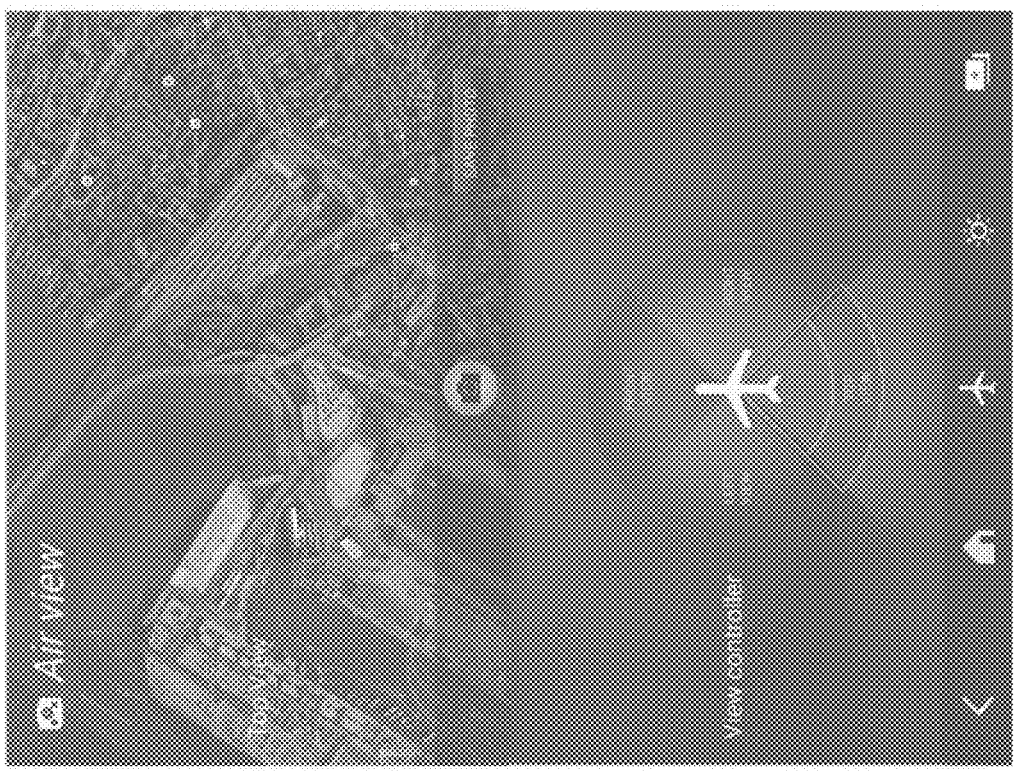
Figure 53:
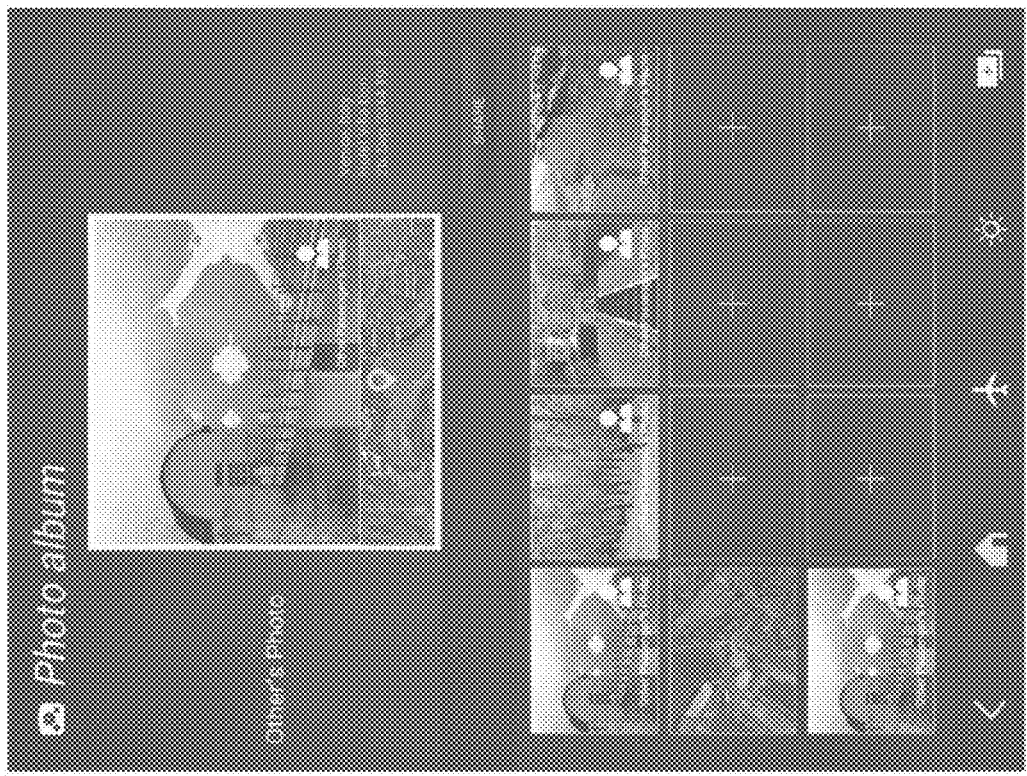
Figure 52:
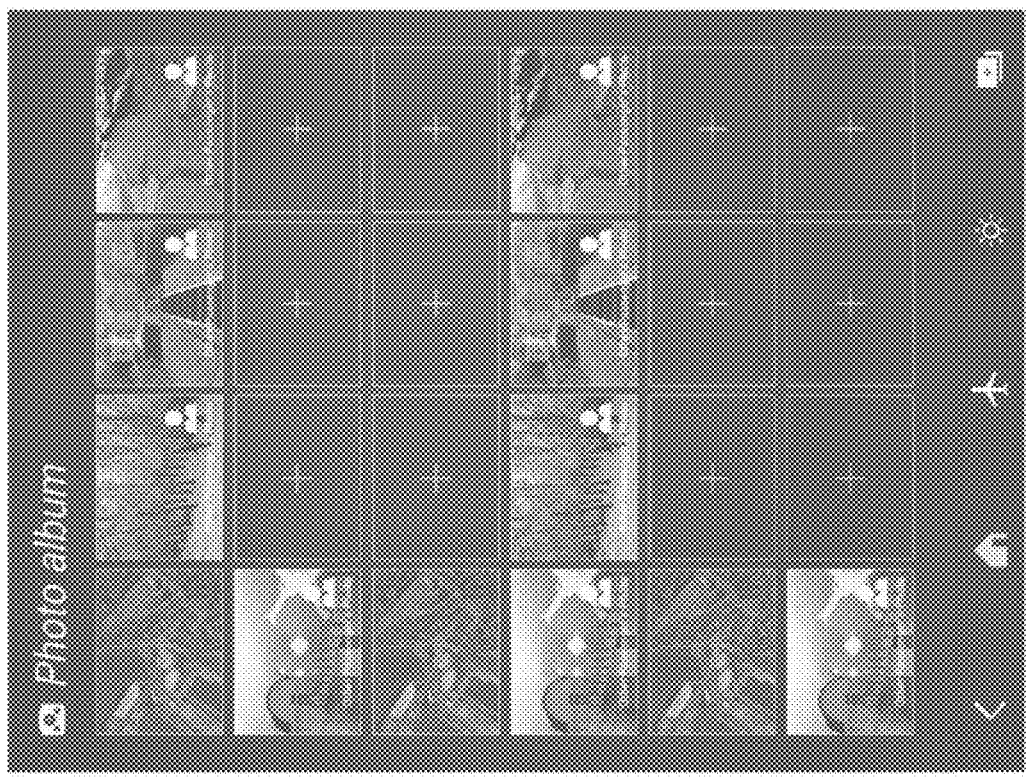

The journey map icon may be selected at the home screen (FIG. 20). A flight or journey map may be displayed as illustrated in FIG. 42. The flight map shows flight progress and includes a plurality of flags along the flight path. As illustrated in FIGS. 43-46, the passenger may tap the various flags to view information corresponding to the location of the flag including photos, interactive panoramic views, virtual tours (e.g., videos) and descriptions of the location or local products. The passenger may enter an air view mode as shown in FIGS. 47-51. A view may be selected (font or cockpit view, left view, right view and top view) to display dynamic real time video corresponding to the selected view. The passenger may take and save a photograph as shown in FIGS. 52 and 53. The photo may include information such as date, time and GPS location. As illustrated in FIGS. 52 and 53, a photo album may be accessed which may include the passenger's photos and photos that other passengers have shared. The passenger may share his or her photos so that other passengers can view them in the album. The passenger may save various photos from the album on his or her personal electronic device and/or may send photos via email or other messaging application.

Figure 54:
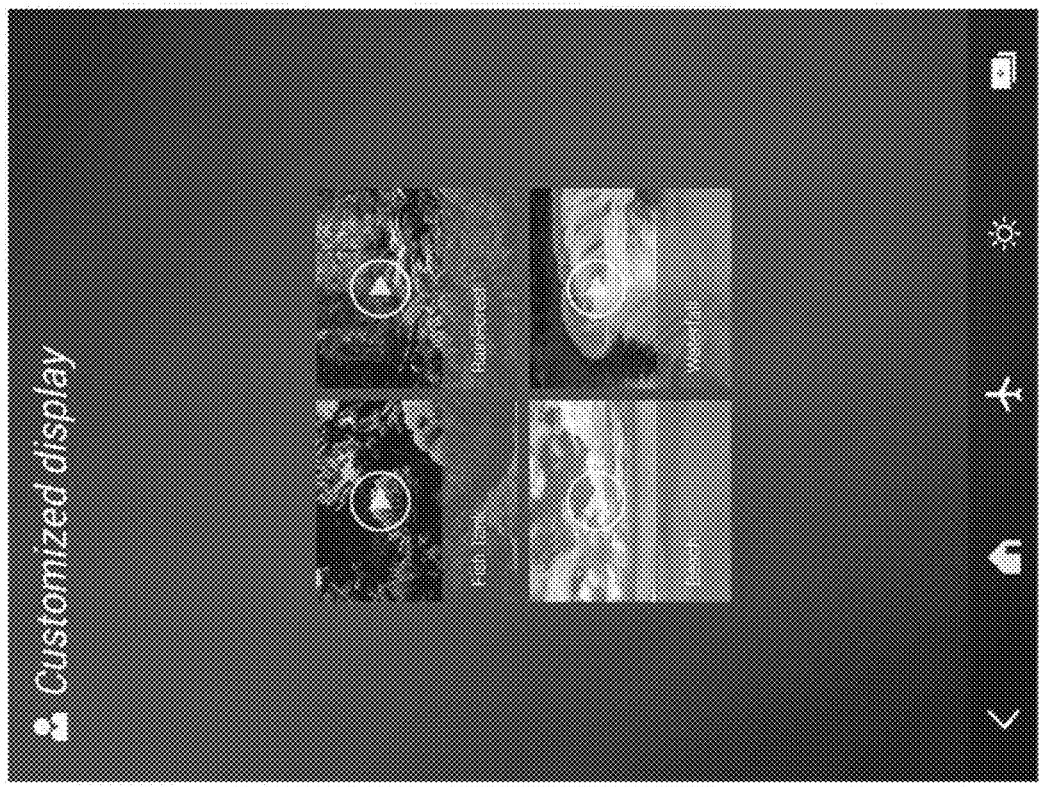
Figure 56:
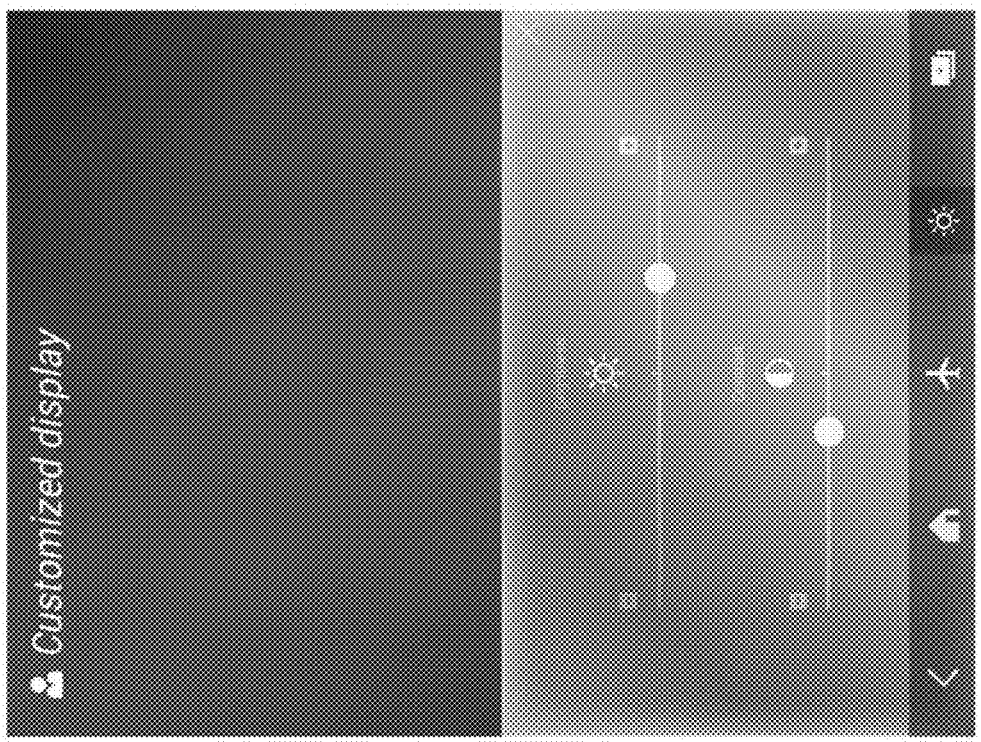
Figure 55:

The passenger may select the customized display icon at the home screen (FIG. 20). The passenger may then be provided options of lighting effects to accommodate the passenger's mood or activity (e.g., the screen may provide a gentle ambient light to promote comfortable sleeping). The display may therefore communicate the passenger's status to flight attendants and others in a subtle way. The brightness and/or contrast of the screen may be adjusted as illustrated in FIG. 56. The passenger may select from a variety of relaxing landscape animations as illustrated in FIGS. 54 and 55.

Figure 58:
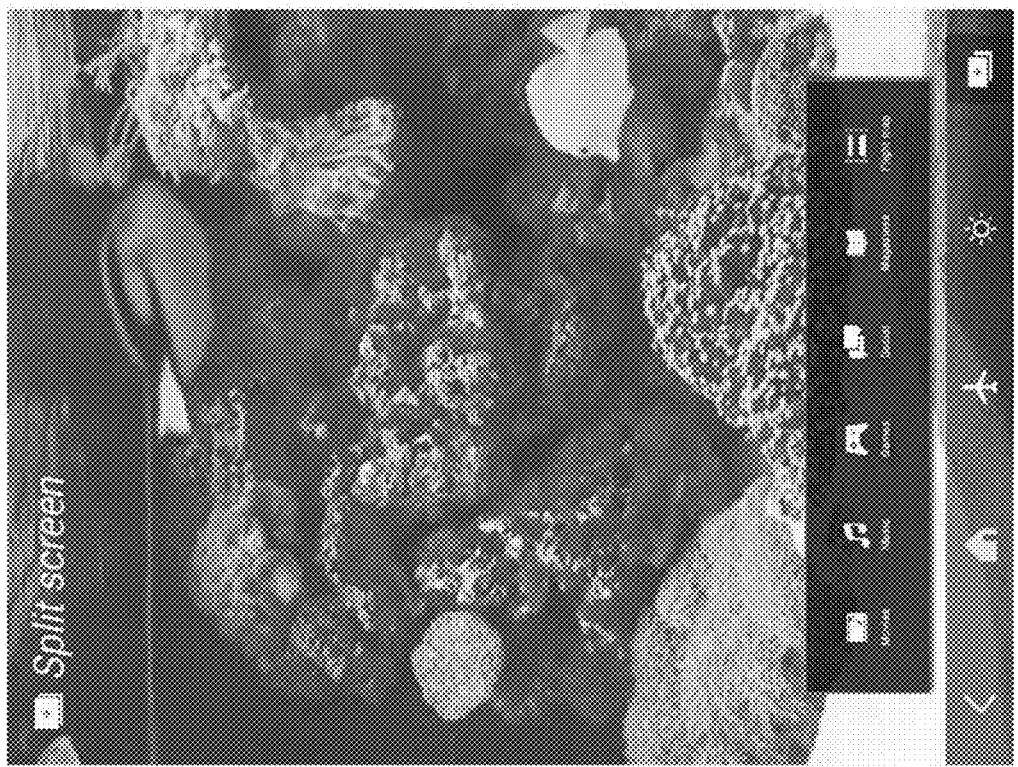
Figure 57:
Figure 60:
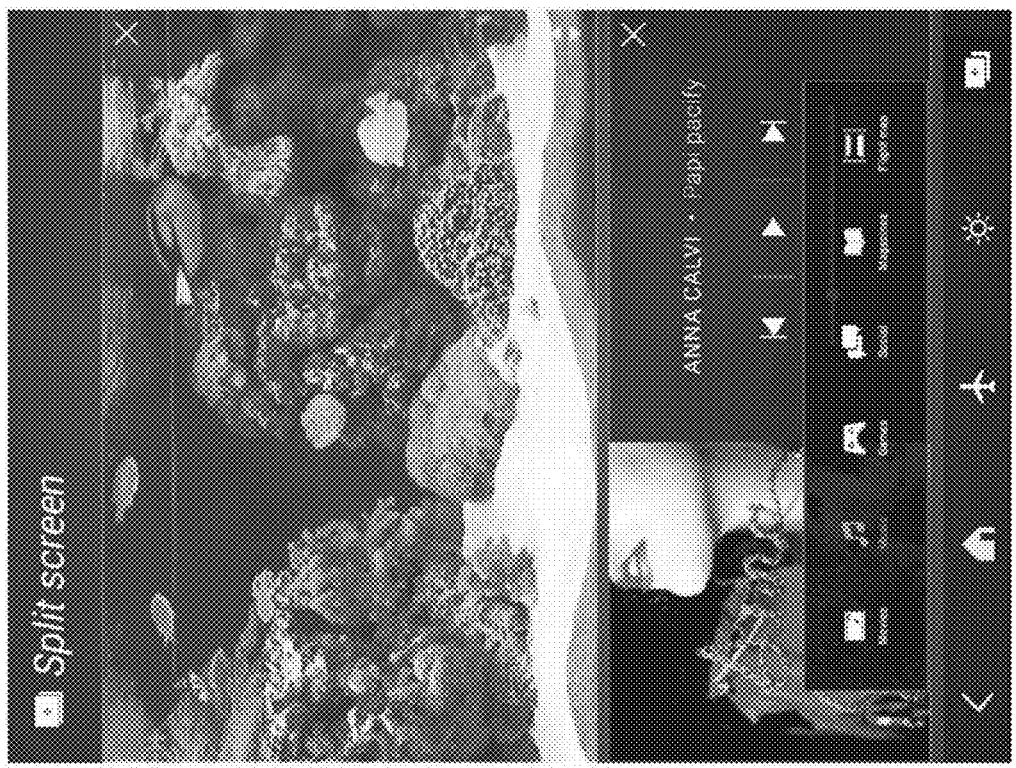
Figure 59:
Figure 62:
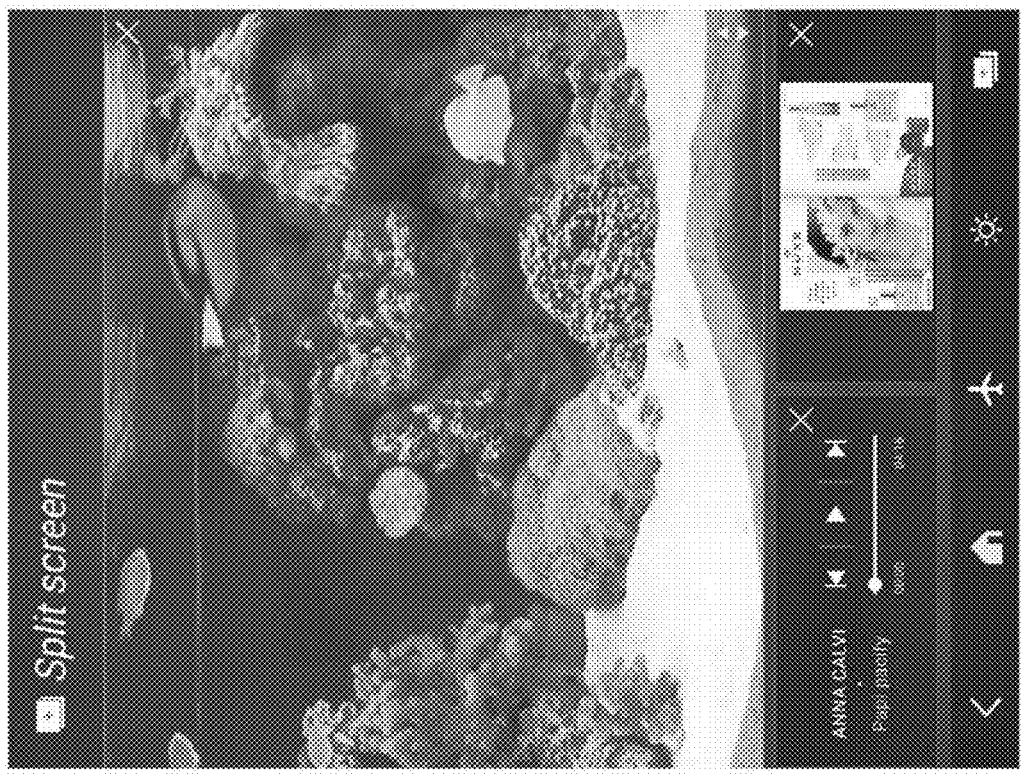
Figure 61:
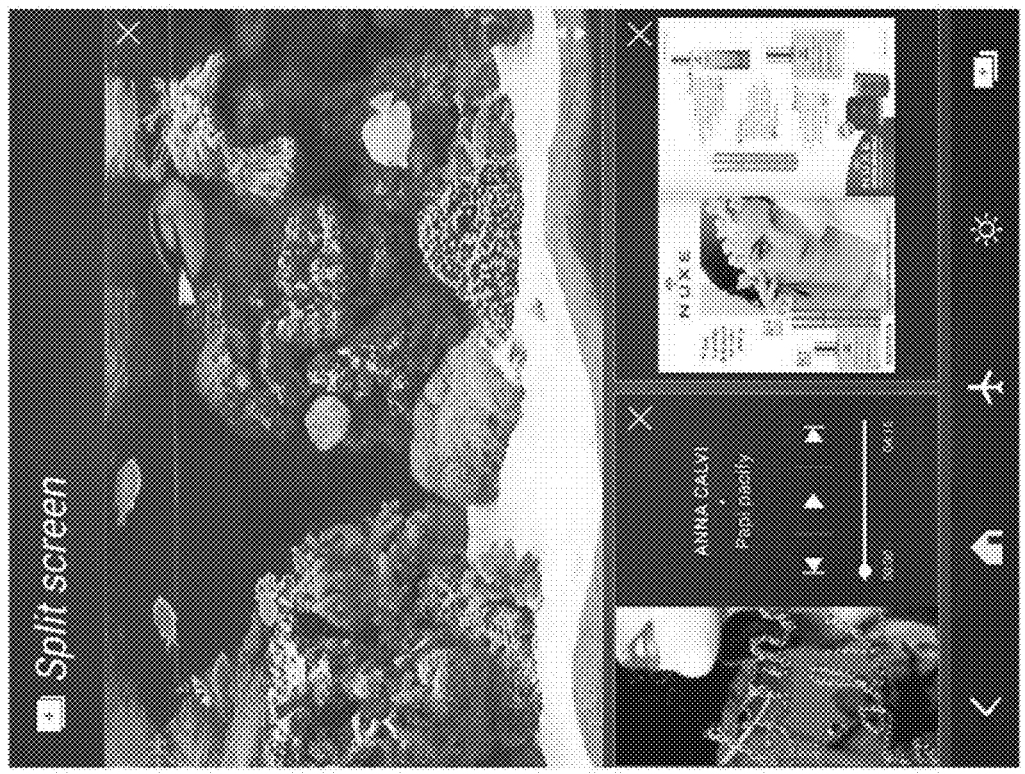
Figure 64:
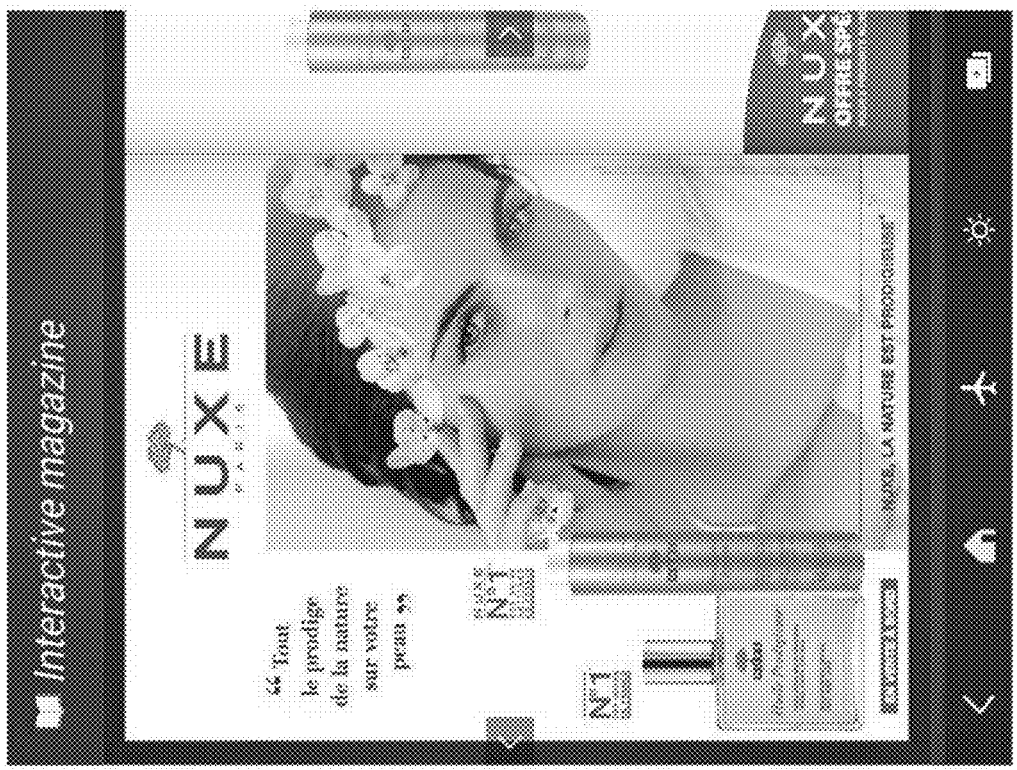
Figure 63:

FIGS. 57-64 illustrate various functionalities that are enhanced and/or made possible by the large format portrait display. Referring to FIGS. 57 and 58, a pop-up application panel may be accessed by selecting the split screen icon (e.g., the icon in the bottom right corner of the display). The application panel includes various icons to provide access to various applications that may be used simultaneously in a split screen or multi-window environment. For example, a music panel or window can be provided as shown in FIG. 59. The music window may appear below a top panel or window which is displaying another application as illustrated. Another application such as an interactive magazine can be selected from the application panel, with the interactive magazine application appearing in another window as shown in FIGS. 61 and 62 (this may be referred to as the "triple screen mode"). The location and size of the various windows may be manipulated as shown in FIGS. 62-64. For example, the size of the fish tank animation (top window) can be increased by using arrows on the display or by dragging a bottom portion of the widow downward. The interactive magazine application may be moved to the top or main window by, for example, double tapping on the interactive magazine. In this way, the interactive magazine is now a larger size and/or at eye level for easier reading. The interactive magazine application may be changed to full screen mode by, for example, double tapping on the interactive magazine again.

Figure 66:
Figure 65:
Figure 68:
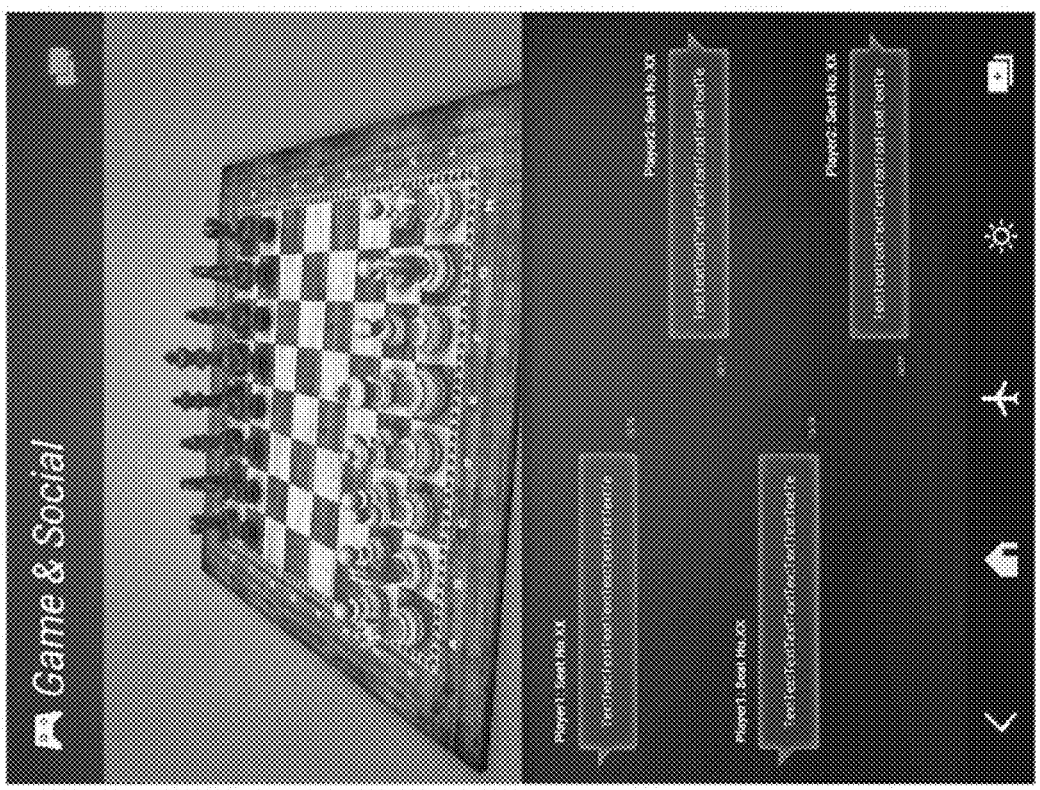
Figure 67:
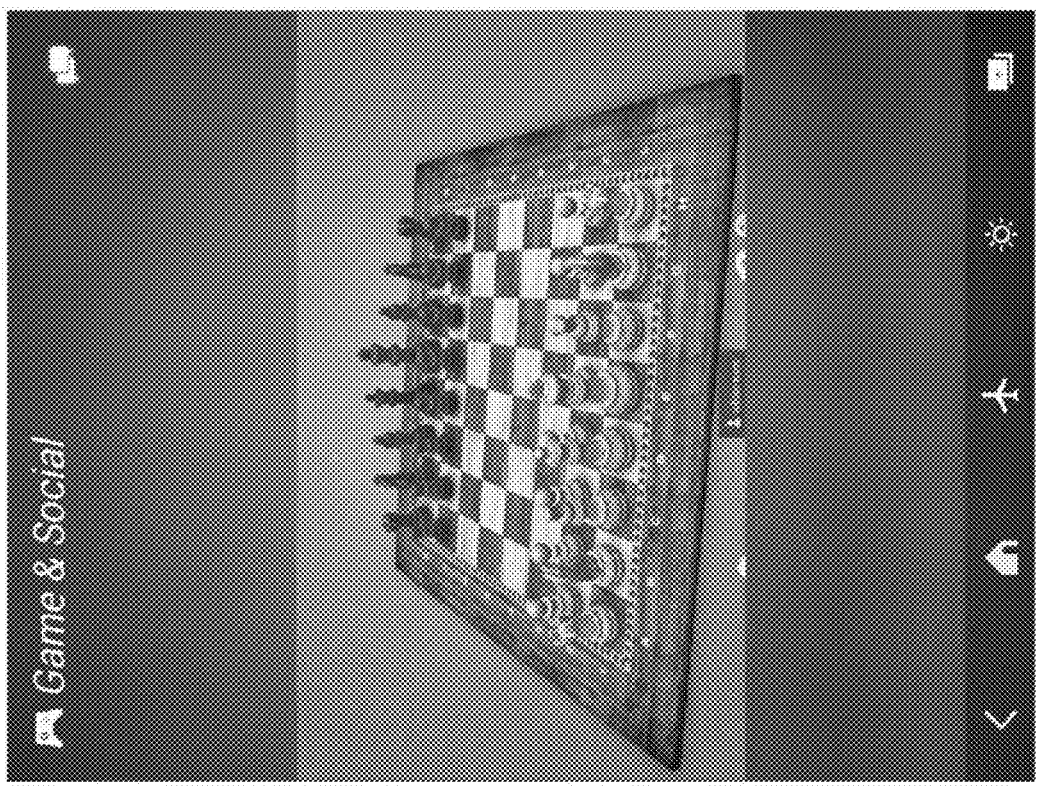

The game icon may be selected at the home screen (FIG. 20). The passenger is presented with a list of available games as illustrated in FIG. 65. The large format display in portrait configuration may be useful for games designed for vertical screens such as driving games (FIG. 66), golf games, pinball games, etc. As shown in FIGS. 67 and 68, a group chat feature may be activated by selecting a group chat icon (e.g., in the top right corner of the display). The chat may include other passengers playing the same game, for example.

Figure 70:
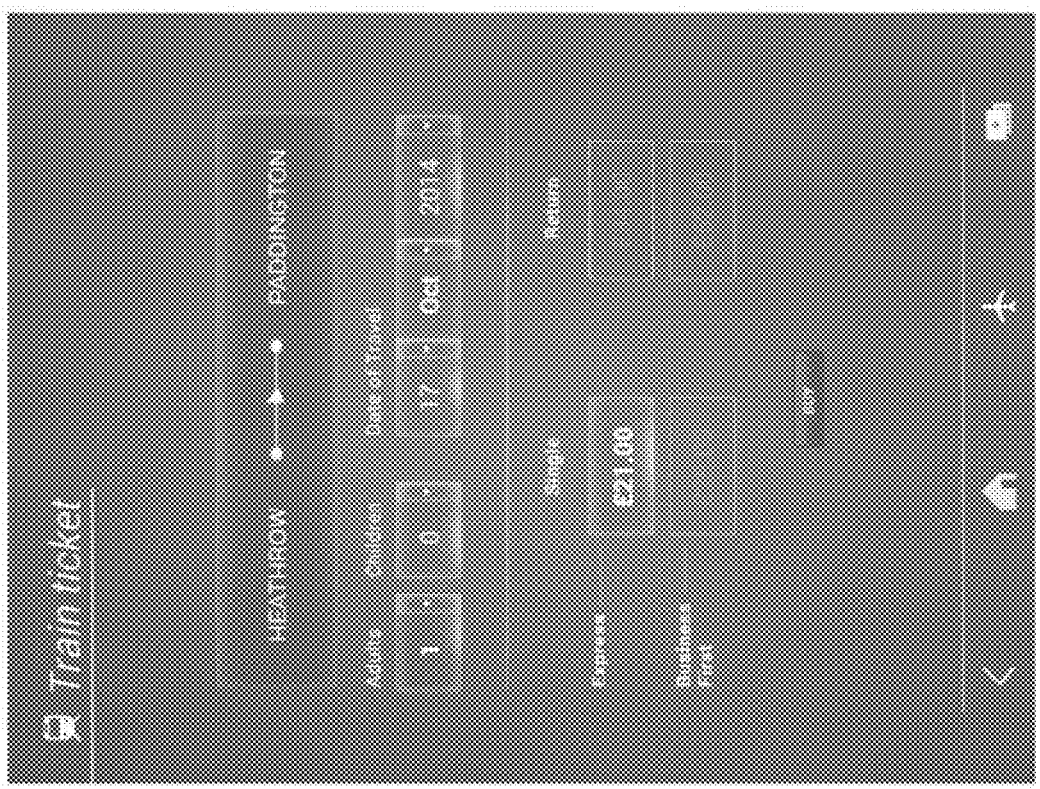
Figure 69:
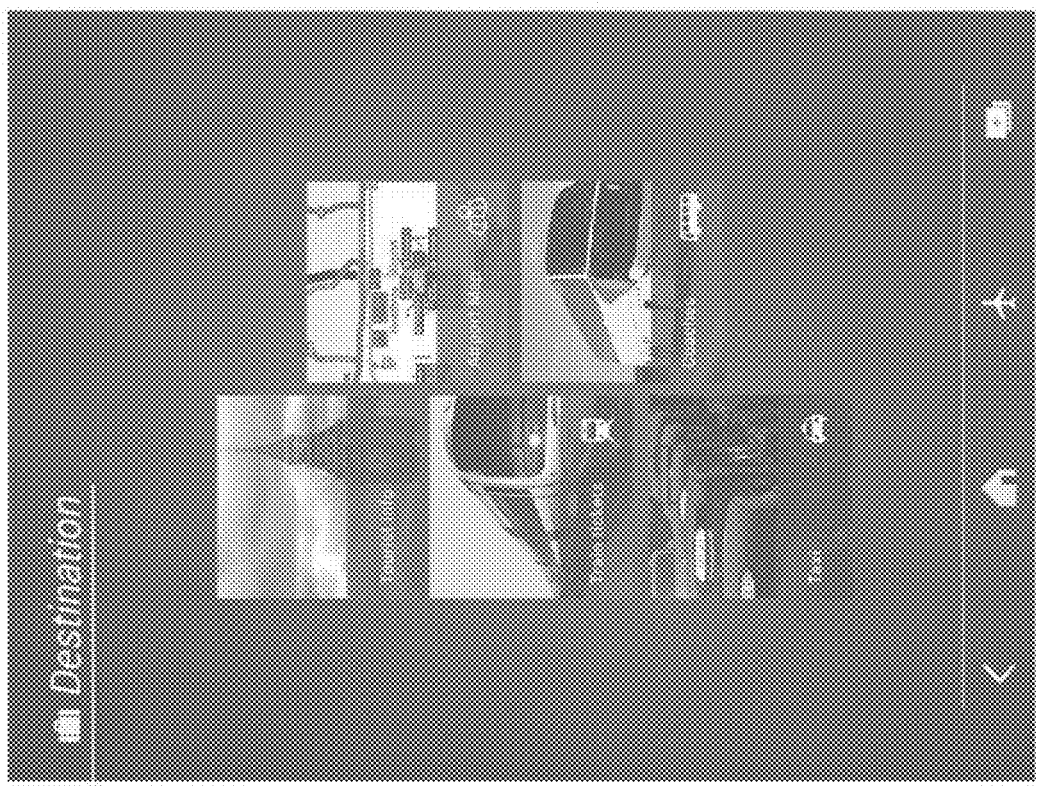
Figure 72:
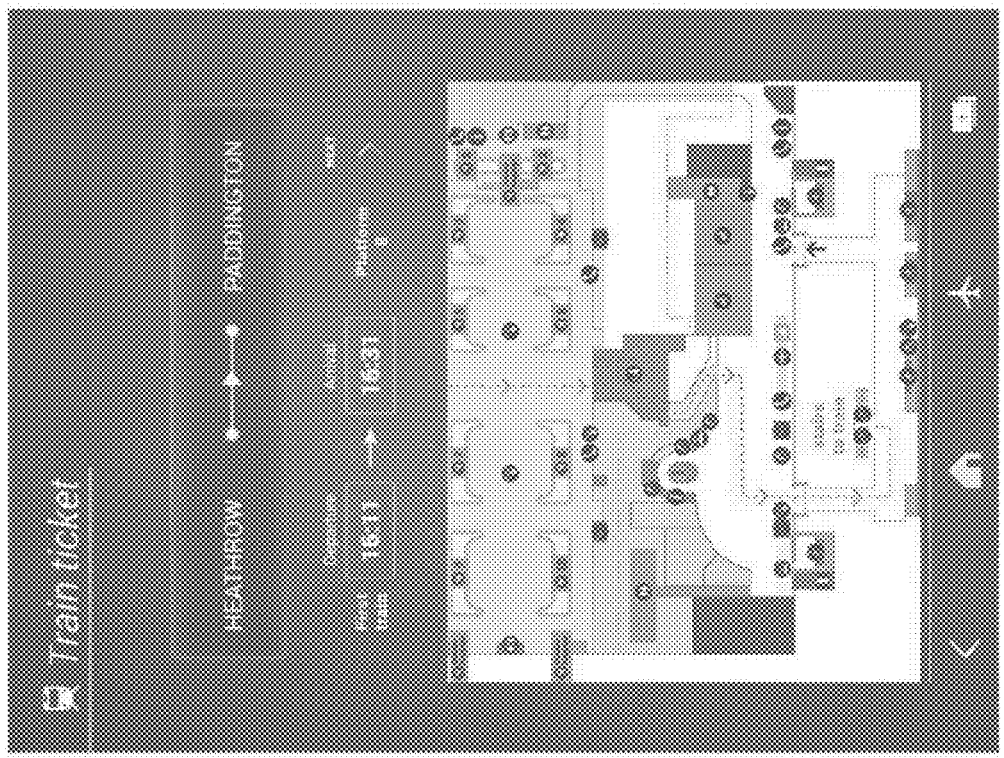
Figure 71:
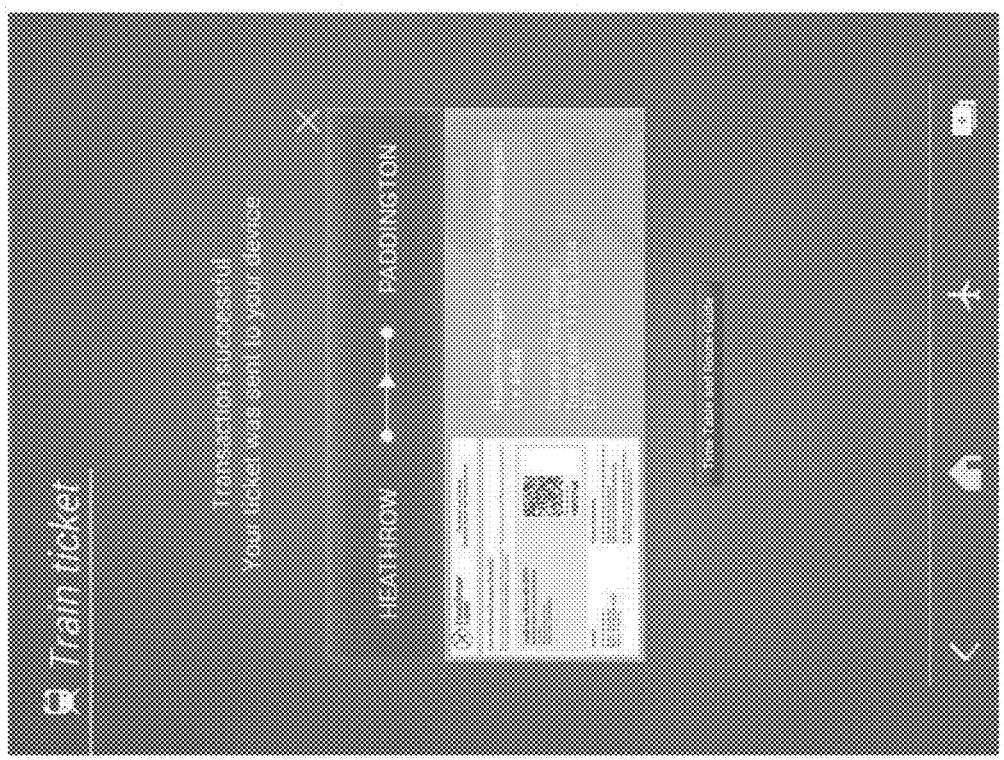

The destination icon may be selected at the home screen (FIG. 20). The passenger may select from tourist information, ticketing for various modes of transportation, and airport map features as illustrated in FIG. 69. The tourist information may include attractions and maps associated with the destination location. The passenger may select one of the attractions by clicking on a tile or a pin on the map. The passenger may then be given an opportunity to purchase a ticket (e.g., a train ticket) to that attraction (or some other selected location) as shown, for example, in FIGS. 70 and 71. The ticket departure time may be calculated based on the time remaining to disembark the aircraft and the estimated time to navigate through the airport to reach the departure location. Referring to FIG. 72, an airport map may highlight the recommended route through the airport to the departure location along with times associated with different segments of the route.

FIGS. 73-76 illustrate two video display units (such as the video display unit 100 described above) attached to adjacent seatbacks so that they face adjacent passengers in a following row of seats.

Figure 73:
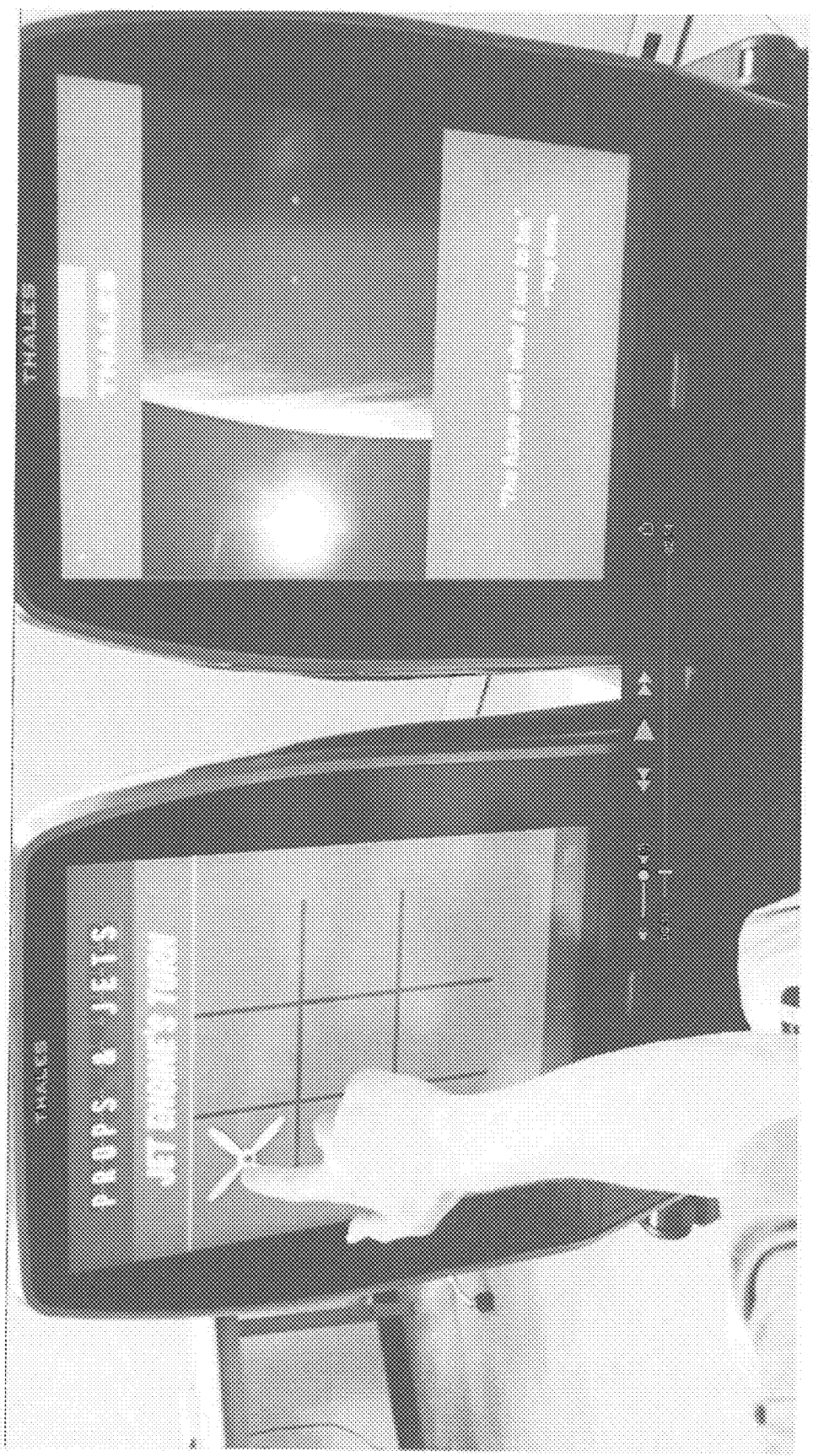
Figure 74:
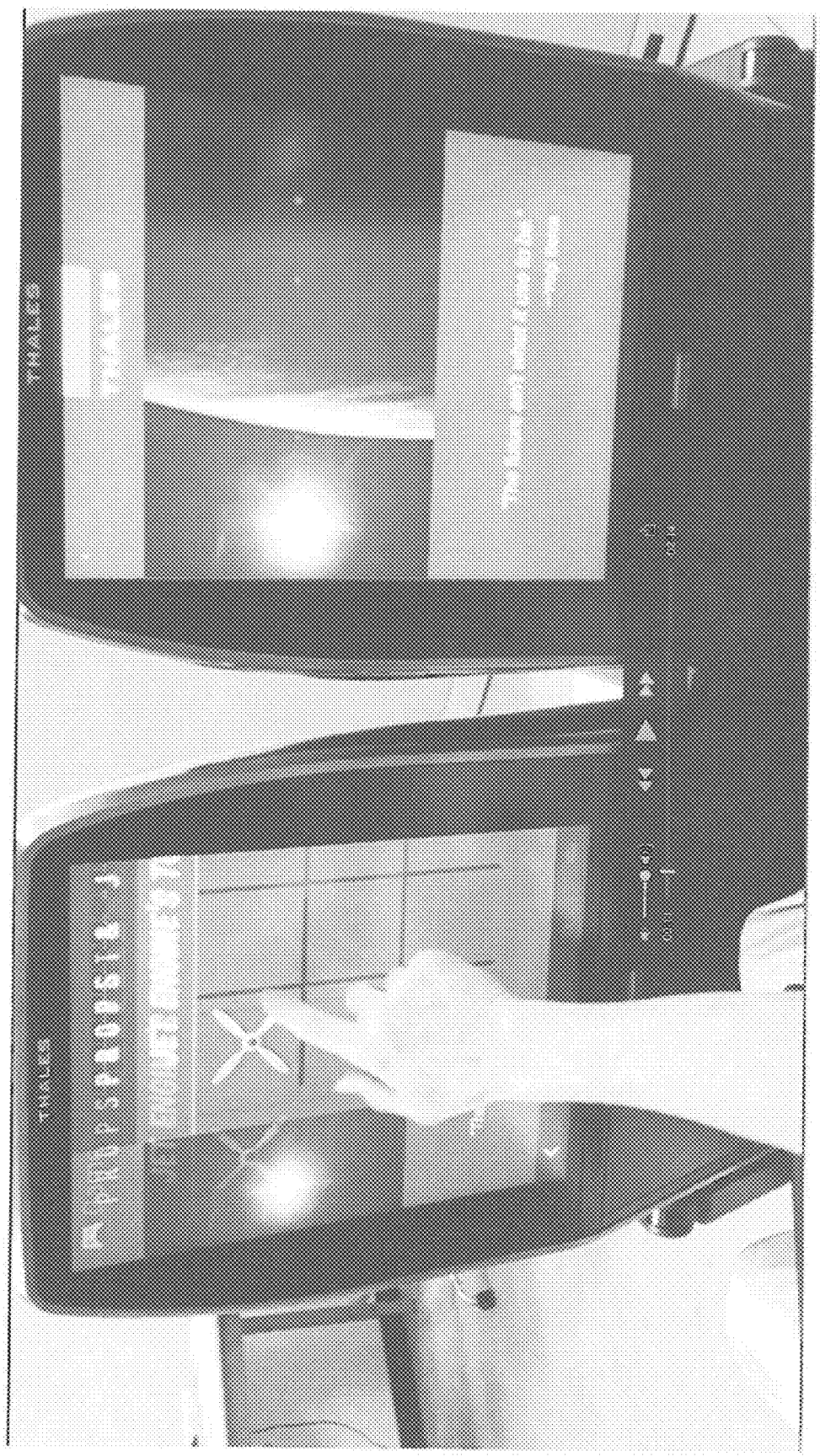
Figure 75:
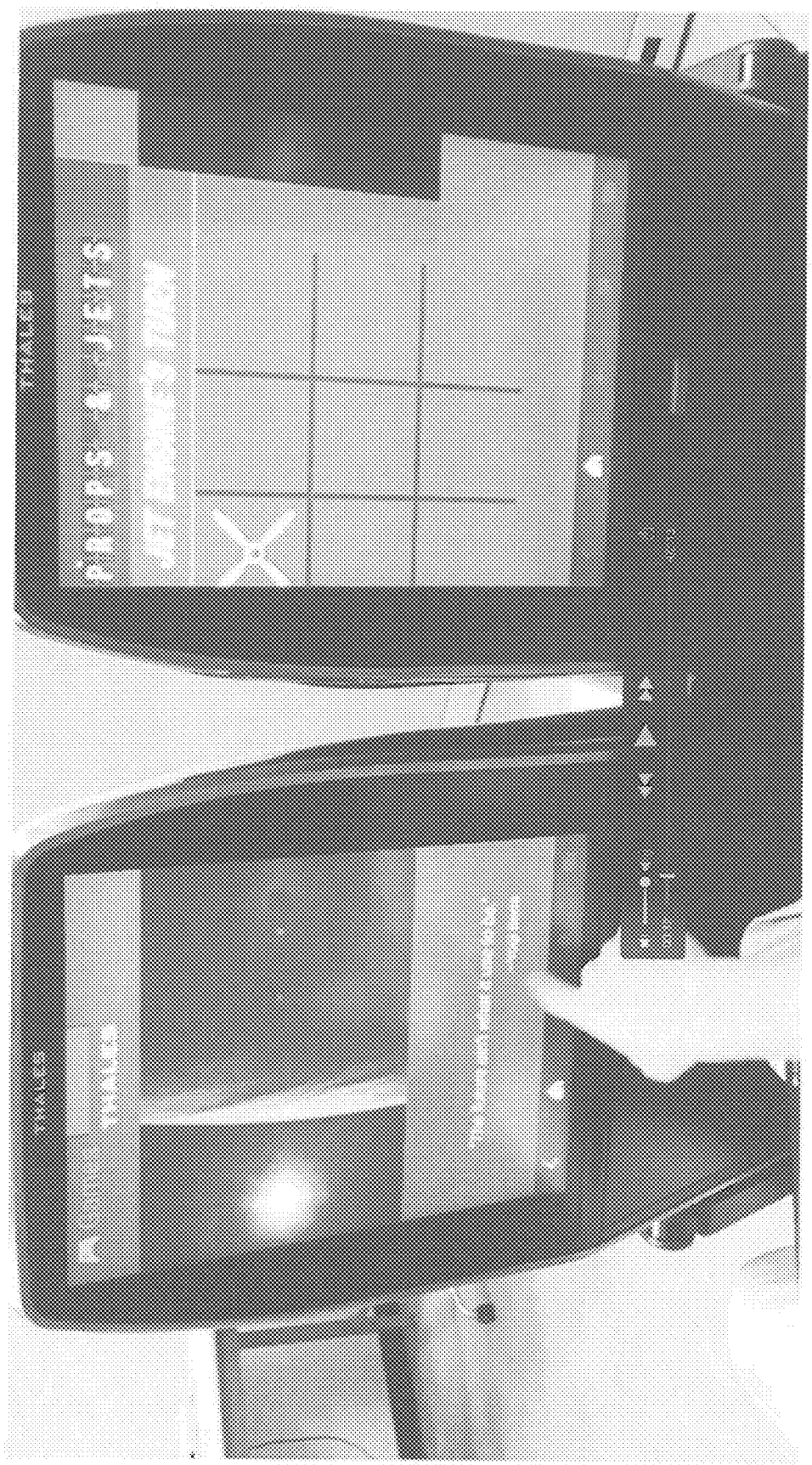
Figure 76:
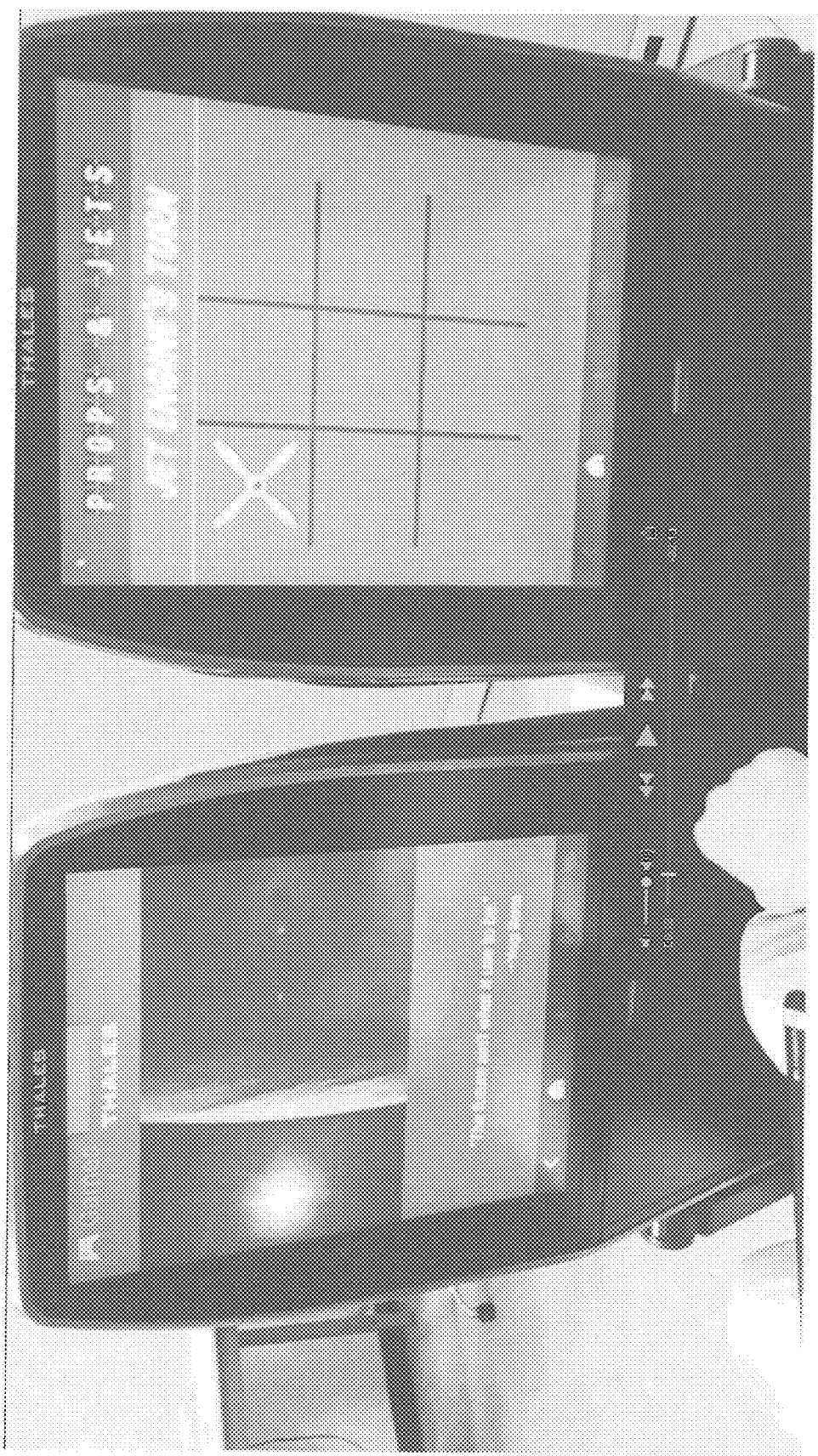

This configuration can provide enhanced multi-user experience by allowing interaction between neighboring passengers. FIGS. 73-76 illustrate a multi-user tic-tac-toe game. Referring to FIG. 73, a game board is displayed on a first video display unit facing a first passenger. The first passenger may select a position. Referring to FIGS. 74-76, the first passenger may swipe the board or display to "send" the board to a second, adjacent video display unit facing a second, adjacent passenger. The second passenger may then select a position and swipe the board or display to "send" the board to the first video display unit.

The adjacent passengers may use the video display units to play other games (e.g., chess) or to share other information or content. Other information or content may include the content described above in reference to FIGS. 16-72 (e.g., the passengers may share the photographs described above in reference to FIGS. 47-53). The passengers may share information or content such as movies or music. For example, the first passenger may "send" a movie or music selection displayed on the first video display unit to be displayed on the second video display unit. In this regard, the second passenger may not need to go through the steps to select the movie or music. The movie or music selection may then play simultaneously on the first and second video display units such that the first and second passengers can listen to and/or watch the movie or music at the same time.

Therefore, embodiments of the present invention allow for information to be communicated responsive to sliding or swiping the display screen of a seat video display unit (SVDU). The SVDU or the system including the SVDU is configured to interpret gestures on a respective SVDU to determine which additional SVDU(s) is to receive input.

In some embodiments, a coordinate system is associated with the display screen of a respective SVDU. The SVDU or the system including the SVDU is configured to interpret a direction of a gesture (e.g., sliding or swiping) relative to the coordinate system. The SVDU or the system including the SVDU is configured to look up in a table or other database one or more adjacent or nearby seats corresponding to the direction of the gesture. For example, the SVDU or the system including the SVDU may be configured to look up an identification or network address for an adjacent seat corresponding to the direction of the gesture and communicate the information using that identification or network address.

The coordinate system associated with the display screen of a respective SVDU may include a plurality of surrounding seats. For example, the coordinate system may be arranged such that sliding or swiping to the left or right results in information being communicated to the SVDU of the seat to the left or to the right, respectively (which may be a seat across an aisle). A user sliding or swiping up on the display screen may result in information being communicated to the SVDU of the seat in front of the user's seat. A user sliding or swiping down on the display screen may result in information being communicated to the SVDU of the seat behind the user's seat. A user sliding or swiping diagonally may result in information being communicated to the SVDU of the seat to the left or right and in front of or behind the user's seat.

In some embodiments, the system may be arranged such that sliding or swiping the display results in the information being communicated to more than one SVDU of adjacent or nearby seats (e.g., content or information may be communicated to all seats to the right responsive to sliding or swiping to the right). The system may additionally or alternatively be arranged such that sliding or swiping more than once in succession results in communication of information to multiple seats in the coordinate system corresponding to the directions of the sliding or swiping. By way of example, sliding or swiping right twice in succession may result in the content or information being communicated to the two adjacent seats to the right. By way of further example, sliding or swiping up and then left may result in the content or information being communicated to the seat in front and the seat to the left.

Figure 77:
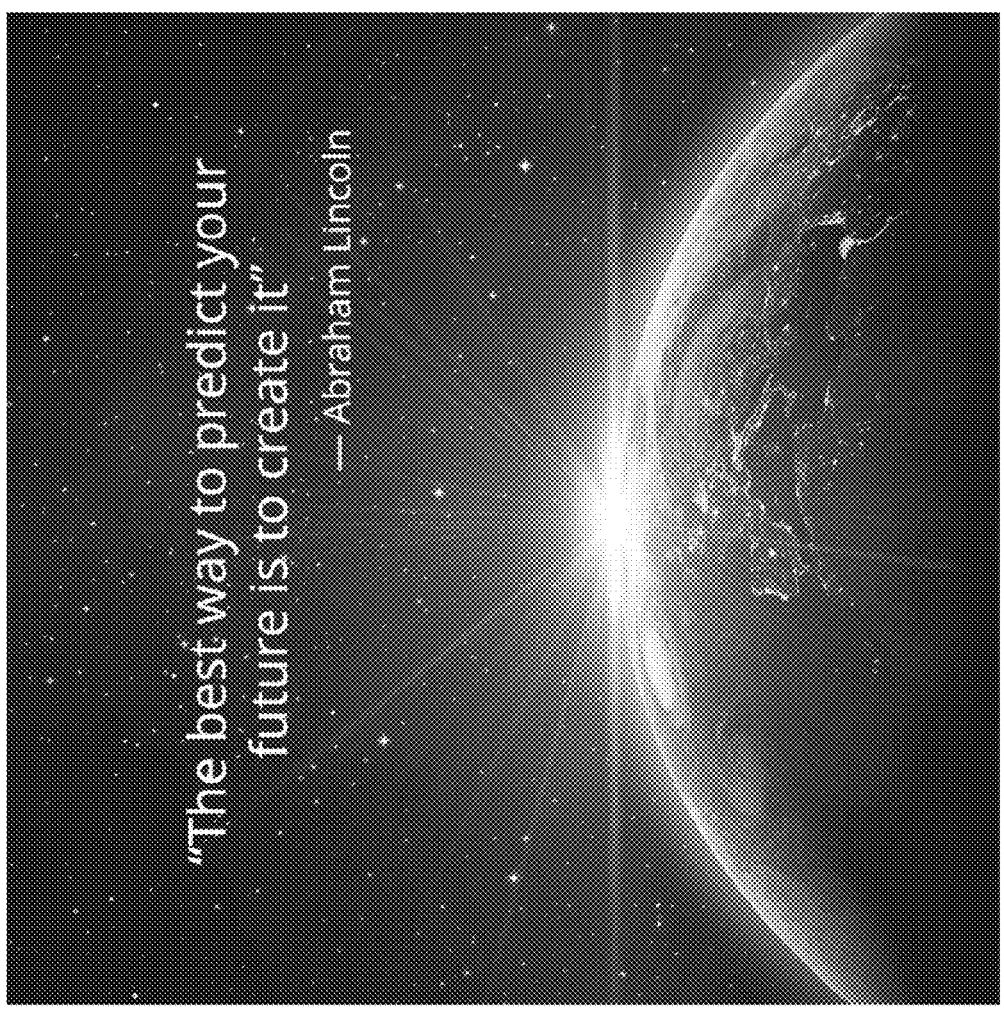

Additional embodiments that provide enhanced user experience are illustrated in FIGS. 77-111. An idle screen or screen saver such as the one illustrated in FIG. 77 may be used. A user may touch this screen to proceed to the main menu screen described below. The system may return to the idle screen after some predetermined time has elapsed without any activity (e.g., after five minutes without user interaction). The predetermined time may be configurable.

Figure 78:
Figure 79:
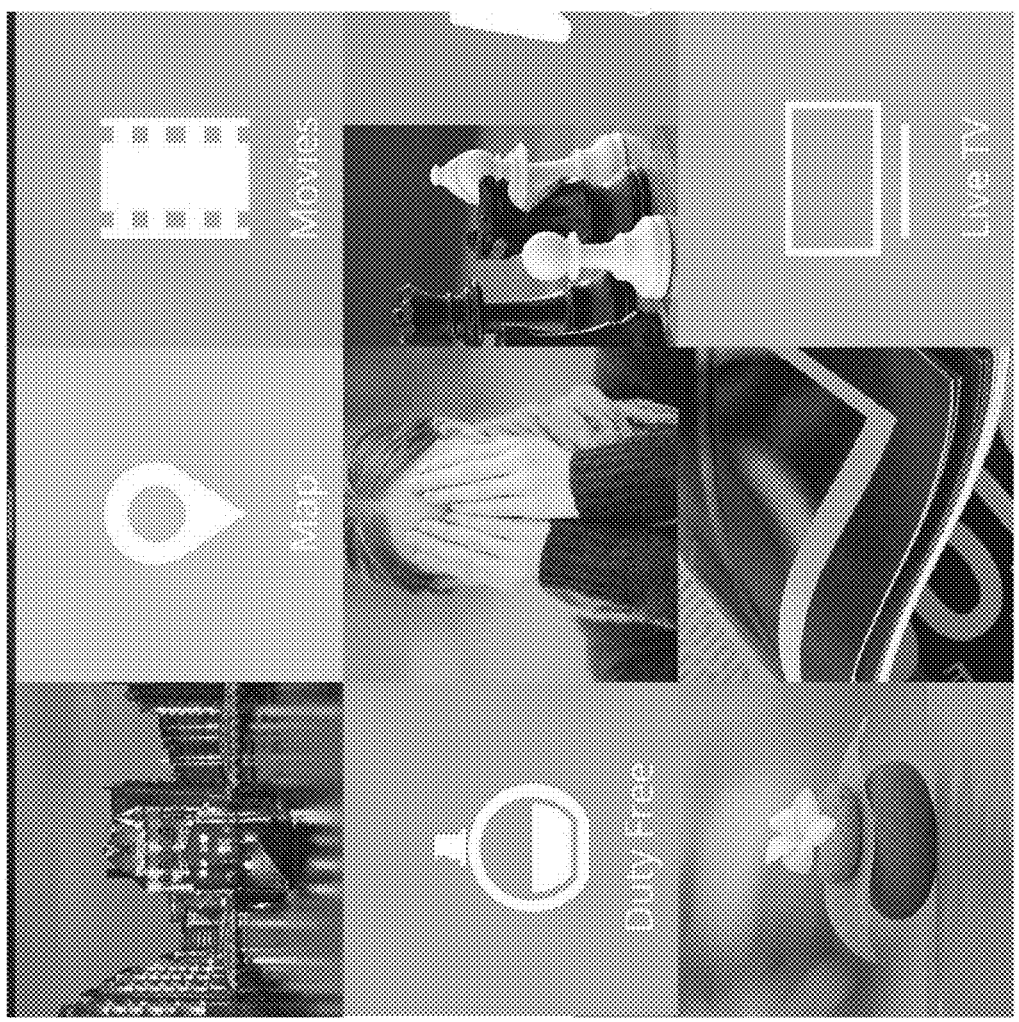
Figure 80:
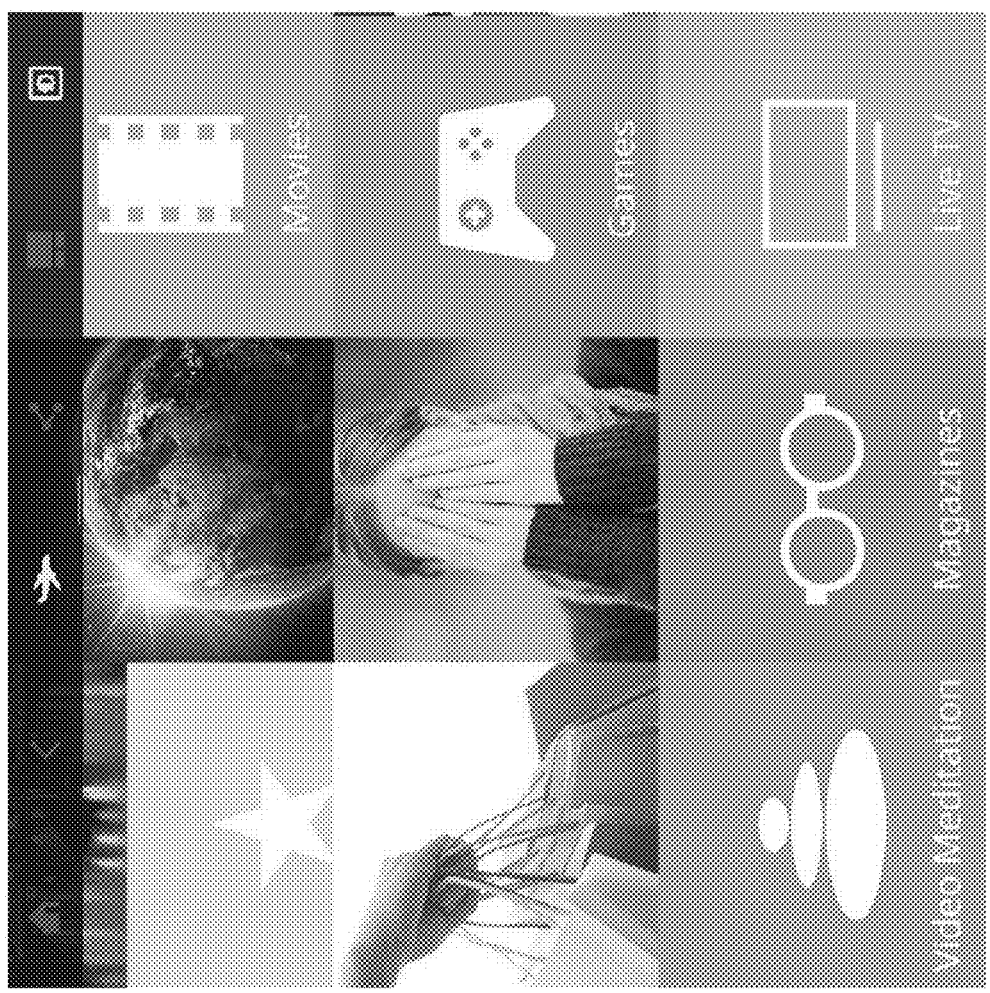
Figure 81:
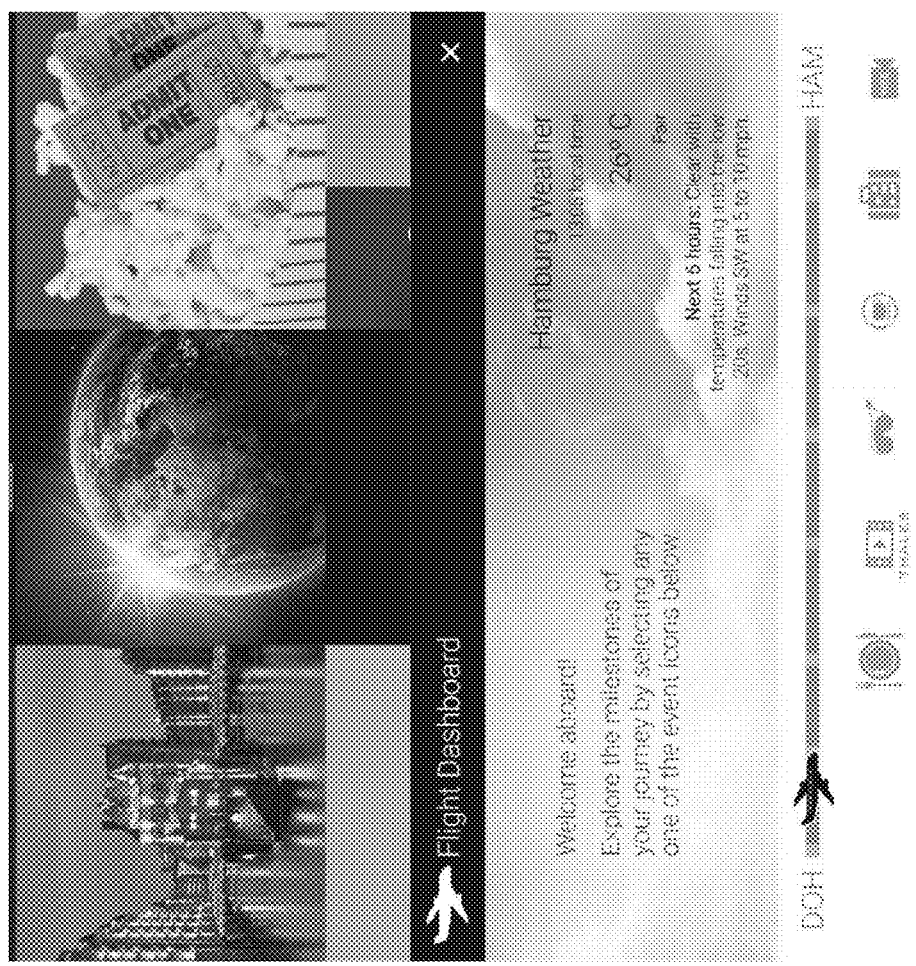

The main menu screen is illustrated in FIGS. 78-80. The main menu screen features large tiles that can be selected for various applications. The tiles may be animated and may cycle between a photograph and an icon (e.g., in random sequence) as illustrated in FIGS. 78-80. A menu bar is in an active state in FIGS. 78 and 79 and in an active state in FIG. 80. A user may place the menu bar in the active state by, for example, sliding from the top of the screen downward.

The menu bar (also referred to herein as the global menu bar) provides a series of icons that allow the user to take certain actions. For example, as illustrated in FIG. 80, the menu bar from left-to-right includes a home icon (e.g., to take the user to the main menu screen), a back icon, a flight dashboard icon, a social share icon, a split screen icon, and a screen brightness icon.

Selecting the flight dashboard icon activates a flight dashboard application as illustrated in 81-90. Specifically, selecting the flight dashboard icon may cause the flight dashboard to scroll upward from the bottom of the screen. A user may close the flight dashboard by selecting the "X" in the upper right of the dashboard. The aircraft icon illustrates the flight progress on a flight bar. A series of icons appear below the flight bar. A user may select the various icons to look ahead to the flight's major events.

Figure 82:
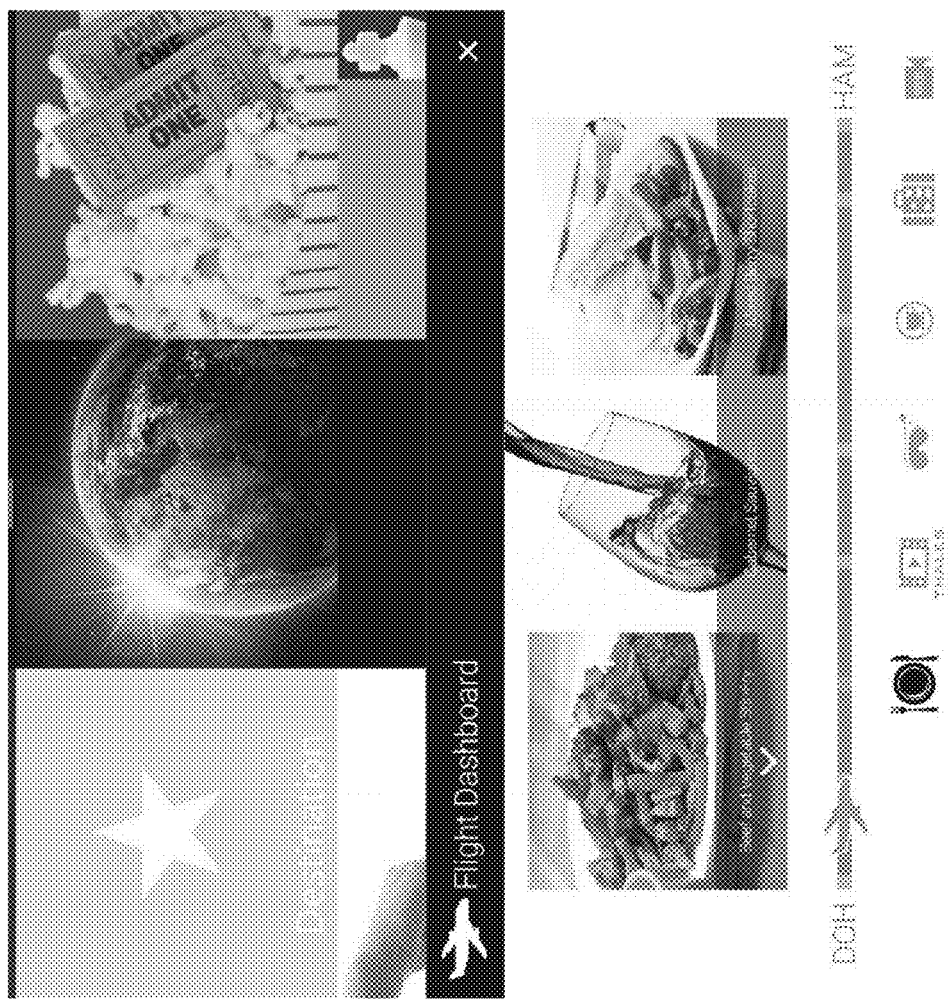
Figure 83:
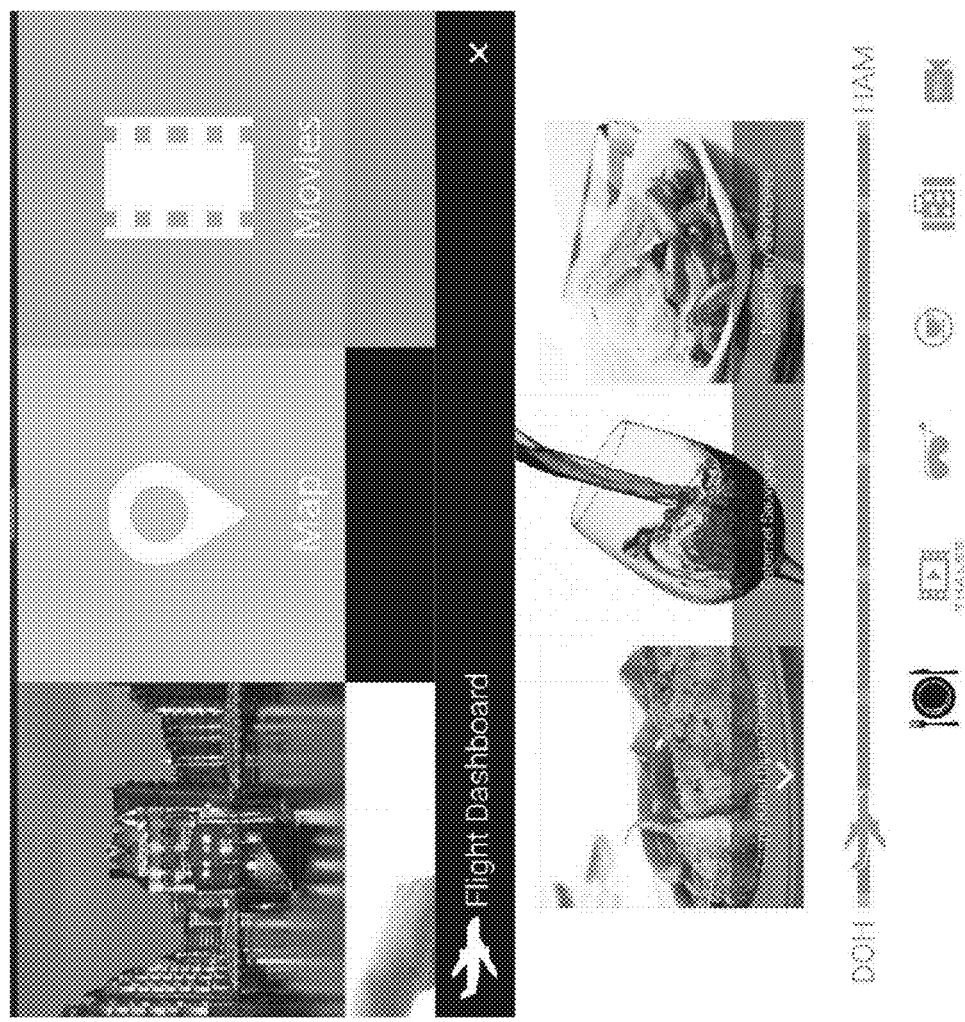
Figure 84:

For example, referring to FIGS. 82-84, a user may select the dinner icon to present the user with available dinner options. The user may scroll through various options such as dinner entrees and make a selection.

Figure 85:
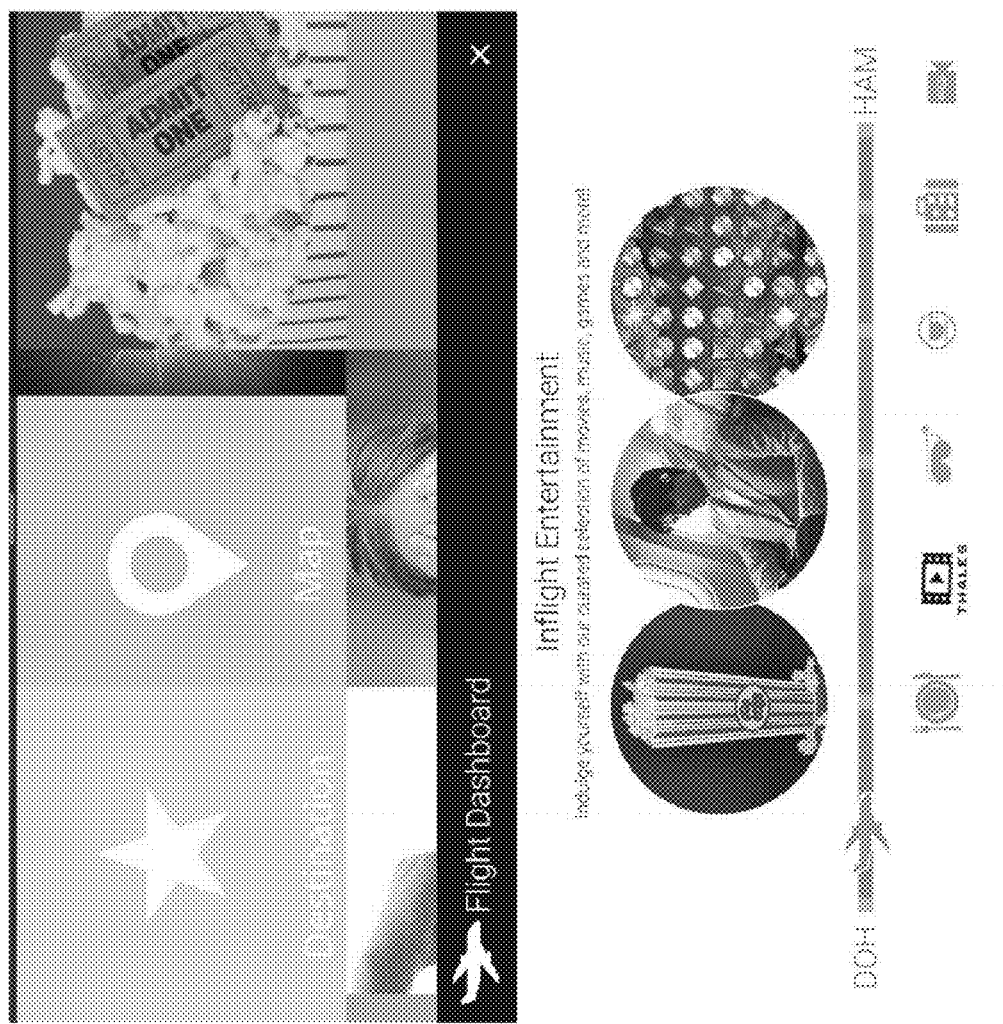

The in flight entertainment icon may be selected as illustrated in FIG. 85. A user may then select from various icons to display available movies, music and games.

Figure 86:
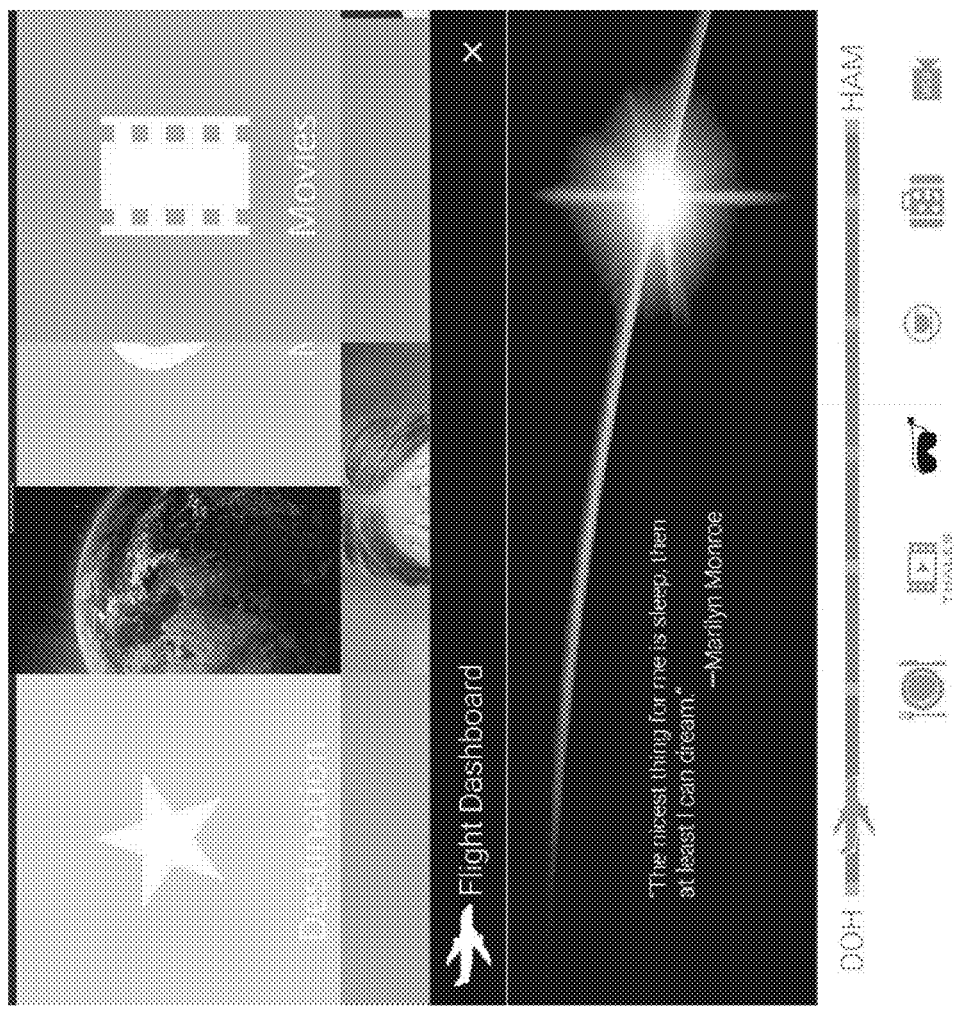

Referring to FIG. 86, a user may select the sleep icon to learn when the aircraft's interior lights will be dimmed for sleep mode.

Figure 87:
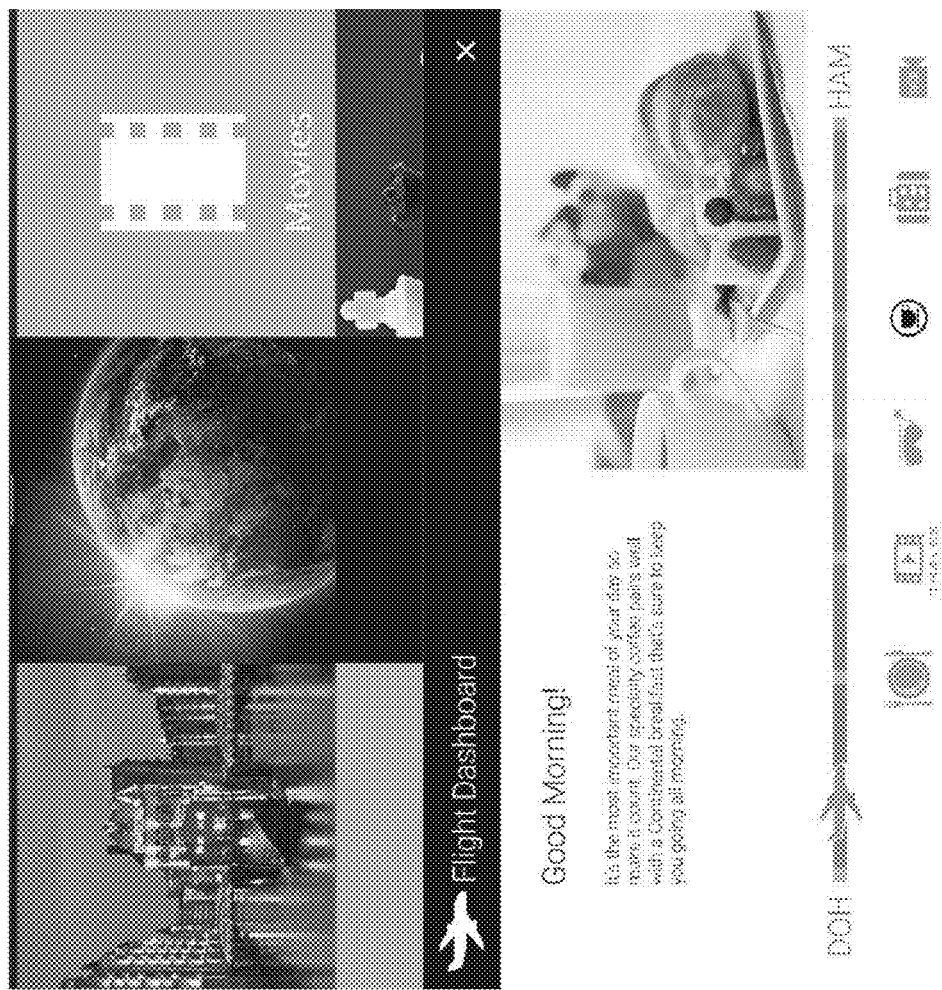

Referring to FIG. 87, a user may select the breakfast icon to learn when breakfast will be available during the flight. The user may be informed of the breakfast item(s) that will be served and/or may be able to select from a plurality of options.

Figure 88:
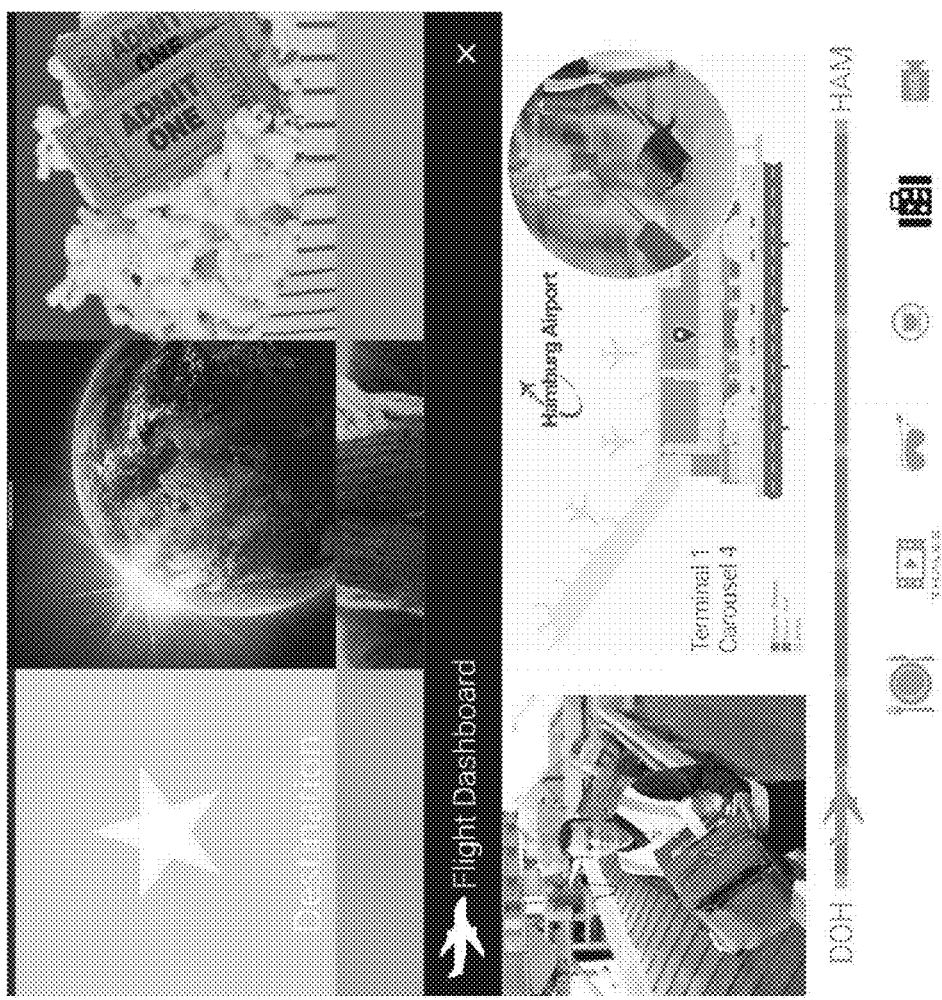

A user may select the luggage icon as illustrated in FIG. 88. The location where the luggage will arrive after the flight is displayed (an airport map may also be displayed).

Figure 89:
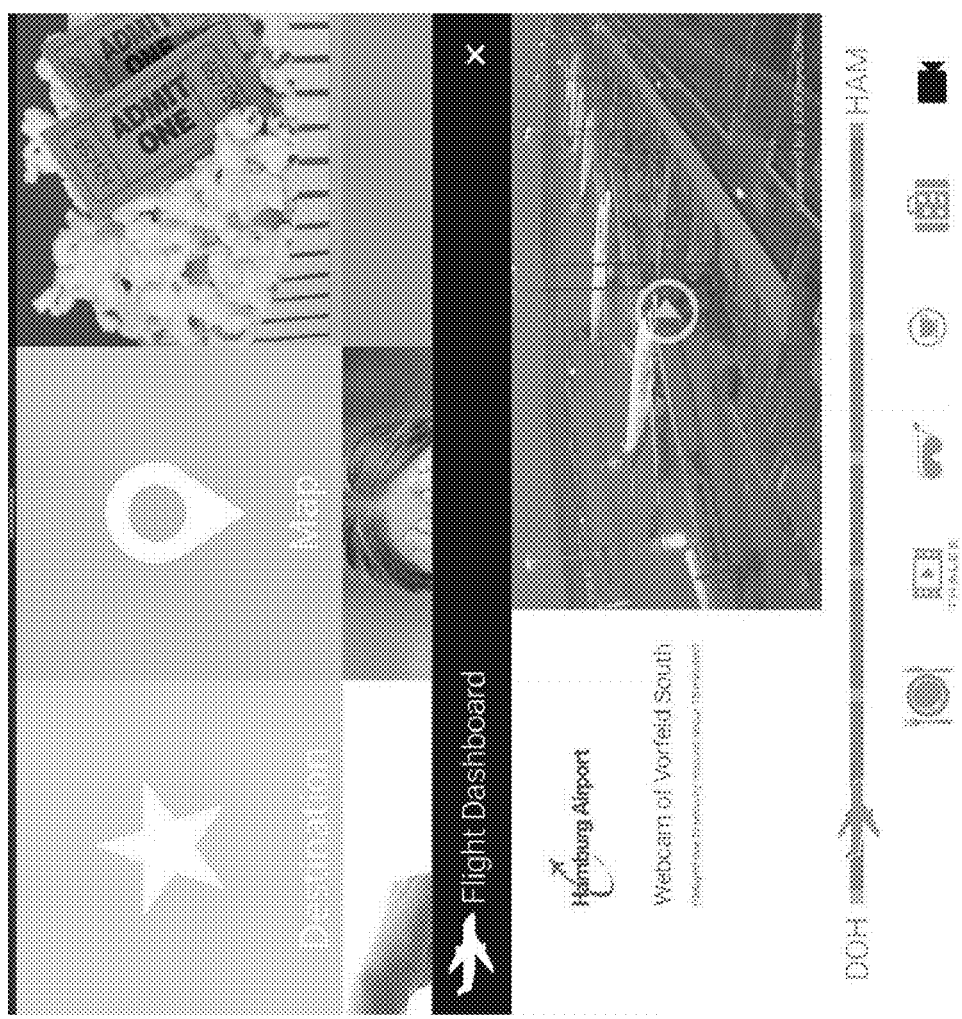
Figure 90:
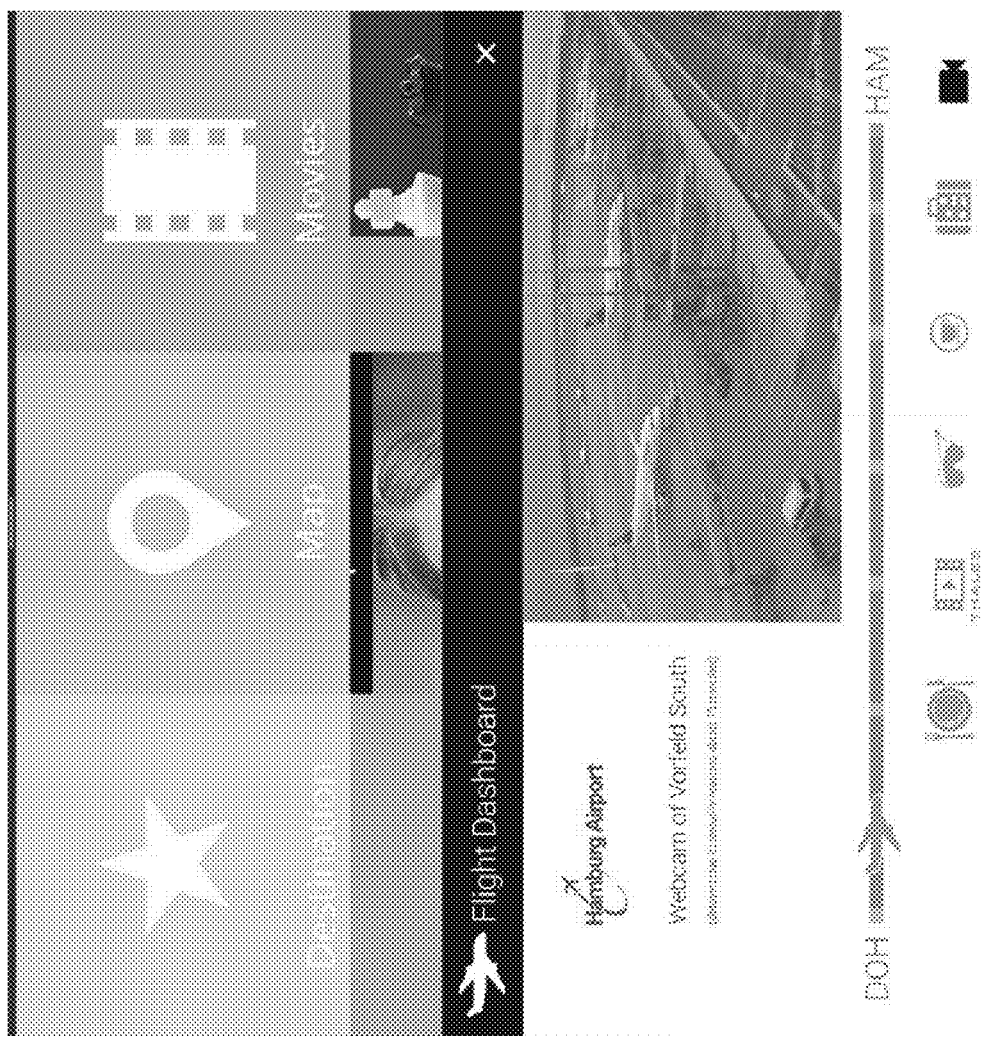

Referring to FIGS. 89 and 90, a user may select the webcam icon to view a live feed of the airport (e.g., at the destination airport gate).

Figure 91:
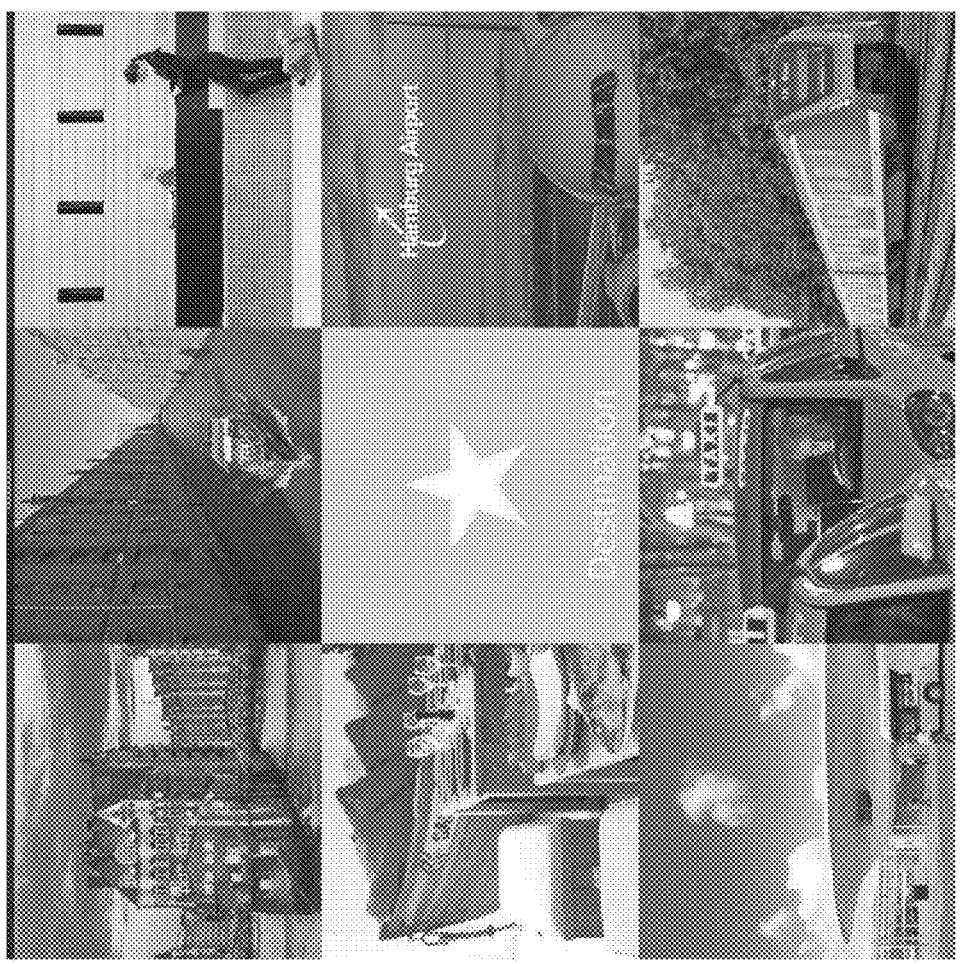
Figure 92:

A user may select the destination icon from the main menu to be presented with the submenu shown in FIG. 91. A user may then select an attractions icon to view the attractions submenu shown in FIG. 92. The top portion of the screen may display graphical icons and the bottom portion of the screen may display a map with selectable pins. The pins may be associated with the graphical icons.

Figure 93:
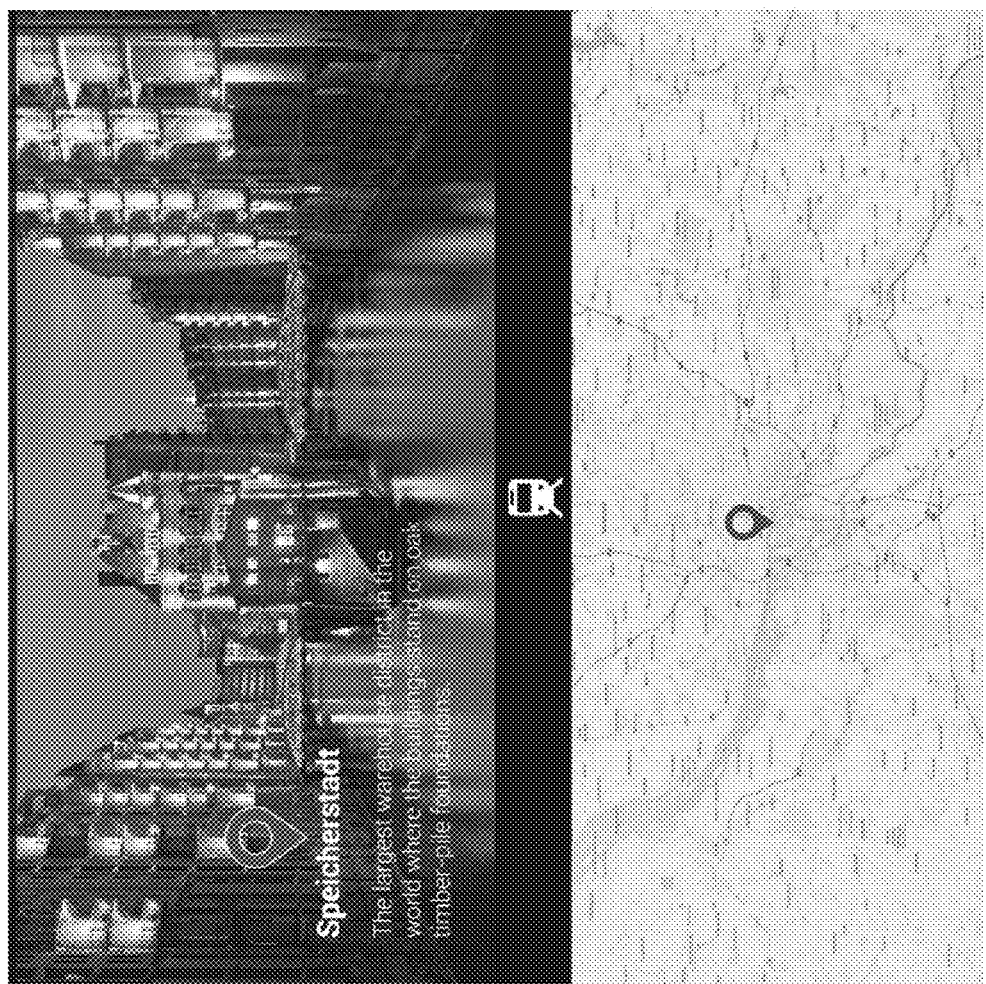
Figure 94:
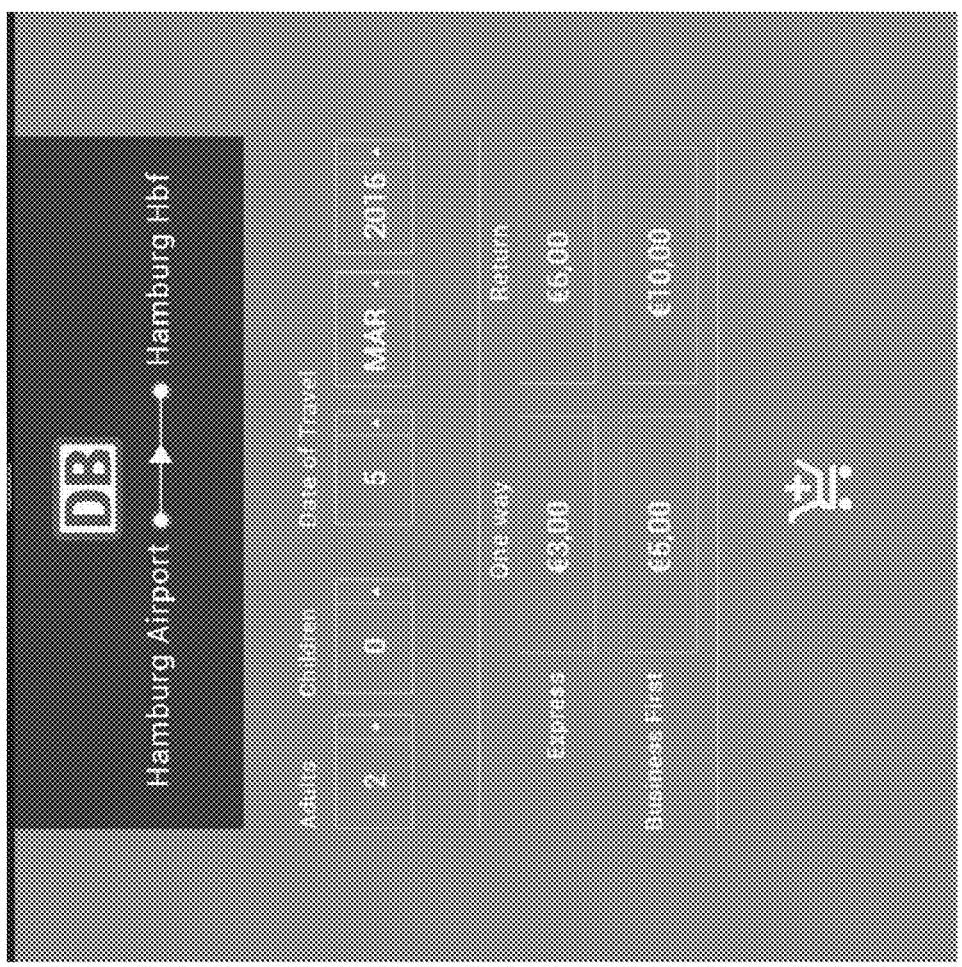
Figure 95:
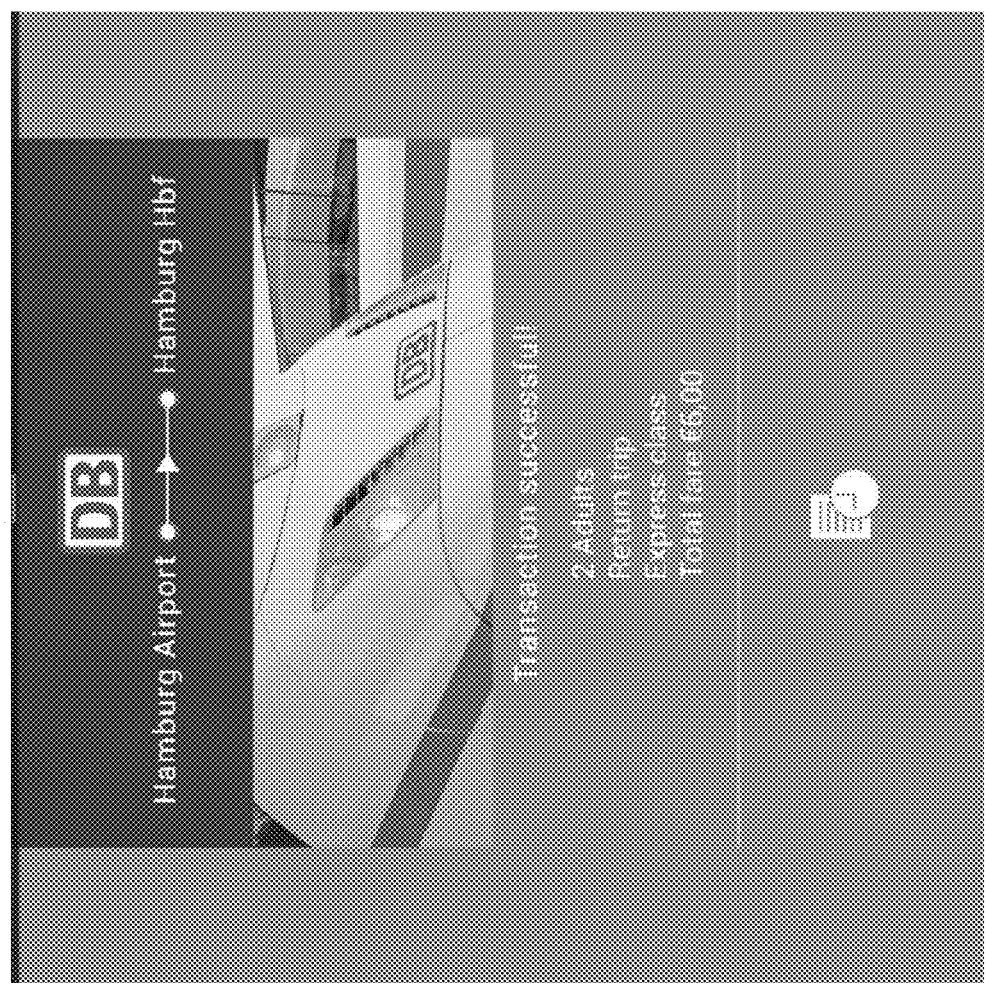

Referring to FIG. 93, a user may select one of the attraction icons or pins to view information about that particular attraction. The user can select the train icon to purchase a train ticket (e.g., from the destination airport to the attraction). FIGS. 94 and 95 illustrate the user-selectable options for buying the ticket.

Figure 96:
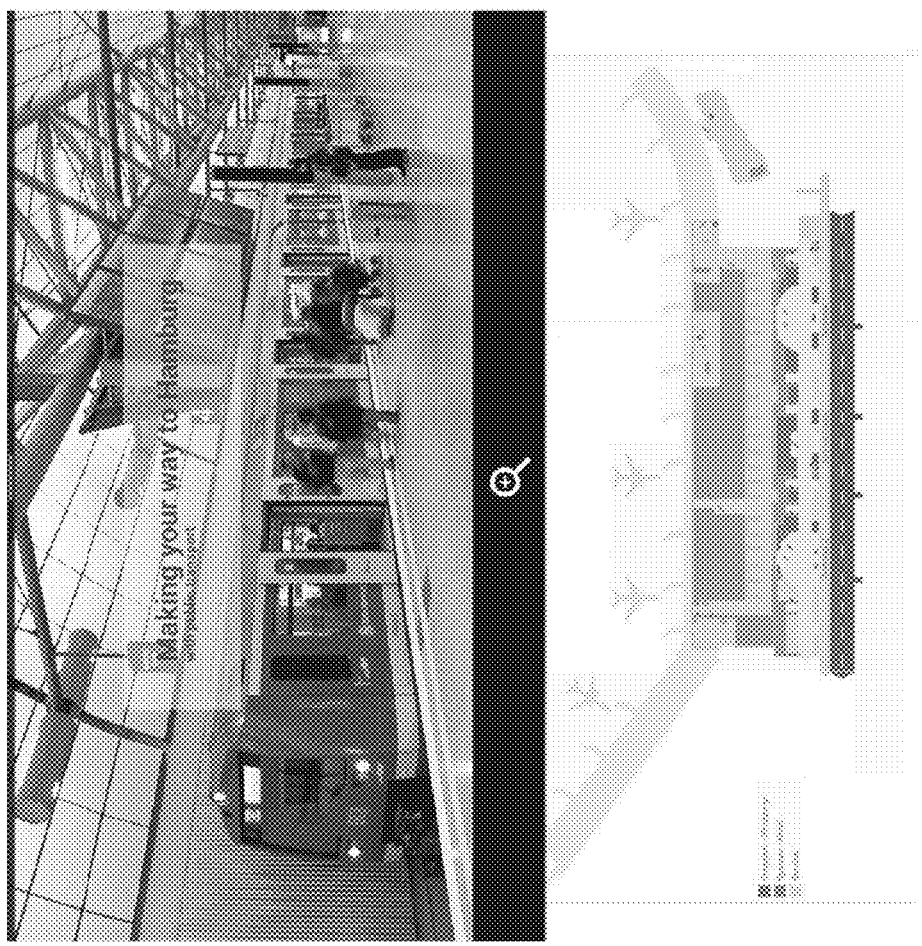
Figure 97:
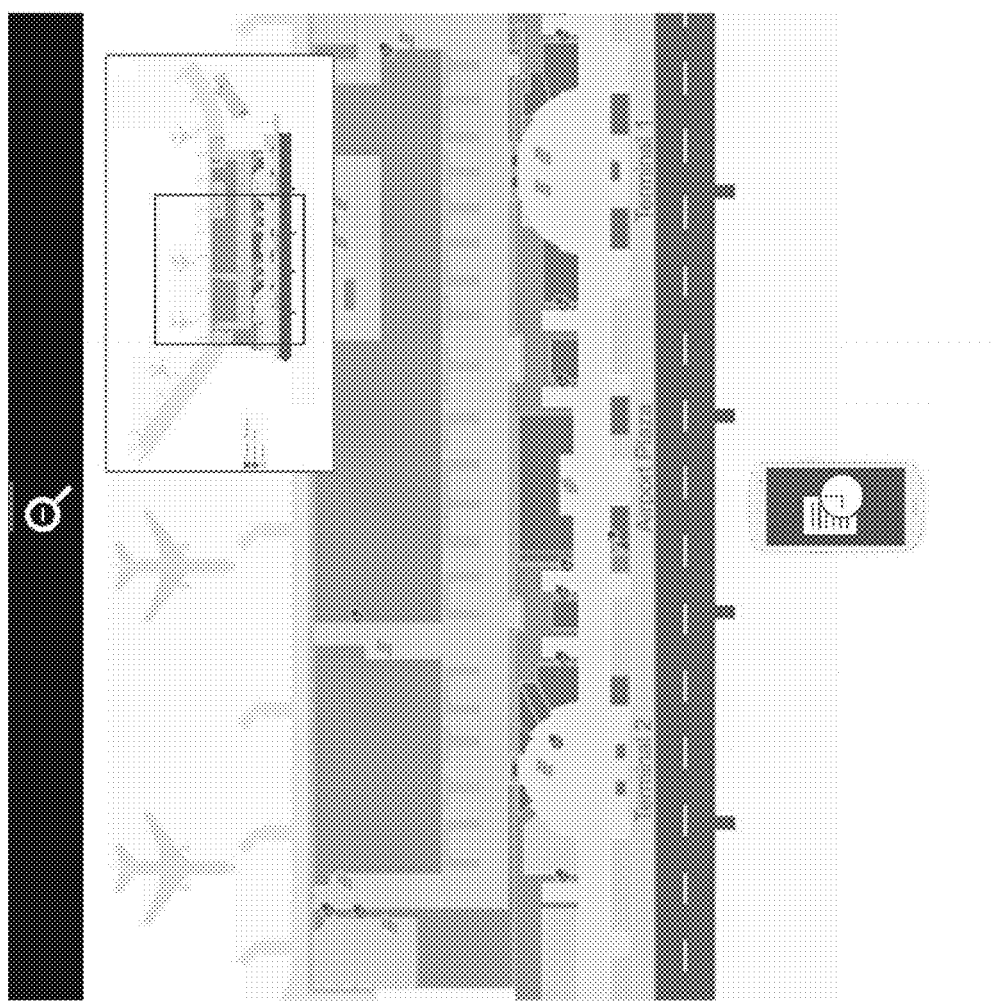

From the main menu (FIG. 78), the destination icon may be selected to arrive at the screen illustrated in FIG. 96. The screen shows a photograph of the train platform (e.g., at the destination airport) and a zoomable map that illustrates how to get to the train platform. A user may zoom in on the map such that the map fills up a substantial portion of the screen as illustrated in FIG. 97. A zoom out icon at the top of the screen takes the user back to the previous screen. A mobile phone icon is selectable to allow a user to download the train schedule and/or timetable.

Figure 98:
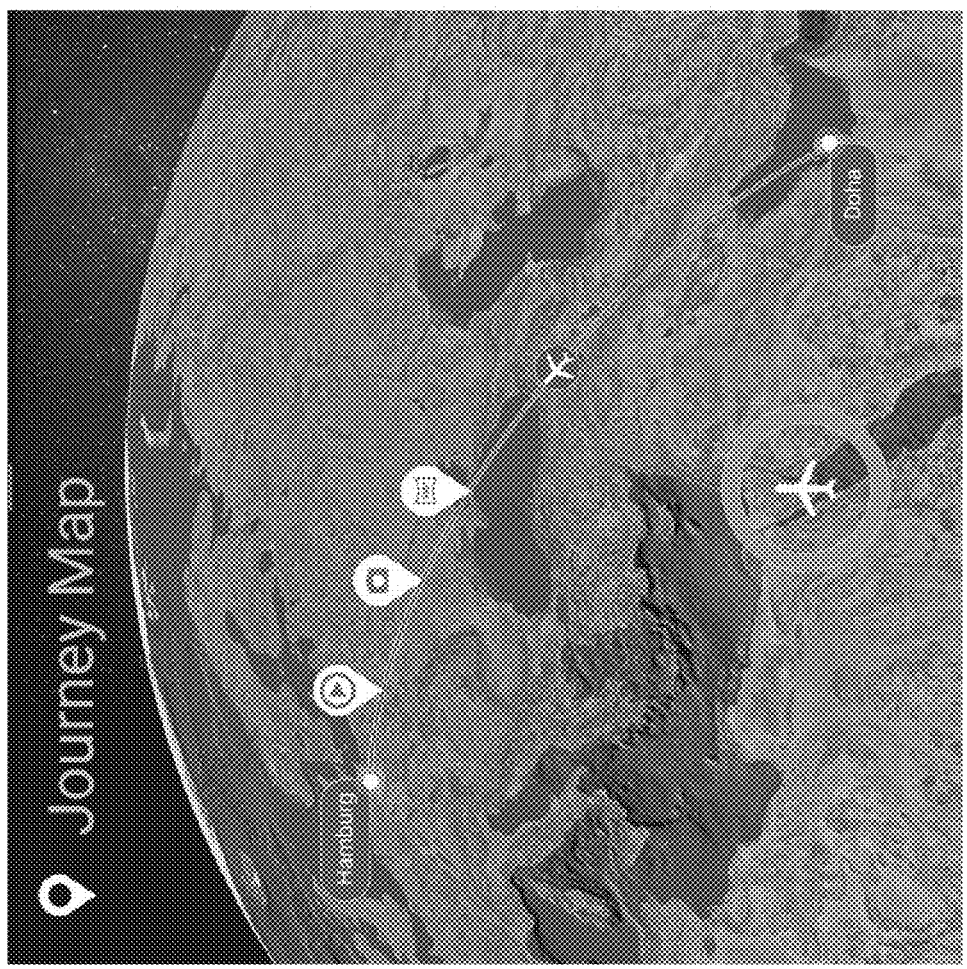

From the main menu (FIG. 78), the journey map icon may be selected to arrive at the screen illustrated in FIG. 98. The screen fills the display with a map showing the current flight path. The aircraft's position is shown along with one or more points of interest. Three points of interest are indicated by flags in FIG. 98. The flag includes a media icon to indicate the type of media (e.g., video, photographs or panorama). The circled aircraft icon can be selected to allow a user to view outside the aircraft as will be described in more detail below.

Figure 99:
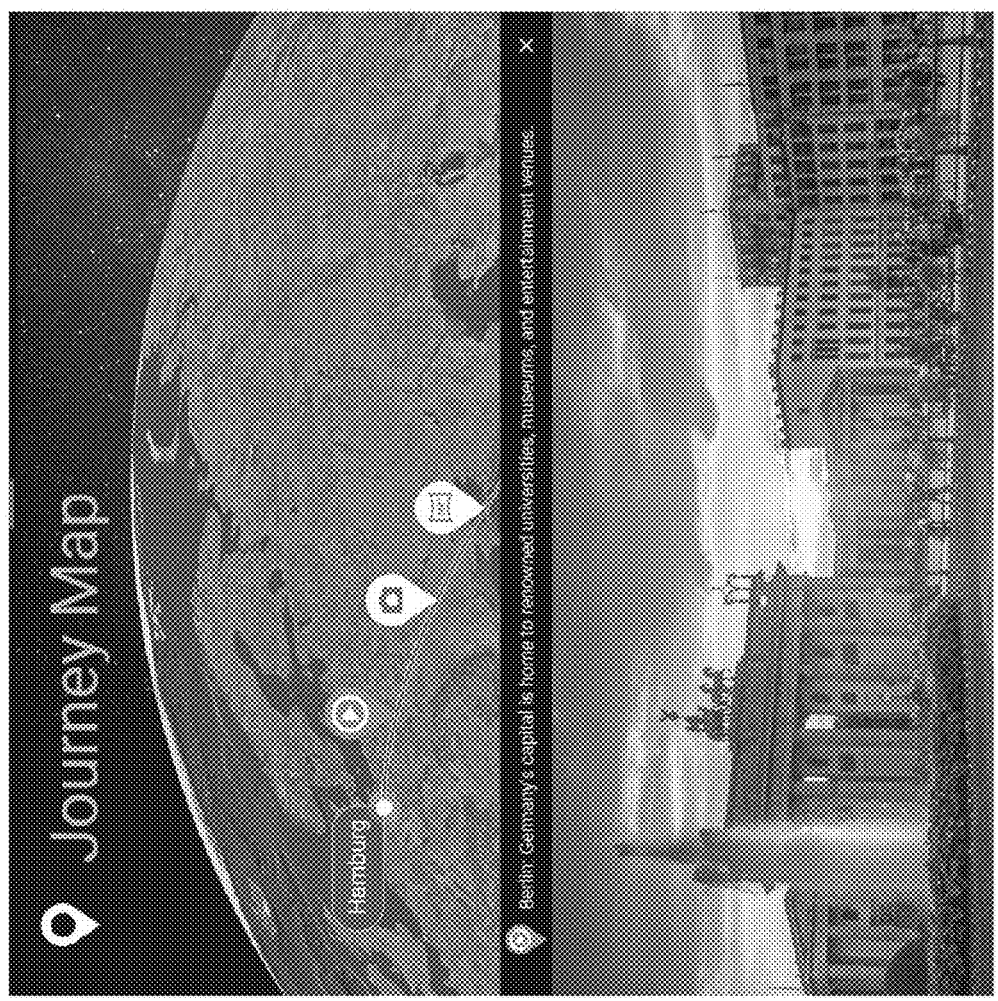
Figure 100:
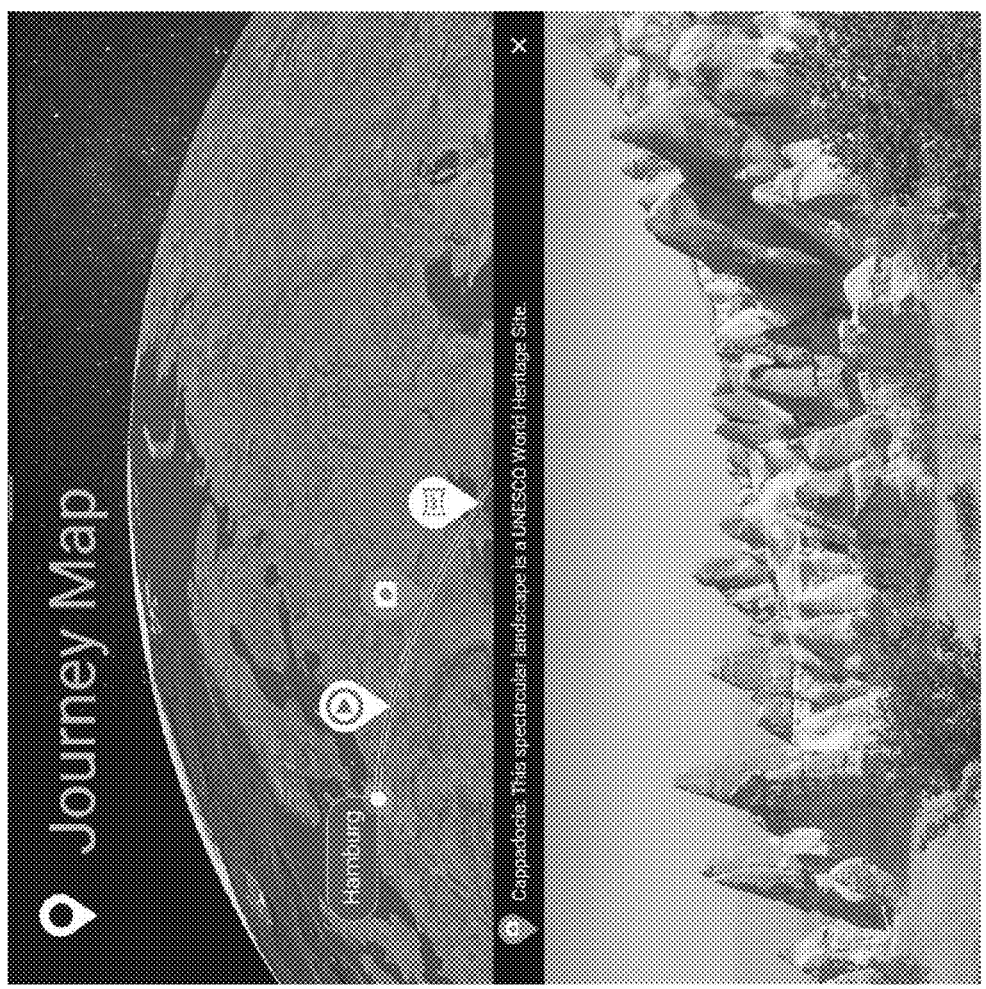
Figure 101:
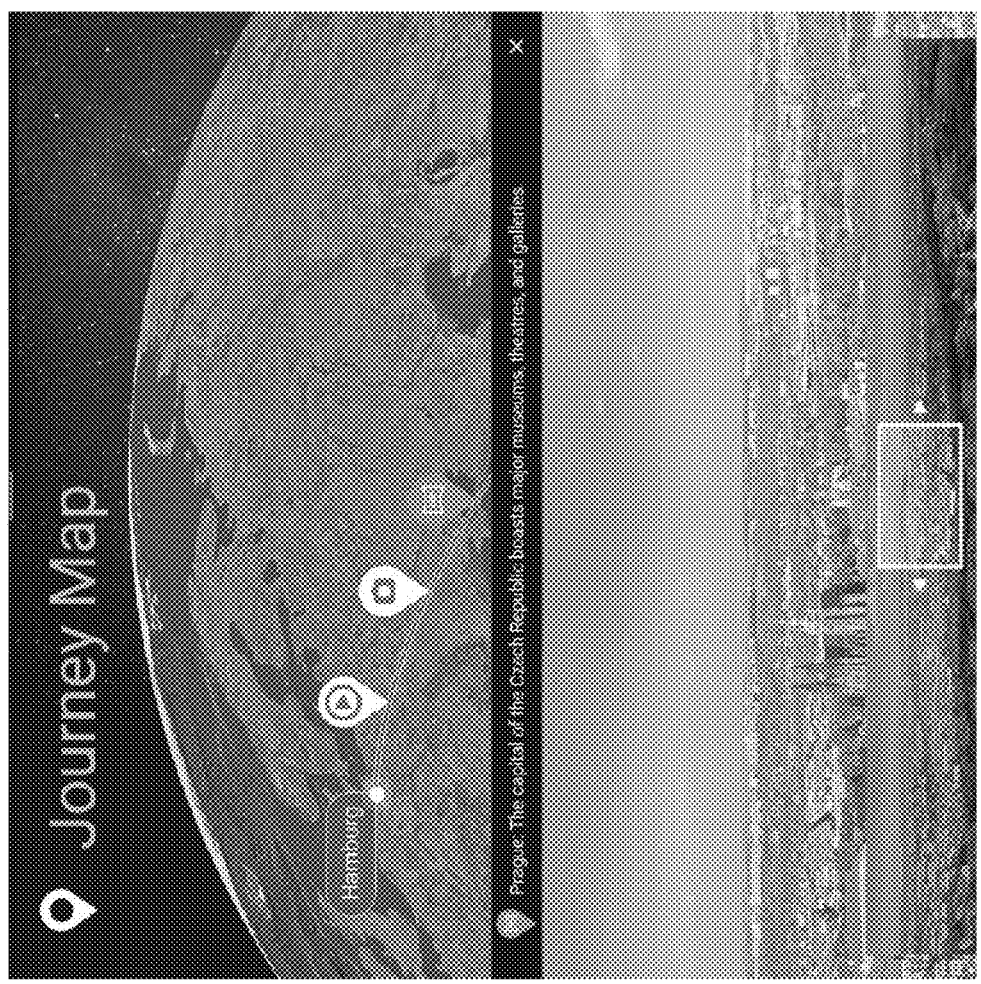

When one of the flags is selected, a window for displaying the media associated with that point of interest may scroll upward from the bottom of the screen. FIG. 99 illustrates a video of Berlin as the selected point of interest. FIG. 100 illustrates a photograph or series of photographs of Cappadocia as the selected point of interest. FIG. 101 illustrates a panorama of Prague as the selected point of interest. The user may scroll or slide the bordered rectangle to change the view point for the panorama.

Figure 102:
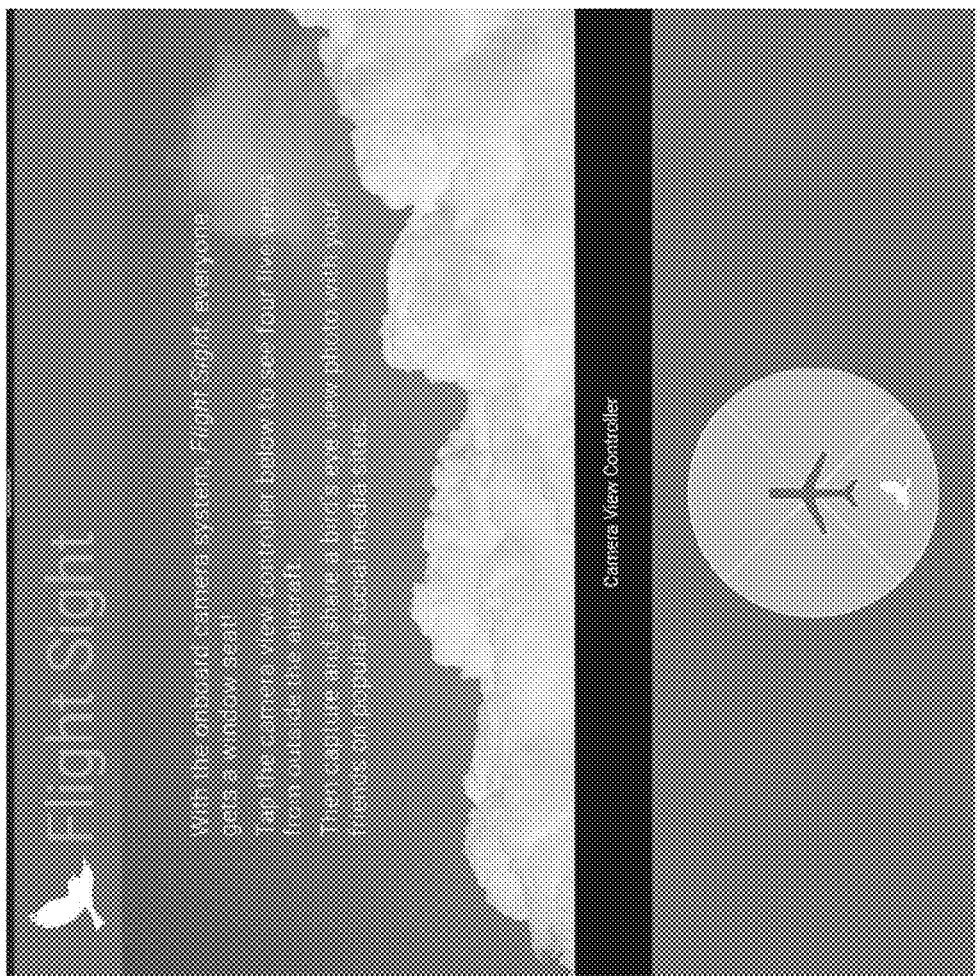
Figure 103:
Figure 104:
Figure 105:
Figure 106:
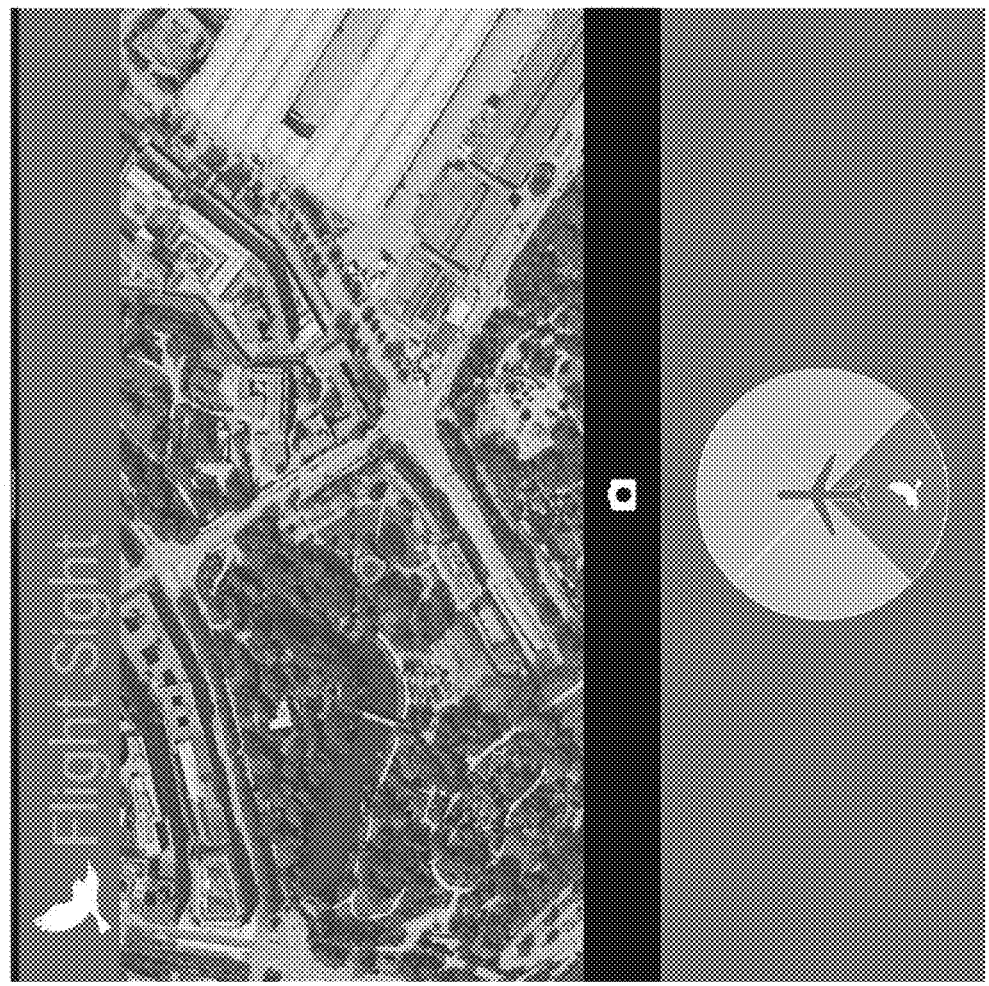
Figure 107:
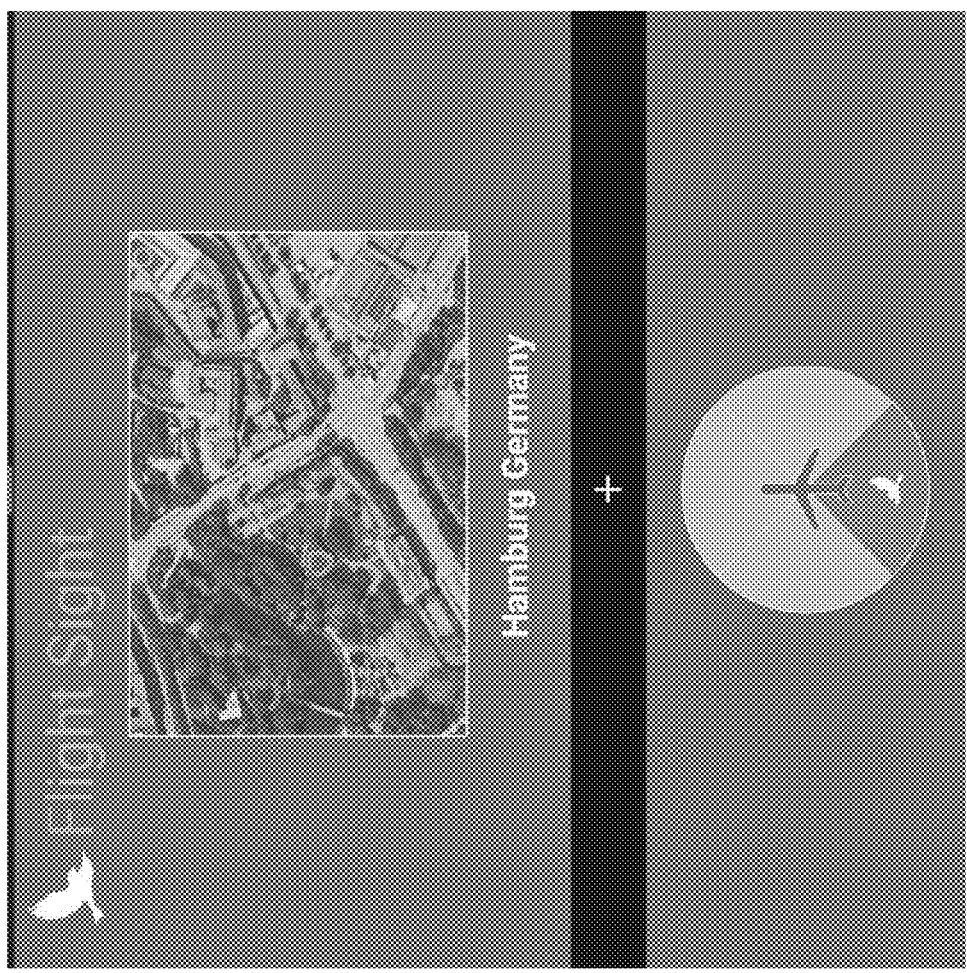
Figure 108:
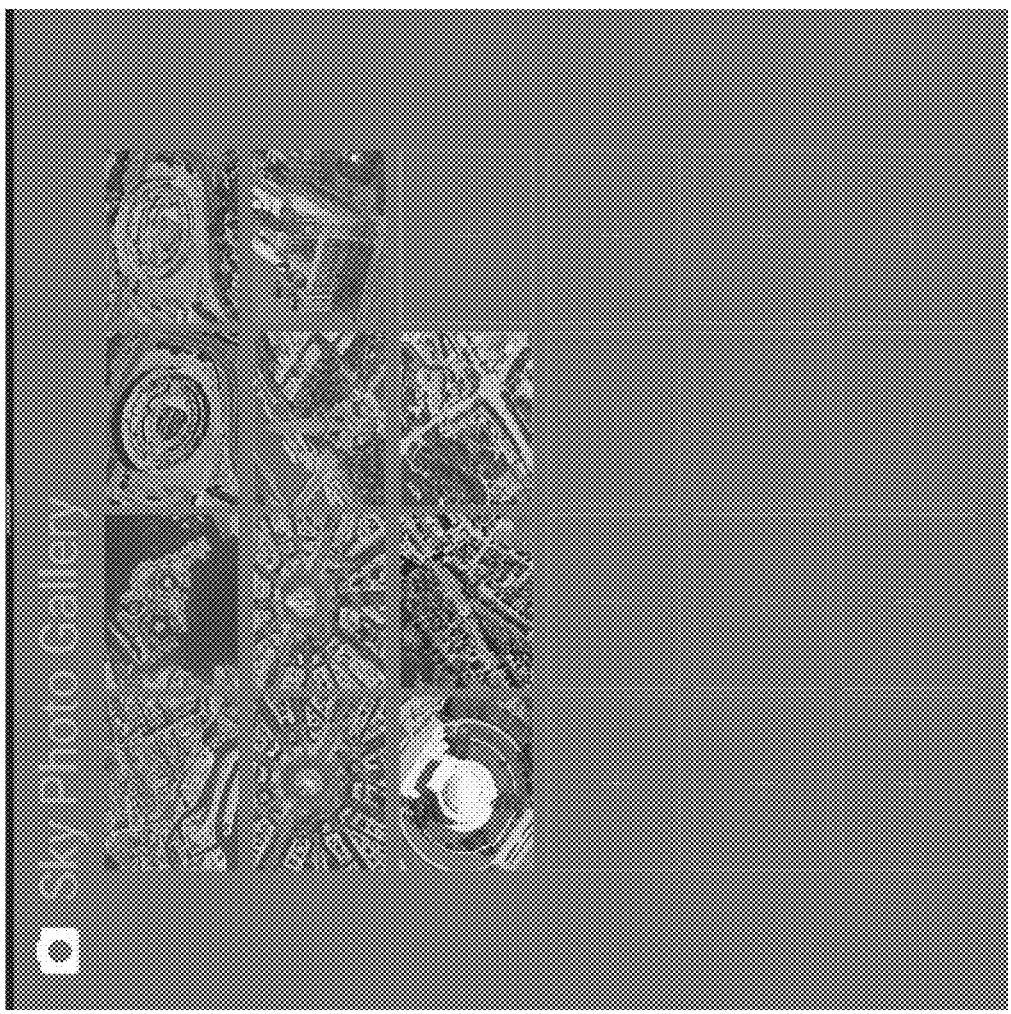
Figure 109:
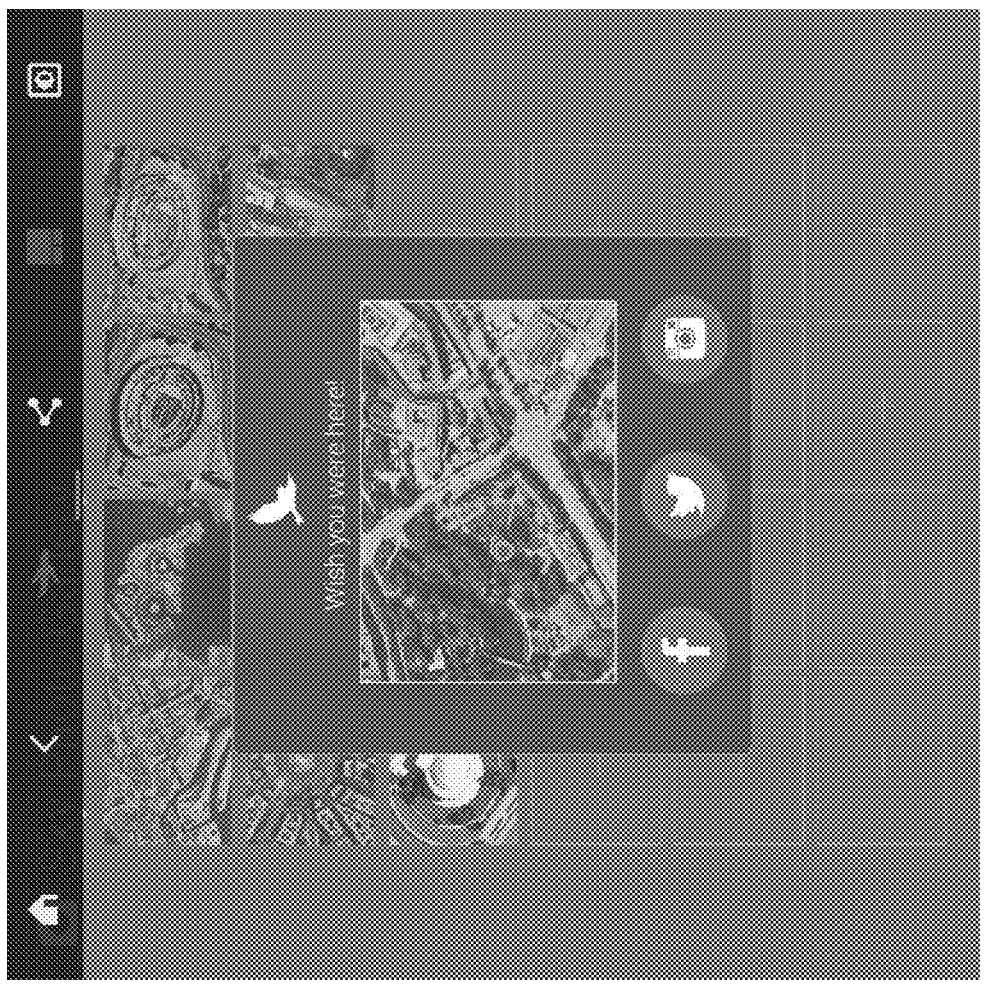

As described above, a user may select the circled aircraft icon in FIG. 98 to enter a "flight sight" application. The user may initially be presented with an instruction screen regarding the camera view controller on the bottom portion of the screen for selecting the left, forward, right or bird's eye view (FIG. 102). The user may select the left view portion of the controller to view video from the left view camera (FIG. 103). Similarly, the user may select the forward view portion of the controller to view video from the forward view camera (FIG. 104), the user may select the right view portion of the controller to view video from the right view camera (FIG. 105), and the user may select the bird's eye view portion of the controller to view video from the bird's eye view camera (FIG. 106). The user may select the camera icon to take a photograph as shown in FIG. 107. Referring to FIG. 107, the user may select the "+" icon to add and save the photo to a photo gallery and/or to enter the photo gallery (FIG. 108). Referring to FIG. 109, the user can then select the share icon from the menu bar to share the photograph on various social media services and/or through messaging applications.

Figure 110:
Figure 111:

From the main menu (FIG. 78), the movie icon may be selected to arrive at the screen illustrated in FIG. 110. Available movies are displayed as large tiles. A user can scroll up and down through the movie collection by, for example, sliding up and down on the screen, thereby revealing additional movie selections as shown in FIG. 111. The user may select one of the tiles so that a trailer of the selected movie plays on the display.

Further Definitions and Embodiments

In the above-description of various embodiments of the present invention, it is to be understood that the terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When an element is referred to as being "connected", "coupled", "responsive", or variants thereof to another node, it can be directly connected, coupled, or responsive to the other element or intervening element may be present. In contrast, when an element is referred to as being "directly connected", "directly coupled", "directly responsive", or variants thereof to another element, there are no intervening element present. Like numbers refer to like element throughout. Furthermore, "coupled", "connected", "responsive", or variants thereof as used herein may include wirelessly coupled, connected, or responsive. As used herein, the singular forms "a", "an" and "the" are intended to include the plural forms as well, unless the context clearly indicates otherwise. Well-known functions or constructions may not be described in detail for brevity and/or clarity. The term "and/or" includes any and all combinations of one or more of the associated listed items.

As used herein, the terms "comprise", "comprising", "comprises", "include", "including", "includes", "have", "has", "having", or variants thereof are open-ended, and include one or more stated features, integers, elements, steps, components or functions but does not preclude the presence or addition of one or more other features, integers, elements, steps, components, functions or groups thereof. Furthermore, as used herein, the common abbreviation "e.g.", which derives from the Latin phrase "exempli gratia," may be used to introduce or specify a general example or examples of a previously mentioned item, and is not intended to be limiting of such item. The common abbreviation "i.e.", which derives from the Latin phrase "id est," may be used to specify a particular item from a more general recitation.

Example embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

These computer program instructions may also be stored in a tangible computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-eRay).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks. Accordingly, embodiments of the present invention may be embodied in hardware and/or in software (including firmware, resident software, microcode, etc.) that runs on a processor such as a digital signal processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated. Moreover, although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of various example combinations and subcombinations of embodiments and of the manner and process of making and using them, and shall support claims to any such combination or subcombination.

Many variations and modifications can be made to the embodiments without substantially departing from the principles of the present invention. All such variations and modifications are intended to be included herein within the scope of the present invention.

What is claimed is:

1. A video display unit cassette assembly comprising:
a cassette frame comprising a plurality of receptacles, each receptacle configured to receive a corresponding fastener of a mounting structure to secure the cassette assembly in an installed position;
a display coupled to the cassette frame;
one or more electronic components between the cassette frame and the display, the one or more electronic components receiving data content from a network and generating video signals provided to the display; and
a delethalization cover coupled to the display;
wherein the cassette assembly is sized and configured to be releasably mounted in the installed position in the mounting structure defined in a seatback of a vehicle seat,
wherein the plurality of receptacles comprises:
a plurality of ledges extending from a first sidewall of the cassette frame with an aperture defined in each of the edges and configured to receive one of the fasteners; and
a plurality of ledges extending from a second, opposite sidewall of the cassette frame with an aperture defined in each of the ledges and configured to receive one of the fasteners.

2. The cassette assembly of claim 1 wherein a cassette assembly alignment and/or guidance feature is defined on a rear surface of a back wall of the cassette frame, the cassette assembly alignment and/or guidance feature configured to receive at least one guide post of the mounting structure to align and/or guide the cassette assembly into the installed position.

3. The cassette assembly of claim 2 wherein the cassette assembly alignment and/or guidance feature comprises two columns of a plurality of pins defining a space therebetween that is sized and configured to receive the guide post.

4. The cassette assembly of claim 1 wherein the cassette frame comprises a back wall, and wherein the one or more electronic components are mounted to the back wall.

5. The cassette assembly of claim 1 wherein, in the installed position, the display extends substantially the entire width of the seatback to provide edge to edge video.

6. The cassette assembly of claim 1 wherein the display has a diagonal length of at least 20 inches.

7. A video display unit cassette assembly comprising:
a cassette frame;
a display coupled to the cassette frame;
one or more electronic components between the cassette frame and the display, the one or more electronic components receiving data content from a network and generating video signals provided to the display; and
a delethalization cover coupled to the display;
wherein the cassette assembly is sized and configured to be releasably mounted in an installed position in a mounting structure defined in a seatback of a vehicle seat,
wherein the cassette frame comprises an upper display bracket at an upper portion of the cassette frame and a lower display bracket at a lower portion of the cassette frame, and wherein:
an upper portion of the display is held between the delethalization cover and the upper display bracket; and
a lower portion of the display is held between the delethalization cover and the lower display bracket.

8. The cassette assembly of claim 7 wherein the cassette frame comprises a gasket member coupled to the upper and lower display brackets, the gasket member holding the delethalization cover adjacent and/or against the display and extending along the entire outer periphery of the display.

9. The cassette assembly of claim 8 wherein an upper portion of the delehalization cover extends above the upper portion of the display and a lower portion of the delethalization cover extends below the lower portion of the display, and wherein, in the installed position:
the upper portion of the delethalization cover is adjacent and/or abuts an upper recessed surface of the mounting structure; and
the lower portion of the delethalization cover is adjacent and/or abuts a lower recessed surface of the mounting structure.

10. The cassette assembly of claim 9 wherein:
the mounting structure comprises first and second opposite inner side surfaces, an upper inner surface that extends orthogonally away from the upper recessed surface, and a lower inner surface that extends orthogonally away from the lower recessed surface; and
in the installed position, the cassette frame and/or the display are held between the first and second opposite inner side surfaces, the upper inner surface and the lower inner surface of the mounting structure.

11. A video display unit cassette assembly comprising:
a cassette frame;
a display coupled to the cassette frame;
one or more electronic components between the cassette frame and the display, the one or more electronic components receiving data content from a network and generating video signals provided to the display; and
a delethalization cover coupled to the display;

wherein the cassette assembly is sized and configured to be releasably mounted in an installed position in a mounting structure defined in a seatback of a vehicle seat, wherein the delethalization cover has an elongated opening defined therein, the cassette assembly further comprising a connectivity port assembly including a front surface with a plurality of connectivity ports defined therein, and wherein the connectivity port assembly is configured to be releasably coupled to the cassette frame so that the front surface of the connectivity port is flush with a front surface of the delethalization cover.

12. A system comprising:
a mounting structure in the seatback of an aircraft seat, the mounting structure comprising a seat frame member and a cassette bezel coupled to the seat frame member; and
a cassette assembly comprising:
a cassette frame;
a display coupled to the cassette frame;
one or more electronic components between the cassette frame and the display; and
a delethalization cover coupled to the display;
wherein the cassette assembly is sized and configured to be releasably mounted in an installed position in the mounting structure,
wherein:
the seat frame member comprises a lower cross member comprising first and second lower fasteners extending into a lower portion of the cassette bezel;
the seat frame member comprises an upper cross member comprising first and second upper fasteners extending into an upper portion of the cassette bezel;
the cassette frame comprises a first lower bracket having a first lower aperture defined therein extending from a first sidewall of the cassette frame and a second lower bracket having a second lower aperture defined therein extending from a second, opposite sidewall of the cassette frame:
the cassette frame comprises a first upper bracket having a first upper aperture defined therein extending from the first sidewall of the cassette frame and a second upper bracket having a second upper aperture defined therein extending from the second sidewall of the cassette frame; and
in the installed position, the first lower fastener is received and the first lower aperture, the second lower fastener is received in the second lower aperture, the first upper fastener is received in the first upper aperture and the second upper fastener is received in the second upper aperture.

13. The system of claim 12 wherein at least one of the upper and lower cross members comprises a locator post extending therefrom, and wherein two parallel columns of pins defining a space therebetween extend from a rear surface of the cassette frame, the space between the columns of pins sized and configured to receive the locator post to align and/or guide the cassette assembly into the installed position.

14. A system comprising:
a mounting structure in the seatback of an aircraft seat, the mounting structure comprising a seat frame member and a cassette bezel coupled to the seat frame member; and
a cassette assembly comprising:
a cassette frame;
a display coupled to the cassette frame;
one or more electronic components between the cassette frame and the display; and
a delethalization cover coupled to the display;
wherein the cassette assembly is sized and configured to be releasably mounted in an installed position in the mounting structure, and
wherein:
the cassette frame comprises a gasket member that holds the delethalization cover adjacent and/or against the display;
the delethalization cover comprises an upper portion that extends above a top of the display;
the delethalization cover comprises a lower portion the extends below a bottom of the display;
the cassette bezel comprises an upper recessed surface, a lower recessed surface, and first and second opposed inner side surfaces each extending between the upper recessed surface and the lower recessed surface; and
in the installed position, the upper portion of the delethalization cover is adjacent and/or abuts the upper recessed surface of the cassette bezel, the lower portion of the delethalization cover is adjacent and/or abuts the lower recessed surface of the cassette bezel, a first side surface of the delethalization cover and/or a first side surface of the display is adjacent and/or abuts the first inner side surface of the cassette bezel, and a second, opposite side surface of the delethalization cover and/or a second, opposite side surface of the display is adjacent and/or abuts the second inner side surface of the cassette bezel.

* * * * *